United States Patent
Miyata et al.

(10) Patent No.: US 6,204,564 B1
(45) Date of Patent: Mar. 20, 2001

(54) SEMICONDUCTOR DEVICE AND METHOD FOR MAKING THE SAME

(75) Inventors: Osamu Miyata; Kazutaka Shibata; Shigeyuki Ueda, all of Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/196,884

(22) Filed: Nov. 20, 1998

(30) Foreign Application Priority Data

| Nov. 21, 1997 | (JP) | 9-321303 |
| Feb. 10, 1998 | (JP) | 10-028156 |
| Aug. 17, 1998 | (JP) | 10-230620 |
| Aug. 19, 1998 | (JP) | 10-232635 |

(51) Int. Cl.$^7$ .......................... H01L 23/48; H01L 23/52; H01L 29/40
(52) U.S. Cl. .......................... 257/778; 257/780; 257/737; 257/738; 257/785; 257/786; 257/779; 257/789; 257/795
(58) Field of Search .................. 257/785, 737, 257/738, 786, 778, 783, 730, 780, 779, 789, 795

(56) References Cited

U.S. PATENT DOCUMENTS

| 5,352,926 | 10/1994 | Andrews . | |
| 5,523,622 | 6/1996 | Harada et al. . | |
| 5,604,379 | * 2/1997 | Mori | 257/738 |
| 5,677,576 | * 10/1997 | Akagawa | 257/785 |
| 5,703,405 | 12/1997 | Zeber . | |
| 5,786,271 | 7/1998 | Ohida et al. . | |
| 5,834,844 | * 11/1998 | Akagawa et al. | 257/734 |
| 5,844,304 | 12/1998 | Kata et al. . | |
| 5,866,953 | * 2/1999 | Akram et al. | 257/790 |
| 5,886,409 | 3/1999 | Ishino et al. . | |
| 5,886,415 | 3/1999 | Akagawa . | |
| 5,946,554 | * 8/1999 | Echigo et al. | 438/119 |

* cited by examiner

Primary Examiner—Sara Crane
Assistant Examiner—Luan Thai
(74) Attorney, Agent, or Firm—Merchant & Gould P.C.

(57) ABSTRACT

A semiconductor device comprising a film substrate and a semiconductor chip bonded to an upper surface of the film substrate is provided. The semiconductor chip has a main surface formed with a plurality of terminal pads. The film substrate has a lower surface formed with a plurality of external terminal portions in a matrix pattern, and an upper surface formed with a plurality of wiring patterns for respectively connecting with the external terminal portions. The wiring patterns formed in the upper surface of the film substrate are respectively connected to the terminal pads formed on the main surface of the semiconductor chip.

16 Claims, 43 Drawing Sheets

SEMICONDUCTOR DEVICE AND METHOD FOR MAKING THE SAME

BACKGROUND OF THE INVENTION

1. Field of the Invention

The present invention relates to a semiconductor device and a method for making the same. More specifically, the present invention relates to a semiconductor device formed into a small package having a lower surface formed with a plurality of external terminal portions arranged in a matrix pattern, and a method of making such a semiconductor device.

2. Background Art

A semiconductor device commonly called BGA (Ball Grid Array) package type or area array package type comprises an insulated substrate having a lower surface formed with a plurality of external terminal portions arranged in a matrix pattern. On an upper surface of this substrate, a semiconductor chip is mounted. Conventionally, the insulated substrate is a rigid substrate typically made of a glass epoxy resin. This rigid substrate has a lower surface formed with a plurality of external terminal portions typically made of solder arranged in a matrix pattern. On the other hand, an upper surface of the substrate is formed with wiring patterns for establishing electrical connection respectively with the plurality of external terminal portions. The external terminal portions are formed by first making the plurality of holes arranged in the matrix pattern on the insulated substrate, then forming the wiring pattern so that each of the holes is reached by a portion of the wiring pattern, forming the plurality of solder balls correspondingly at respective holes, and then heating the solder balls so that part of each solder ball melts to connect with the corresponding portion of the wiring pattern. Through such operations, there is formed the matrix of bump external terminal portions projecting out of the lower surface of the insulated substrate by a predetermined amount and electrically connected with the wiring patterns formed on the upper surface of the insulated substrate. With such an arrangement, the plurality of external terminal portions can be compactly disposed in the matrix pattern on the lower surface of the package. Thus, the package can be compact, and therefore the semiconductor device of this type is suitable to a high-density mounting on a mother substrate.

However, the conventional semiconductor device described above has following problems since the semiconductor chip is mounted to the insulated substrate which is rigid and is made of glass epoxy resin.

First, the thickness of the rigid substrate takes up a considerable part of the total thickness of the semiconductor device. This limits further miniaturization of the semiconductor device in terms of the thickness as well as limiting further reduction in weight.

Second, the rigid substrate made of glass epoxy resin has a coefficient of thermal expansion which is very different from that of the semiconductor chip. Thus, when the semiconductor device is being mounted to the mother substrate, heat applied during the operation may cause excessively large differences in expansion, destroying mechanical or electrical connection between the semiconductor chip and the insulated substrate.

Third, since the rigid substrate has a considerable thickness, it is difficult to further increase disposition density of the external terminal portions formed in the lower surface of the rigid substrate. Specifically, each of the external terminal portions is formed as described earlier by making a hole in the insulated substrate, filling the hole with a ball of solder, and then melting the solder to bond with the wiring pattern formed in the upper surface of the substrate. Hence, in order to make the external terminal portion projecting out of the lower surface of the insulated substrate by a desired amount, the hole in the insulated substrate must be made large enough, and the solder ball to fill the hole must be accordingly large. This limits the disposition density of the external terminal portions, limiting the number of usable terminals in the semiconductor chip for making the semiconductor device, making it impossible to appropriately meet the demand for high-density mounting, as well as making manufacture more costly due to a large consumption of solder.

DESCLOSURE OF THE INVENTION

It is therefore an object of the present invention to provide a semiconductor device wherein a package of the semiconductor device has a lower surface formed with a plurality of external terminal portions arranged in a matrix pattern, and wherein the thickness and weight of the package can be further reduced.

Another object of the present invention is to provide a semiconductor device wherein a package of the semiconductor device has a lower surface formed with a plurality of external terminal portions arranged in a matrix pattern, and wherein a semiconductor chip having a greater number of terminals can be used.

Still another object of the present invention is to provide a method for making a semiconductor device wherein a package of the semiconductor device has a lower surface formed with a plurality of external terminal portions arranged in a matrix pattern, and wherein the thickness and weight of the package can be further reduced, or wherein a semiconductor chip having a greater number of terminals can be used.

According to a first aspect of the present invention, a semiconductor device having the following arrangement is provided.

Specifically, the semiconductor device comprises a film substrate and a semiconductor chip bonded to an upper surface of the film substrate, the semiconductor chip has a main surface formed with a plurality of terminal pads, the film substrate has a lower surface formed with a plurality of external terminal portions in a matrix pattern, and an upper surface formed with a plurality of wiring patterns for respectively connecting with the external terminal portions, and the wiring patterns formed in the upper surface of the film substrate is respectively connected to the terminal pads formed on the main surface of the semiconductor chip.

The film substrate may be made of a polyimide film having a thickness of a few tens of micron meters. The wiring pattern may be made of a thin foil of copper for example. As a film, this substrate is flexible. Therefore, this semiconductor device including the insulated substrate made of the film is considerably thinner as well as lighter than the prior art. Further, it becomes possible to increase the disposition density of external terminal portions. Still further, since the substrate is made of film, it becomes possible to prevent disconnection between the substrate and the semiconductor chip caused by thermal expansion when the semiconductor device is being mounted.

According to a preferred embodiment, each of the above external terminal portions, includes a solder ball placed in a hole formed in the film substrate. Part of the solder ball projects out of the hole beyond the lower surface of the film substrate. Part of the wiring pattern reaches inside the hole, and the solder ball is bonded by melting to this part of the wiring pattern.

Since the substrate is film, size of the solder ball may be smaller for establishing electrical connection with the wiring pattern formed on the upper surface of the substrate as well as for making the external terminal portion project out of the lower surface of the substrate by a predetermined amount. The hole for accepting the solder ball may also be smaller. As a result, it becomes possible to dispose the external terminal portions more densely, which means that a semiconductor chip having a greater number of terminals can be used.

According to the preferred embodiment, each of the terminal pads of the semiconductor chip is a bump pad. The semiconductor chip is bonded to the upper surface of the film substrate with the main surface facing downward, and the bump terminal pads are respectively faced to and electrically connected with the wiring patterns of the film substrate.

In the above arrangement, the semiconductor chip is mounted to the film substrate in a "face down" manner, in which each of the terminal pads in the semiconductor chip main surface is directly connected to corresponding one of the wiring patterns on the film substrate. Since the main surface of the semiconductor chip is covered by the film substrate, there is no need for forming a resin package for sealing the entire semiconductor chip. Thus, a plan-view size of a semiconductor device of this type can be approximately the same as that of the semiconductor chip itself.

Further, according to the above embodiment, the semiconductor chip and the film substrate are mechanically connected with each other via a layer of resin adhesive while the terminal pads of the semiconductor chip are electrically connected to the wiring patterns of the film substrate.

The resin adhesive may be an anisotropic conductive sheet or an anisotropic conductive adhesive made of an epoxy resin dispersed with electrically conductive particles. Thus, in the above mode of embodiment, mechanical and electrical connection between the terminal pads of the semiconductor chip and the wiring patterns of the film substrate can be established in the very simple steps of facing the film substrate and the main surface of the semiconductor chip to each other with the anisotropic conductive sheet or the anisotropic conductive adhesive in between, and then pressing the two members against each other under heat.

Further, according to the above embodiment, the anisotropic adhesive containing a porous resin is used.

Since the anisotropic adhesive contains the porous resin, the resin adhesive itself is porous, and therefore has a good permeability of gas. Thus, even if the anisotropic adhesive contains moisture or air bubbles before heating, the moisture or air bubbles will expand when heated, and then escape without being trapped inside the resin adhesive. This is advantageous in that when the semiconductor chip and the film substrate mutually connected by this resin adhesive is heated, the expansion of the moisture or air bubbles will not cause any stress to the semiconductor chip, or any force which would disconnect the semiconductor chip from the film substrate.

According to another preferred embodiment, a circumferential portion of the resin adhesive and side surfaces of the semiconductor chip are surrounded by a protective resin.

According to this embodiment, the enclosure by the protective resin around the connected portion (the resin adhesive) between the semiconductor chip and the film substrate prevents foreign matter from entering the connected portion (the resin adhesive). Further, since the side faces of the semiconductor chip are surrounded by the protective resin, the semiconductor chip has an enhanced protection around its circumference, having an increased resistance against external force applied to the semiconductor chip. Needless to say, the protective resin may contain porous resin, and in such a case the resin enclosure around the resin adhesive will not deteriorate gas permeability of the resin adhesive.

According to another preferred embodiment, the protective resin rides on an upward facing surface of the semiconductor chip.

With such an arrangement, each corner of the upward facing surface of the semiconductor chip is covered and protected by the protective resin. Thus, even if the semiconductor chip mounted to the film substrate and left as a bear chip, the semiconductor chip is well protected from accidental damage caused by external force, such as mishandling which would otherwise result in a chipped corner of the semiconductor chip.

According to the preferred embodiment, the above porous resin is a thermosetting phenol resin. It should be noted that the thermosetting phenol resin referred to in this document will include phenol resins as well as epoxy resins made from phenol.

According to the preferred embodiment, the external terminal portion electrically connected with an end portion of the wiring pattern, and the terminal pad electrically connected with another end portion of the wiring pattern are displaced form each other in a plan view.

According to the preferred embodiment, each of the terminal pads of the semiconductor chip is disposed in an circumferential edge portion of the main surface of the semiconductor chip, whereas each of the external terminal portions disposed in the matrix pattern and electrically connected with the terminal pad via the wiring pattern is located inwardly of each of the terminal pads in a plan view.

According to another preferred embodiment, all or part of the upper surface of the film substrate except regions where electrical connection between the wiring patterns and terminal pads of the semiconductor chip is established is covered by an alpha ray shielding insulation coating. More preferably, the alpha ray shielding insulation coating is formed at least in a region right above each of the external terminal portions. Further, the alpha ray shielding insulation coating is formed by a polyimide resin.

According to this embodiment, even if the external terminal portions are formed by solder which contains lead (Pb), there is no risk for the semiconductor chip to be exposed to alpha ray emission from the external terminal portions.

Further, according to the preferred embodiment, the semiconductor chip is a memory chip including a memory cell domain.

According to still another embodiment, an upward facing surface of the semiconductor chip is essentially exposed, and all or part of a circumferential region of this upward facing surface is chamfered.

Specifically, according to this embodiment, portions of the semiconductor chip susceptible to damage by external force are already removed. Thus, even if an external force is acted to the semiconductor chip, the semiconductor chip is less likely to be damaged. Accordingly therefore, when manufacturing a semiconductor device according to this embodiment, there is no need for forming a resin package which would seal the entire semiconductor chip. As a result, the manufacture becomes more advantageous in terms of manufacturing operation efficiency as well as in cost.

Further, according to still another preferred embodiment, the upward facing surface of the semiconductor chip is essentially exposed. This upward facing surface is formed with fine serration and marked by printing. The fine serration is formed to have an average coarseness of about 2 to 5 micron meters.

Further, according to still another preferred embodiment, the upward facing surface of the semiconductor chip is covered by a resin coating, and a surface of this resin coating is marked by printing.

Further, according to still another preferred embodiment, semiconductor chip is bonded to the upper surface of the film substrate with the main surface facing upward. Each of the wiring patterns of the film substrate has a bonding pad extended to a circumferential edge portion of the film substrate, and each of the terminal pads of the semiconductor chip is electrically connected with the wiring pattern by a wire which connects the terminal pad and the bonding pad.

Further, in this embodiment, the upper surface of the film substrate, the semiconductor chip, and the wires are sealed in a resin package.

According to this embodiment, although the semiconductor chip is sealed by the resin package, the semiconductor chip is bonded to the upper surface of the film substrate, and the lower surface of the film substrate is exposed. Therefore, the entire package is thinner than a prior art semiconductor device completely sealed in a resin package. Further, the exposed lower surface of the film substrate is formed with a matrix of external terminal portions. Therefore, a semiconductor chip having a large number of terminals can be used. Still further, the plan-view size of the semiconductor device can be considerably smaller than the prior-art resin-packed semiconductor device.

Further, the semiconductor device according to this particular embodiment includes a frame-like reinforcing member surrounding the semiconductor chip.

This further enhances protection to the semiconductor chip and the wire which connects the semiconductor chip to the film substrate.

According to a second aspect of the present invention, there is provided a following method for efficiently making the semiconductor device according to the first aspect of the present invention comprising the film substrate and the semiconductor chip mounted thereon.

Specifically, the method is for making a semiconductor chip by using a master substrate made of film formed with a plurality of wiring regions longitudinally of the substrate. The wiring region includes a plurality of holes formed in a matrix pattern, and a plurality of wiring patterns formed in an upper surface. Part of each wiring pattern reaches inside of the hole, and is accessible from the lower surface side of the hole. Such a semiconductor device can be manufactured by the following method comprising steps of:

bonding to the master film-substrate a rigid plate member formed with a plurality of windows for allowing access to each of the wiring regions;

bonding a semiconductor chip to the upper surface of each of the wiring regions in the master film-substrate, while electrically connecting each of terminal pads of the semiconductor chip with a corresponding wiring pattern of the master film-substrate;

forming external terminal portions disposed in a matrix pattern and projecting out of the lower surface of the wiring region of the master film-substrate, by lowering a solder ball in each of the holes from the lower surface side of the master film-substrate, and then melting part of the solder ball to bond to the part of the wiring pattern; and separating a region corresponding to the wiring region from the master film-substrate for obtaining an individual semiconductor device.

According to the above method, the attachment of the rigid plate member provides the entire master substrate including this rigid plate member with a desired rigidity. Further, each of the wiring regions to be worked is exposed. Thus, the master substrate as a whole can be transferred by an automatic transfer system without bending the master substrate for achieving each necessary manufacturing step as desired. Hence, the master substrate attached with the rigid plate member makes possible to efficiently manufacture the semiconductor device according to the first aspect of the present invention by using an existing production line originally designed for manufacture of a lead-frame type semiconductor device.

It should be noted however, that the present method can be applied to the manufacture of any of the embodiments described above according to the first aspect of the present invention. Specifically, one type includes the semiconductor chip bonded to the film substrate with the main surface facing downward. Another type includes the semiconductor chip bonded to the film substrate with the main surface facing upward, with the terminal pads of the main surface connected, having the wiring pattern of the film substrate via wire, and the upper surface of the film substrate and the semiconductor chip sealed by a resin package.

According to a preferred embodiment, the above method is for making a semiconductor chip by using a master substrate made of film formed with a plurality of wiring regions longitudinally of the substrate. The wiring region includes a plurality of holes formed in a matrix pattern, and a plurality of wiring patterns formed in an upper surface. Part of each wiring pattern reaches inside of the hole, and is accessible from the lower surface side of the hole. This method comprises following steps of:

bonding to the master film-substrate a rigid plate member formed with a plurality of windows for allowing access to each of the wiring regions;

attaching a frame-like reinforcing member to the upper surface of the wiring region of the master film-substrate;

bonding a semiconductor chip to the upper surface of each of the wiring regions in the master film-substrate, while electrically connecting each of terminal pads of the semiconductor chip with a corresponding wiring pattern of the master film-substrate;

sealing by a resin package the upper surface of the wiring region of the master film-substrate, the semiconductor chip bonded thereto, and the reinforcing member;

forming external terminal portions disposed in a matrix pattern and projecting out of the lower surface of the wiring region of the master film-substrate, by lowering a solder ball in each of the holes from the lower surface side of the master film-substrate, and then melting part of the solder ball to bond to the part of the wiring pattern; and separating a region corresponding to the wiring region from the master film-substrate for obtaining an individual semiconductor device.

The frame-like reinforcing member should preferably be made of essentially the same resin as the resin for making the resin package.

According to such a method, the wiring region facing the window of the rigid plate member has an increased plane rigidity. Thus, even if there is a bending stress acting on the wiring region of the master film-substrate, the bending stress will be countered by the frame-like reinforcing member. Therefore, it becomes possible to avoid such a trouble in which the master film-substrate is deformed when heated for bonding the semiconductor chip or forming the resin package, damaging the mechanical or electrical bond between the semiconductor chip and the film substrate. Further, since the frame-like reinforcing member stays within the resin package surrounding the semiconductor chip as part of the finished product of semiconductor device, the resin package provides the semiconductor chip with increased protection.

According to a third aspect of the present invention, there is provided a frame for making a semiconductor device according to the second aspect of the present invention.

Specifically, the frame for making the semiconductor device comprises a master substrate made of film, and a rigid plate member bonded to an upper surface of the master film-substrate; the master film-substrate being formed with a plurality of wiring regions longitudinally of the substrate, each of the wiring regions including a plurality of holes formed in a matrix pattern, and a plurality of wiring patterns formed in an upper surface, part of each wiring pattern reaching inside of the hole being accessible from the lower surface side of the hole, and the rigid plate member being formed with a plurality of windows for making each of the wiring regions accessible.

As already described for the second aspect of the present invention, by using the above frame, the manufacture of the semiconductor device having a basic arrangement in which the semiconductor chip is bonded to the upper surface of the film substrate can be performed efficiently without troubles.

PREFERRED EMBODIMENTS

Figure 1:
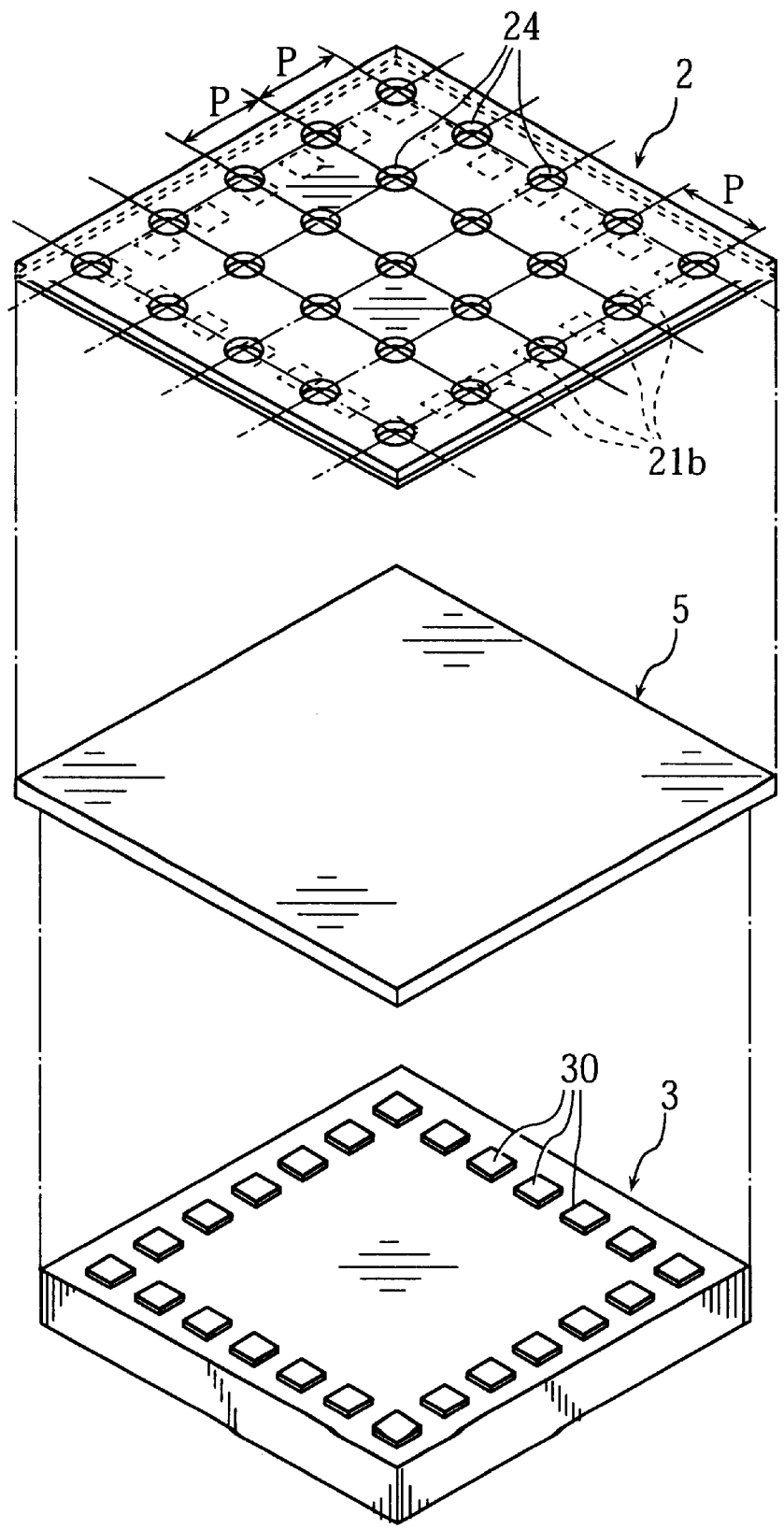
FIG. 1 is an explosive perspective view of a semiconductor device as a first embodiment of the present invention.

Preferred embodiments of the present invention will be described in specific details, referring to the accompanying drawings.

First, reference will be made to FIGS. 1 through 6, and a semiconductor device 1 as a first embodiment of the present invention will be described.

This semiconductor device 1 comprises a film substrate 2 and a semiconductor chip 3 mounted to an upper surface of the film substrate 2. The semiconductor chip 3 is mounted in a "face down" manner.

The film substrate 2 is primarily made of a polyimide resin film having a thickness of a few tens of micron meters for example. The upper surface of the film substrate 2 is formed with a plurality of wiring patterns 21 made of a foil of metal such as copper or gold. A lower surface of the film substrate 2 is formed with a plurality of external terminal portions 4 disposed in a matrix pattern. The external terminal portions 4 are spaced from each other by a pitch P both laterally and longitudinally, and electrically connected respectively with the wiring patterns 21.

More specifically, the film substrate 2 is formed with the plurality of holes 24 of a predetermined size disposed in the matrix pattern. Each of the holes 24 is reached by an end portion 21a of the wiring pattern 21 formed in the upper surface of the film substrate, so that each end portion 21a can be reached from the lower surface side of the corresponding hole 24. The semiconductor chip 3 has a main surface including circumferential edges along which a plurality of terminal pads 30 are formed. Each of the wiring patterns 21 has another end portion 21b disposed correspondingly to one of the terminal pads 30. The upper surface of the film substrate 2 is covered by a protective coating 25 made of an epoxy resin for example, except for regions around each of the other end portions 21b of the wiring patterns 21 where connection is made with the terminal pad 30 of the semiconductor chip 3.

It should be noted here that the wiring patterns 21 formed in the upper surface of the film substrate 2 can be made by performing a photo-etching to a foil layer of metal such as copper formed on the upper surface of the polyimide resin film.

Figure 2:
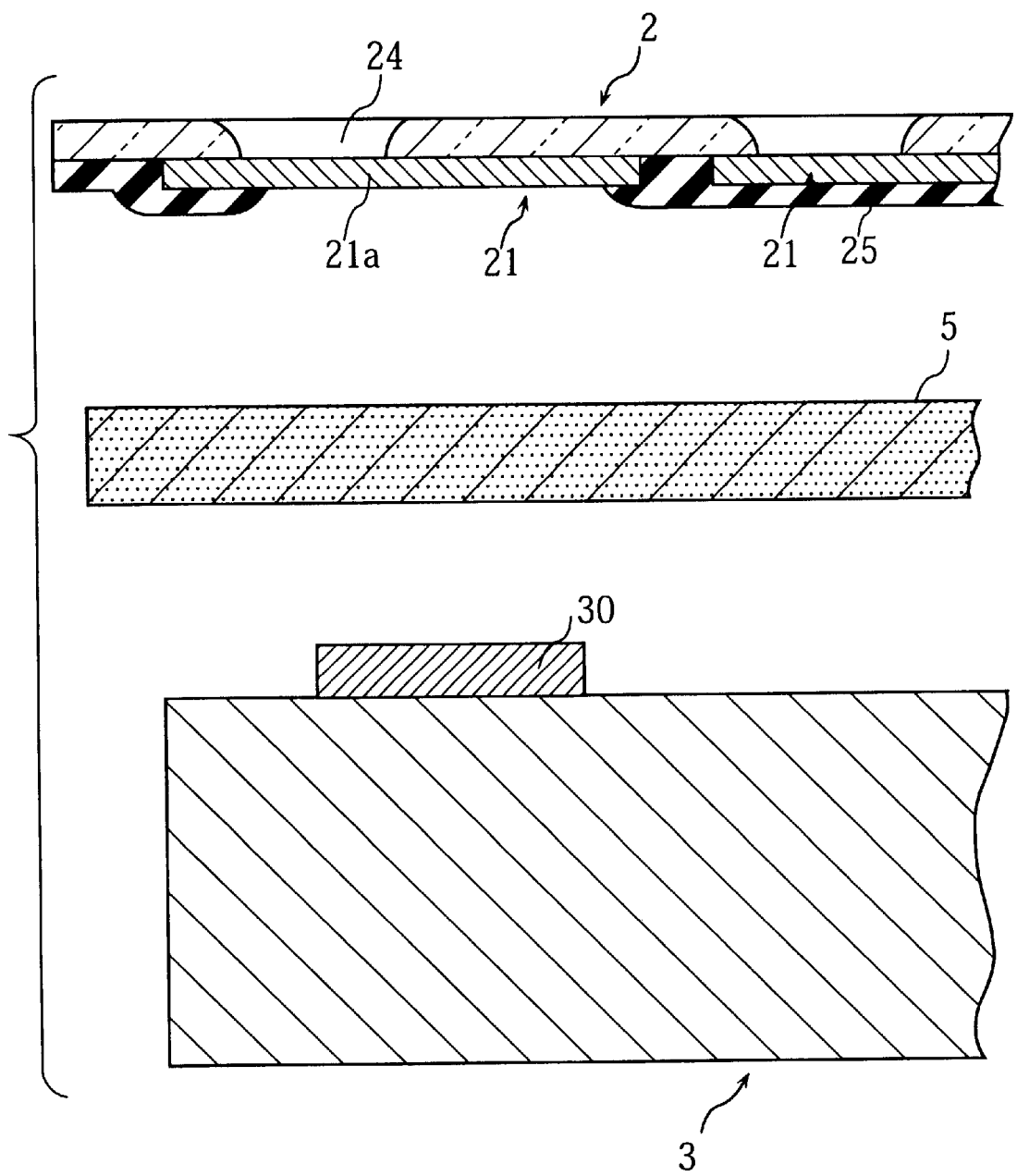
FIG. 2 is an enlarged sectional view of a primary portion in FIG. 1.

It should be noted also here that the matrix of holes 24 formed in the film substrate 2 can be made by performing a photo-etching to the polyimide film from the lower surface side. The making of holes 24 by the photo-etching method is advantageous in that each of the holes 24 can have increasingly larger inner diameter toward the lower side of the film substrate 2 as shown in FIG. 2.

The terminal pads 30 are disposed along the circumferential edges of the main surface of the semiconductor chip 3. Preferably, these terminal pad 30 are formed as bump terminals. For example, the main surface of the chip may be formed with aluminum electrodes, and each of these aluminum electrodes may be covered by a layer of gold through a plating process performed via an unillustrated barrier metal.

With such an arrangement, the main surface of the semiconductor chip 3 is faced to the upper surface of the film substrate 2 in a predetermined alignment, and then pressed to the upper surface of the film substrate 2 with a predetermined resin adhesive 5 in between. The resin adhesive 5 may be advantageously selected from an anisotropic conductive sheet, anisotropic conductive adhesive or other forms of anisotropic conductive materials made of an epoxy resin dispersed with electrically conductive particles. The pressing operation may be accompanied by heating at a predetermined temperature as necessary. Through this step, the anisotropic conductive member 5 is pressed between the bump terminal pads 30 of the semiconductor chip 3 and the exposed end portions 21b of the wiring patterns 21 on the upper surface of the film substrate 2, establishing electrical connection between the terminal pads 30 and respective wiring patterns 21 via the electrically conductive particles 5. It should be noted here that the anisotropic conductive member 5 stays as an insulating adhesive unless pressed as above because the conductive particles stay dispersed. Thus, the anisotropic conductive member 5 mechanically bonds the film substrate 2 and the main surface of semiconductor chip 3.

The matrix of external terminal portions 4 disposed in the lower surface of the film substrate 2 is formed as follows.

Figure 3:
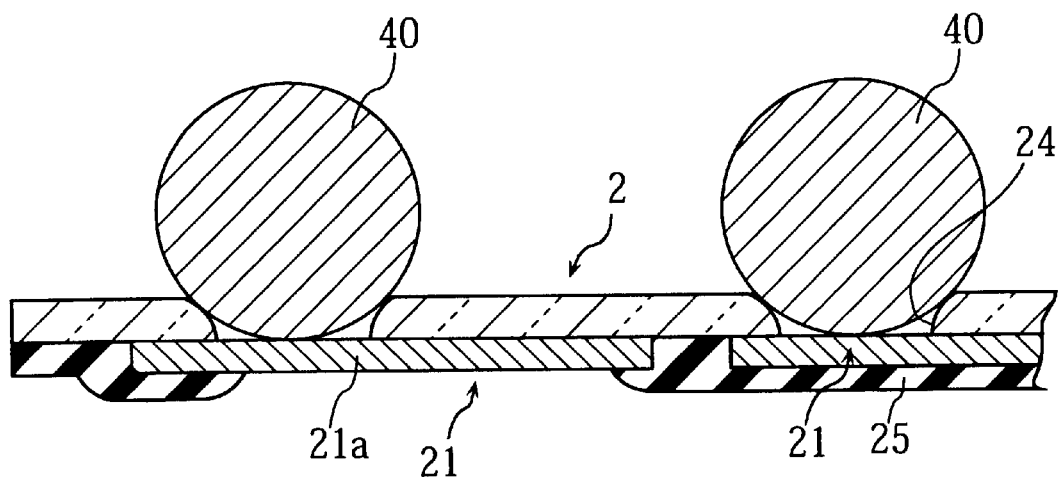
FIG. 3 is an enlarged sectional view showing a state in which each hole in a film substrate is attached with a solder ball.
Figure 4:
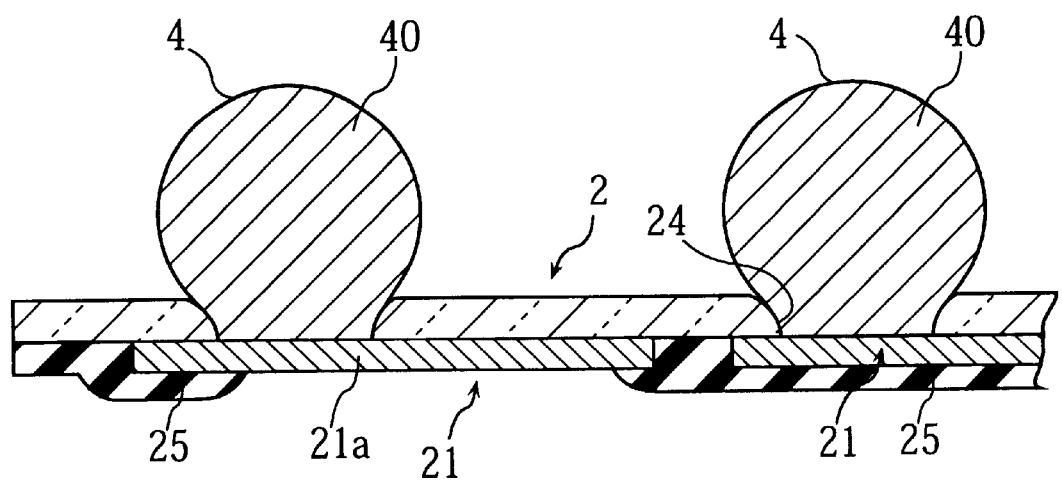
FIG. 4 is an enlarged sectional view showing a state in which each of the solder balls has been formed into an external terminal portion through a heating process following the state shown in FIG. 3.
Figure 5:
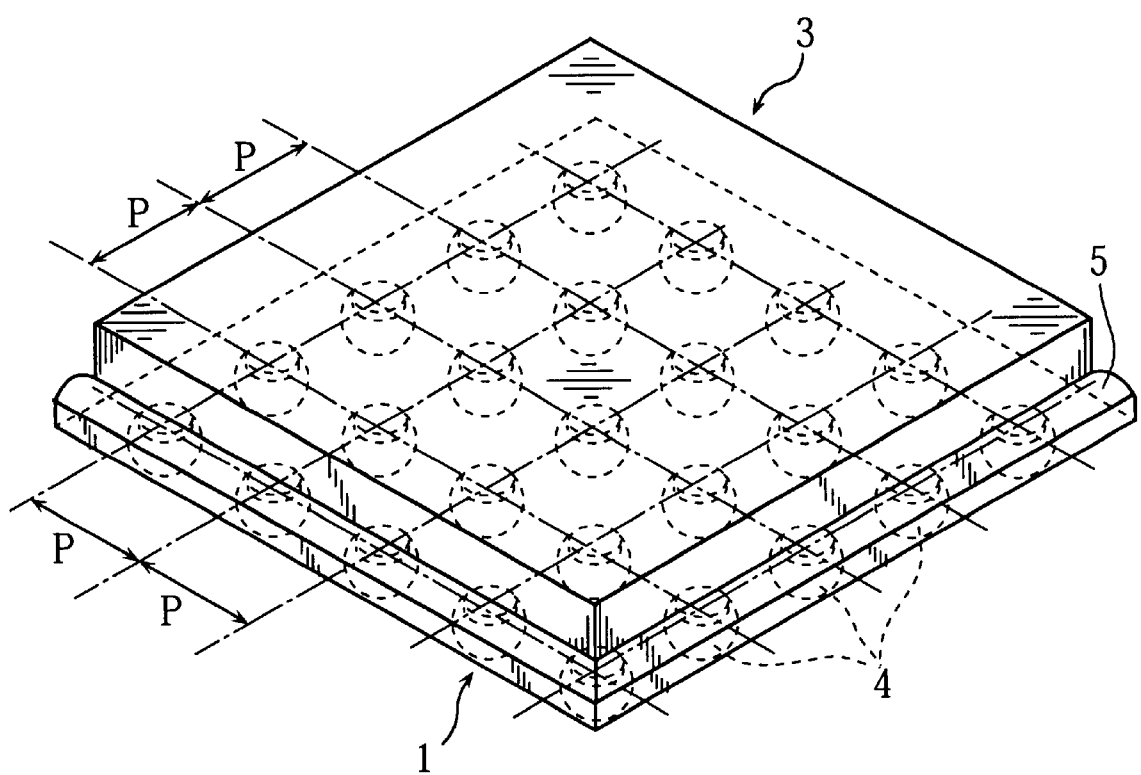
FIG. 5 is a perspective view of the semiconductor device according to the first embodiment of the present invention.
Figure 6:
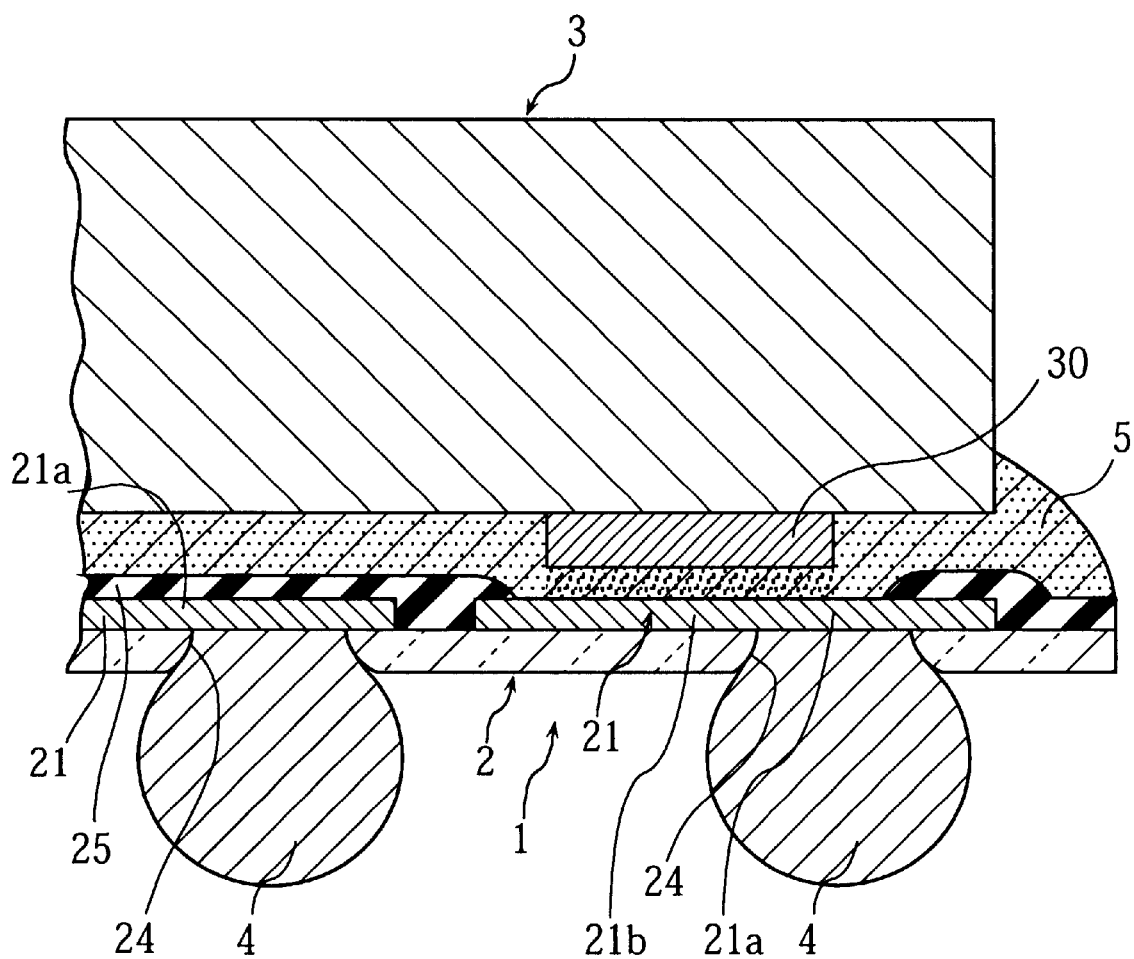
FIG. 6 is an enlarged sectional view of a primary portion in FIG. 5.

Specifically, as shown in FIG. 3, a solder ball 40 is lowered in each of the holes 24 with unillustrated flux from the lower surface side of the film substrate 2. The size of the solder ball 40 is predetermined so that when seated in the hole 24, the solder ball 40 comes in abutment with or adjacent to the wiring pattern 21 in the hole 24 while projecting out of the hole beyond the lower surface of the film substrate 2 by a predetermined amount. Similarly, the size of the hole 24 is predetermined correspondingly to the size of the solder ball 40. The solder ball 40 is then heated to a melting temperature until part of the solder ball 40 bonds to the wiring pattern 21 as shown in FIG. 4. These steps completes the formation of the matrix of the solder ball external terminal portions 4 disposed in the lower surface of the film substrate 2 and projecting out of the lower surface of the film substrate 2 by the predetermined amount. The formation of these external terminal portions 4 may be performed before or after the film substrate 2 is mounted with the semiconductor chip 3.

The film substrate 2 has a thickness considerably smaller than that of a substrate made of a glass epoxy resin. For this reason, the inner diameter of the hole 24 made in the film substrate 2 and the size of the solder ball 40 lowered in the hole 24 can be smaller. As a result, it becomes possible to manufacture a semiconductor device of a higher integration by using a semiconductor chip having a greater number of terminals.

According to the present embodiment shown in the referenced figures, the hole 24 in the film substrate 2 has an increasingly larger inner diameter toward the lower surface of the film substrate 2. This helps the solder ball 40 seated more stably in the hole 24, making possible to allow the solder ball 40 to be made big enough so that the external terminal portion 4 made of the solder ball 40 has a sufficient projection out of the lower surface of the film substrate.

Further, the substrate to which the semiconductor chip 3 is mounted is the film substrate 2, which makes the entire semiconductor device thinner and lighter. Further, the film substrate 2 is flexible, and therefore even if the semiconductor chip 3 has a coefficient of thermal expansion which is very different from that of the film substrate 2, the two members will not come off each other when heated.

Next, reference will be made to FIGS. 7 through 15, and description will be made for a semiconductor device 1 as a second embodiment of the present invention.

Figure 7:
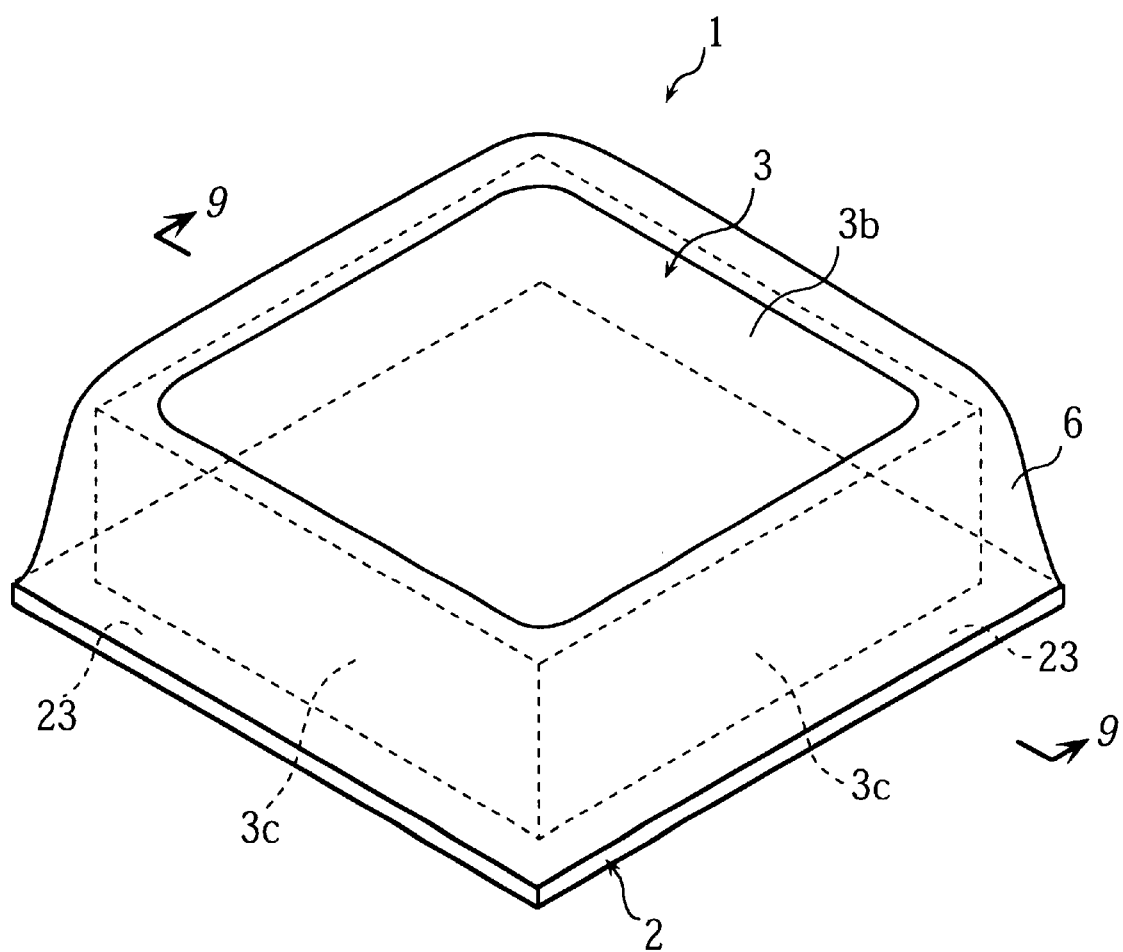
FIG. 7 is an overall perspective view of a semiconductor device as a second embodiment of the present invention.
Figure 8:
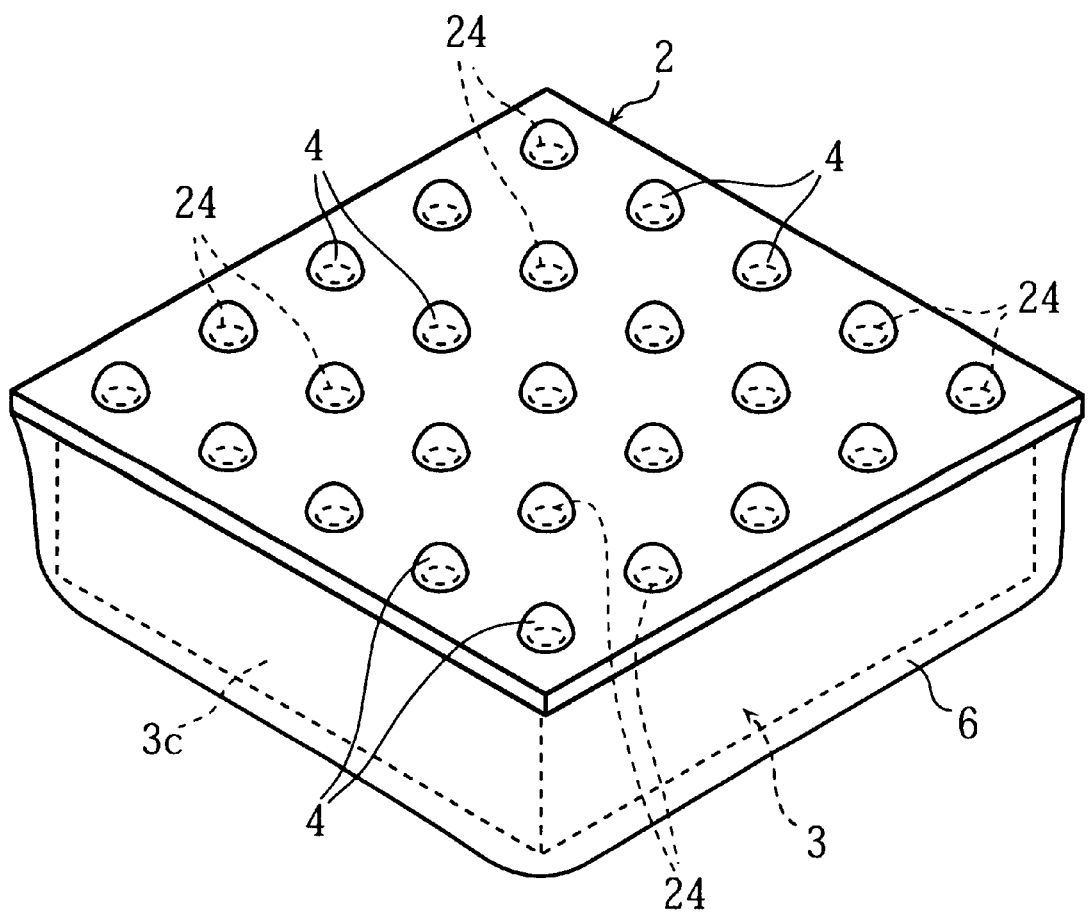
FIG. 8 is an overall perspective view of the above semiconductor device viewed from a lower surface side.
Figure 9:
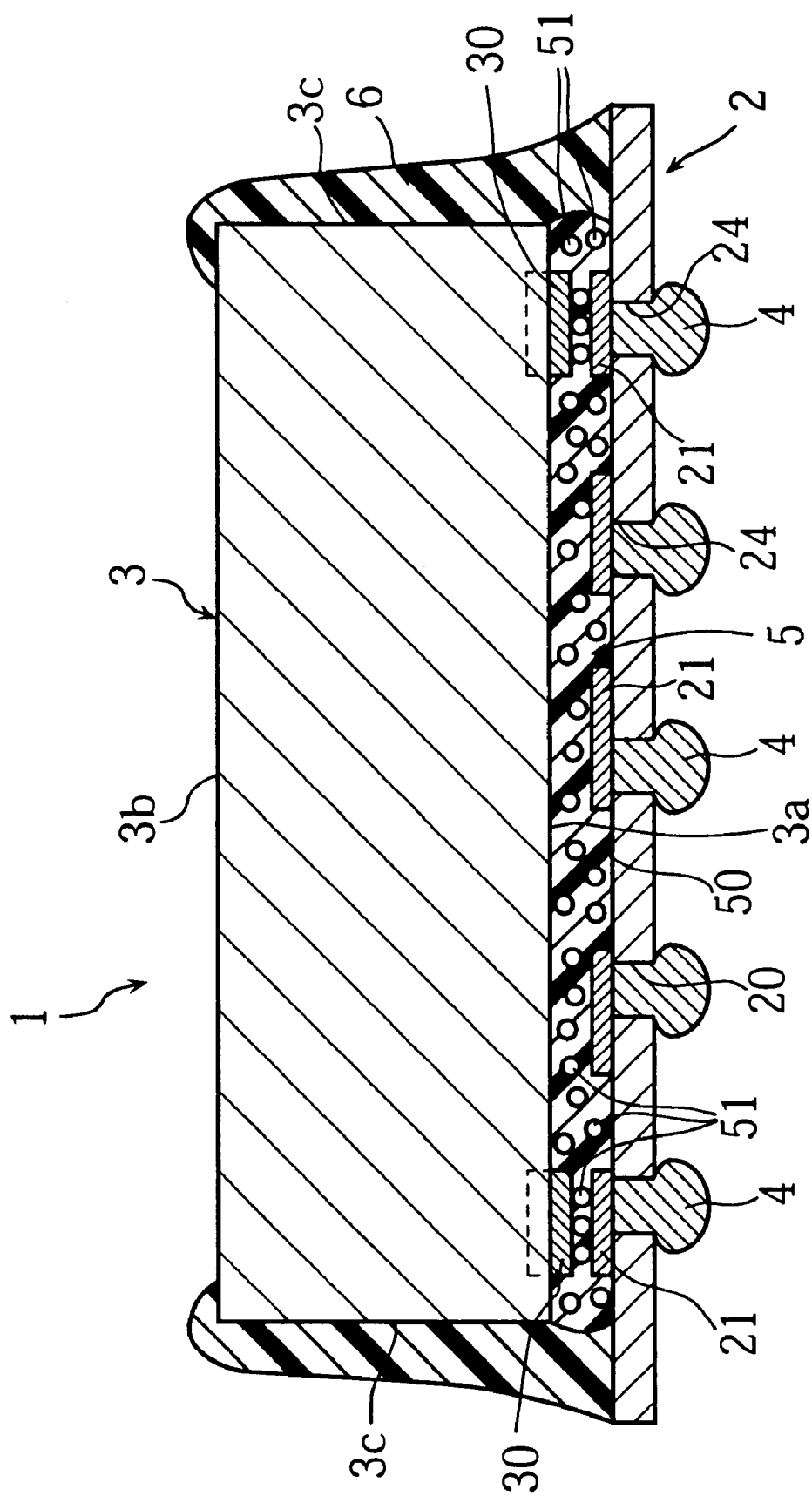
FIG. 9 is a sectional view taken in lines 9—9 in FIG. 7.

As shown in FIGS. 7 through 9, the semiconductor device 1 according to this embodiment also comprises a film substrate 2 mounted with a semiconductor chip 3. The film substrate 2 and the semiconductor chip 3 are mechanically and electrically connected to each other via an anisotropic conductive adhesive 5 placed in between. The semiconductor chip 3 has side surfaces 3c surrounded by a protective resin 6. The film substrate 2 has a matrix of external terminal portions 4 projecting out of the lower surface of the film substrate 2.

The semiconductor chip 3 is a bear chip such as an IC chip or an LSI chip, including a main surface 3a having circumferential edges along which a plurality of electrode pads 30 are formed. Similarly to the previous embodiment, these electrode pads 30 are formed as bump terminals. Specifically for example, the main surface 3a of the semiconductor chip 3 may be integrally formed with aluminum electrodes, and each of these aluminum electrodes may be plated with gold so as to form a bump projecting out of the main surface 3a.

The film substrate 2 is made of a polyimide resin for example. As clearly shown in FIGS. 8 and 9, the film substrate 2 is rectangular as viewed from above, having a slightly larger area as viewed from above than that of the semiconductor chip 3. Thus, when the semiconductor chip 3 is mounted to the film substrate 2, circumferential edge portions of the film substrate 2 extend from the semiconductor chip 3. The film substrate 2 is formed with a plurality of holes 24 in a matrix pattern. The upper surface of the film substrate 2 is formed with a plurality of wiring patterns 21 respectively connected with terminal pads 30 of the semiconductor chip 3. Each of the wiring patterns 21 has an end portion 21b facing one of the terminal pad 30, whereas another end portion 21a extends to one of the holes 24, covering an upper opening of the hole 24. In other words, the end portion 21a of the wiring pattern 21 is exposed to inside of the hole 24, and is accessible from the lower surface side of the film substrate 2. As clearly shown in FIG. 9, each of the holes 24 is filled by the external terminal portion 4 which contacts the wiring pattern 21 while projecting out of the hole 24 as a ball-like bulge.

As clearly shown in FIG. 9, the anisotropic conductive adhesive 5 is based upon a thermosetting resin component 50 dispersed with ball-like conductive particles 51. The semiconductor chip 3 and the film substrate 2 are connected mechanically by the resin component 50 while also connected electrically by the conductive particles 51. The resin component 50 contains a phenol resin for example as a porous resin. Alternatively, the resin component may be made only by a porous resin or may contain other resins. It should be noted that the phenol resin mentioned here includes phenol resins as well as other resins such as epoxy resins manufactured from phenol. The electrically conductive particles 51 sandwiched between the terminal pad 30 of the semiconductor chip 3 and the end portion of the wiring pattern 21 of the film substrate 2 electrically connects the terminal pad 30 with the wiring pattern 21. The electrically conductive particles 51 can be conveniently selected from resin balls having their surfaces plated with nickel or gold for example. However, the electrically conductive particles 51 may also be selected from metal balls.

The protective resin 6 seals a circumferential portion 23 of the upper surface of film substrate 2, encloses the semiconductor chip 3, and extends to an upper surface 3b (the side away from the main surface 3a) of the semiconductor chip 3. In other words, the protective resin 6 seals a bonding region where the semiconductor chip 3 is bonded to the film substrate 2 (i.e. outer edges of the anisotropic conductive adhesive 5) and the side surfaces 3c of the semiconductor chip 3. The protective resin 6 makes the circumferential portion 23 of the upper surface of film substrate 2 integrated with the semiconductor chip 3. The protective resin 6 may be conveniently selected from resins containing a phenol resin as a porous resin similarly to the resin component 50 of the above anisotropic conductive adhesive 5.

According to the above semiconductor device 1, the circumferential side surfaces 3c and the circumferential edge portions of the upper surface of the semiconductor chip 3 are protected directly by the protective resin 6. Thus, even if an external force is acted to the semiconductor chip 3 while the semiconductor device 1 is being handled, damage to the semiconductor chip 3 is smaller. Further, the protective resin 6 integrates the circumferential portion 23 of the film substrate 2 with the semiconductor chip 3. This protects the circumferential portion 23 of the film substrate 2 from being acted directly by external forces, preventing more effectively the circumferential portion 23 of the film substrate 2 from being caught by external force which would otherwise destroy connection between the semiconductor chip 3 and the film substrate 2.

Next, description will be made for a manufacturing method of the semiconductor device 1, referring to FIGS. 10 through 15. For the sake of convenience, reference is first made to FIG. 10 to describe a master film-substrate 2A used for the manufacture of semiconductor device 1.

Figure 10:
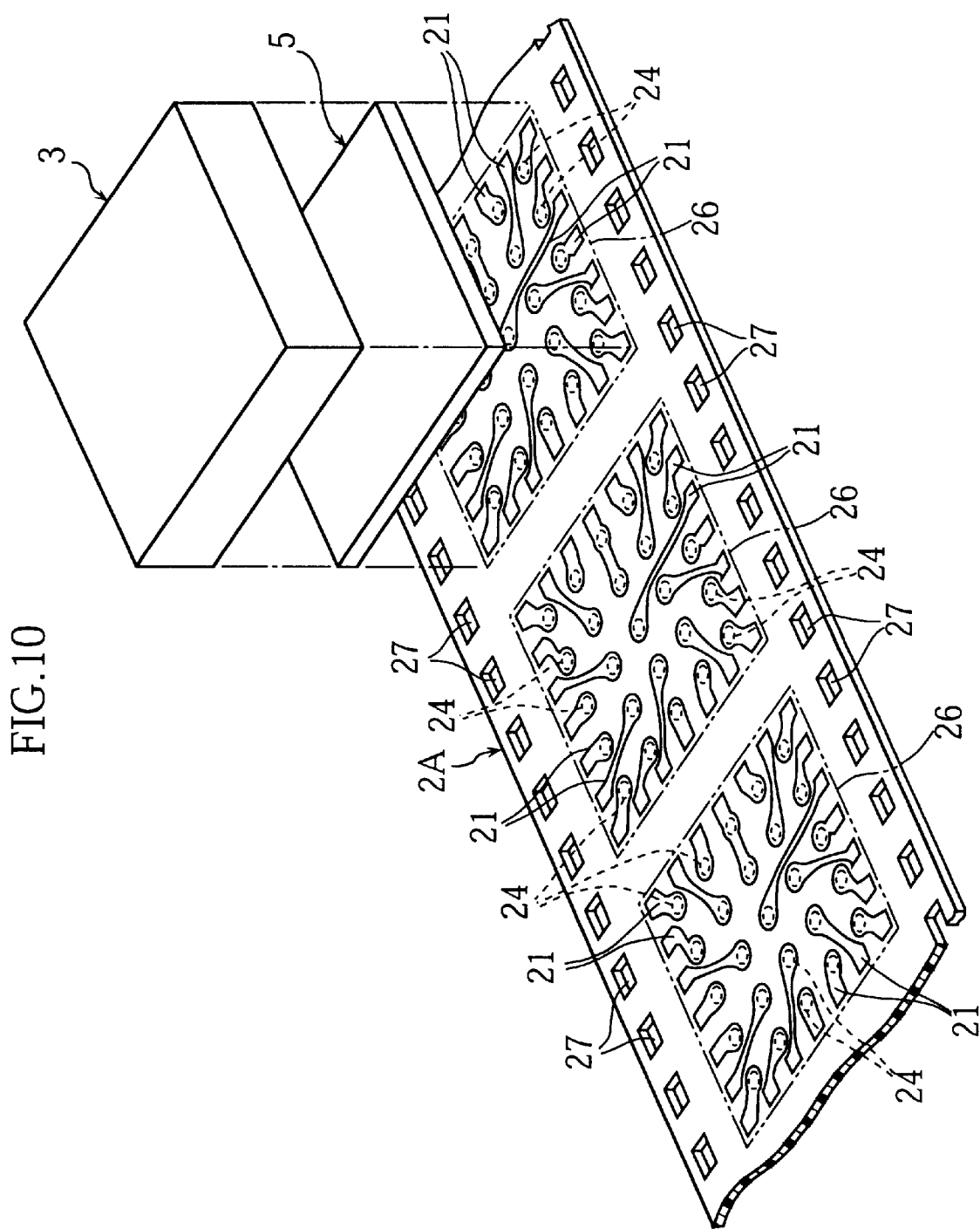
FIG. 10 is a perspective view of a primary portion of a master film-substrate used for manufacturing the above semiconductor device.

As will be understood from FIG. 10, the master film-substrate 2A is like a long ribbon having an upper surface formed with a plurality of rectangular regions 26 indicated by phantom lines in the figure. The rectangular regions 26 are formed in succession longitudinally of the ribbon. Each of the rectangular regions 26 will be mounted with one semiconductor device 3. The master film-substrate 2A may be conveniently prepared from a long strip or tape of an insulating film material such as a polyimide resin. Each of the rectangular regions 26 is formed with a plurality of holes 24 disposed in a matrix pattern, and on this matrix pattern, a plurality of wiring patterns 21 is formed. These wiring patterns 21 may be formed by etching for example. Specifically a layer of metal such as copper may be formed, or a foil of copper may be pasted on the surface of master film-substrate 2A, and then be etched. Alternatively, pieces of metal foil prepared in respective patterns may be pasted to the surface of master film-substrate 2A. Each of the wiring patterns 21 has an end portion covering an opening of one of the holes 24 from above, and another end portion disposed to a location corresponding to one of the terminal pads 30 formed in the semiconductor chip 3. The master film-substrate 2A has two longitudinal edge portions each formed with a successive pattern of engaging holes 27 spaced at a predetermined pitch. These engaging holes 27 are used for transferring the master film-substrate 2A while a portion of the substrate is on a desired support table for receiving manufacturing operation. It should be noted here that the rectangular region 26 may be covered by an insulating coating (not illustrated). In such a case, the end portion of each wiring pattern for making connection with the semiconductor chip 3 must be left uncovered.

Figure 11:
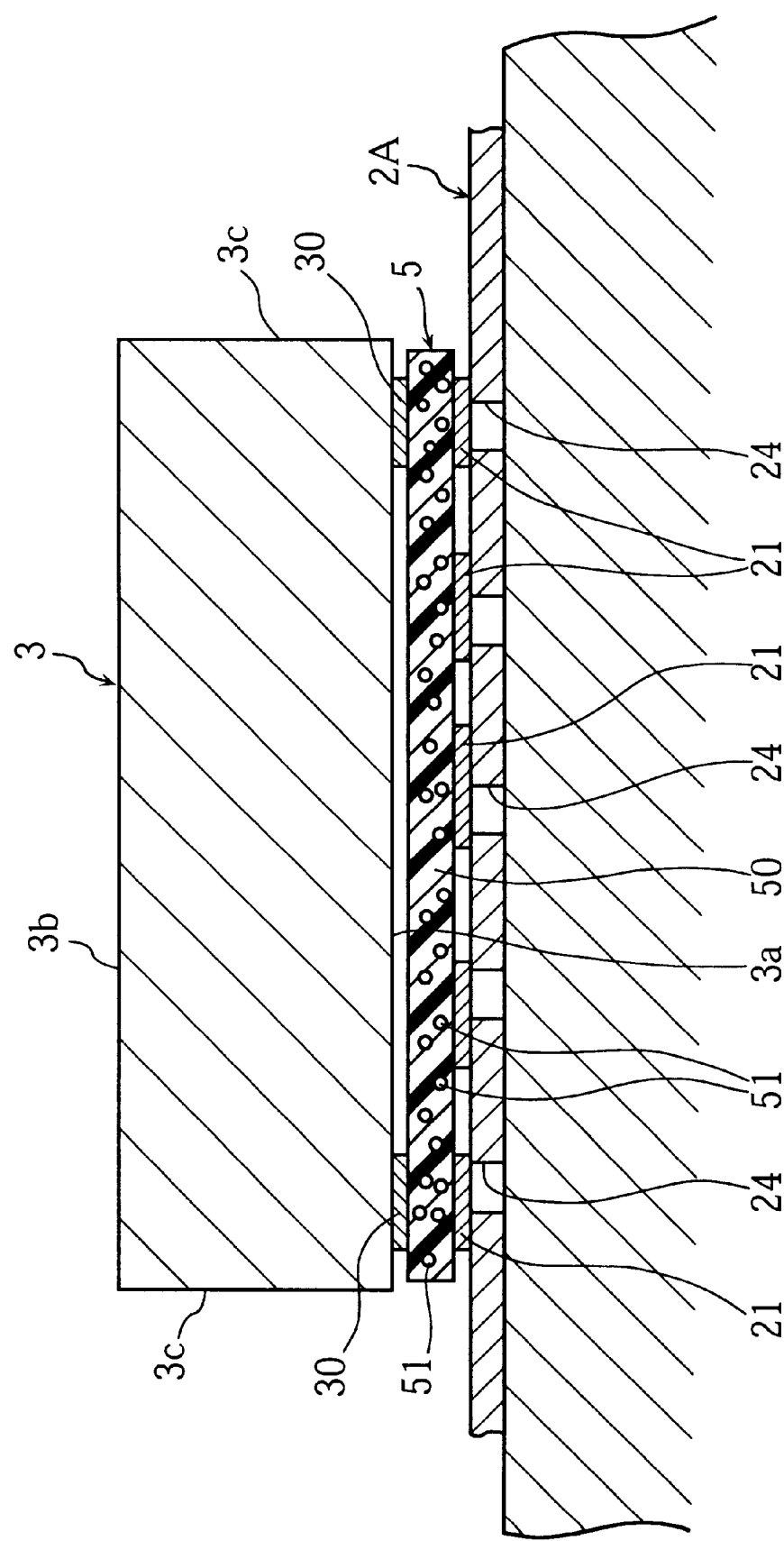
FIG. 11 is a sectional view illustrating a step of manufacturing the above semiconductor device.

As clearly shown in FIGS. 10 and 11, the rectangular region 26 of the master film-substrate 2A is placed with a sheet of anisotropic conductive adhesive 5 having generally the same area as that of the rectangular region 26 as viewed from above. The semiconductor chip 3 is placed onto this anisotropic conductive adhesive 5, with the main surface of the semiconductor chip 3 facing downward, so that each of the terminal pads 30 is faced to the corresponding end portion of the wiring pattern 21. It should be noted that the anisotropic conductive adhesive 5 may alternatively be a paste or liquid type based on a viscous resin component 50.

Figure 12:
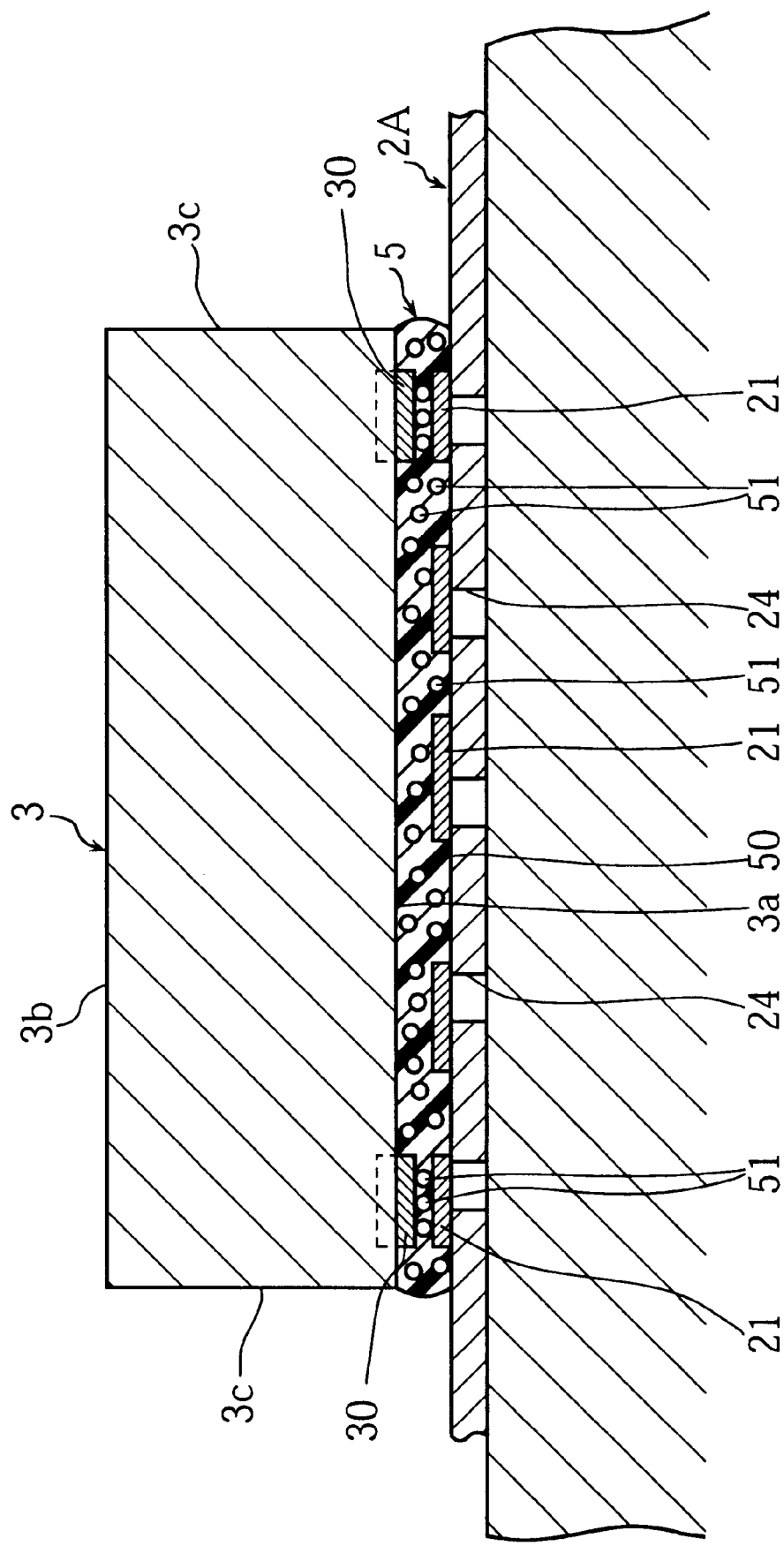
FIG. 12 is a sectional view illustrating a step of manufacturing the above semiconductor device.

Then, the anisotropic conductive adhesive 5 is heated while the semiconductor chip 3 is being pressed to the master film-substrate 2A. FIG. 12 shows a state after this operation. Since the resin component 50 of the anisotropic conductive adhesive 5 is thermosetting, the resin component 50 is first softened when heated. When the semiconductor chip 3 is pressed to the master film-substrate 2A under this state, the resin component 50 between each pair of the terminal pad 30 of the semiconductor chip 3 and the wiring pattern 21 of the master film-substrate 2A will be pressed out of space, selectively bringing the electrically conductive components 51 to be caught between the terminal pad 30 and the wiring pattern 21. This establishes electrical connection between each pair of the terminal pad 30 and the wiring pattern 21. It should be noted that an ultrasonic wave may be applied when the semiconductor chip 3 is being pressed to the master film-substrate 2A. This causes the electrically conductive components 51 to be alloyed with each of the corresponding terminal pad 30 and the wiring pattern 21, resulting in a better connection both mechanically and electrically. When the heating is continued, the softened resin component becomes hard, bringing the semiconductor chip 3 and the master film-substrate 2A into mechanical bond.

Figure 13:
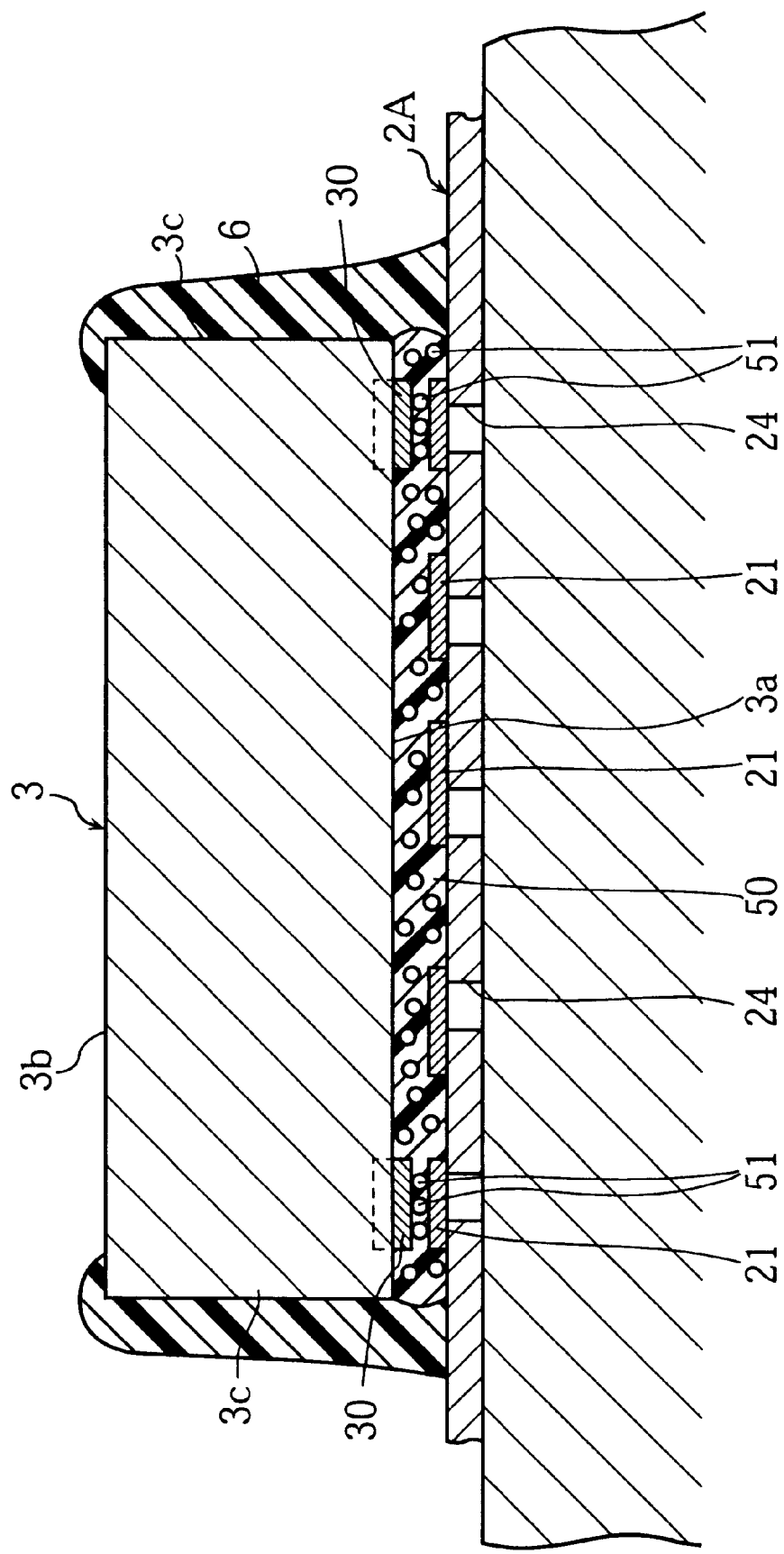
FIG. 13 is a sectional view illustrating a step of manufacturing the above semiconductor device.

Next, as shown in FIG. 13, a bonding region, where the semiconductor chip 3 is bonded to the film substrate 2 (i.e. outer edges of the anisotropic conductive adhesive 5), and the side surfaces 3c of the semiconductor chip 3 are surrounded by a thermosetting protective resin 6. This protective resin 6 may be preferably selected from a viscous type, and the anisotropic conductive adhesive 5 or another resin may be conveniently used for this purpose. The enclosure by the protective resin 6 around the semiconductor chip 3 may of course be made prior to hardening the resin component of the anisotropic conductive adhesive 5. In such a case the protective resin 6 will be hardened at the same time as the anisotropic conductive adhesive 5 is hardened.

Figure 14:
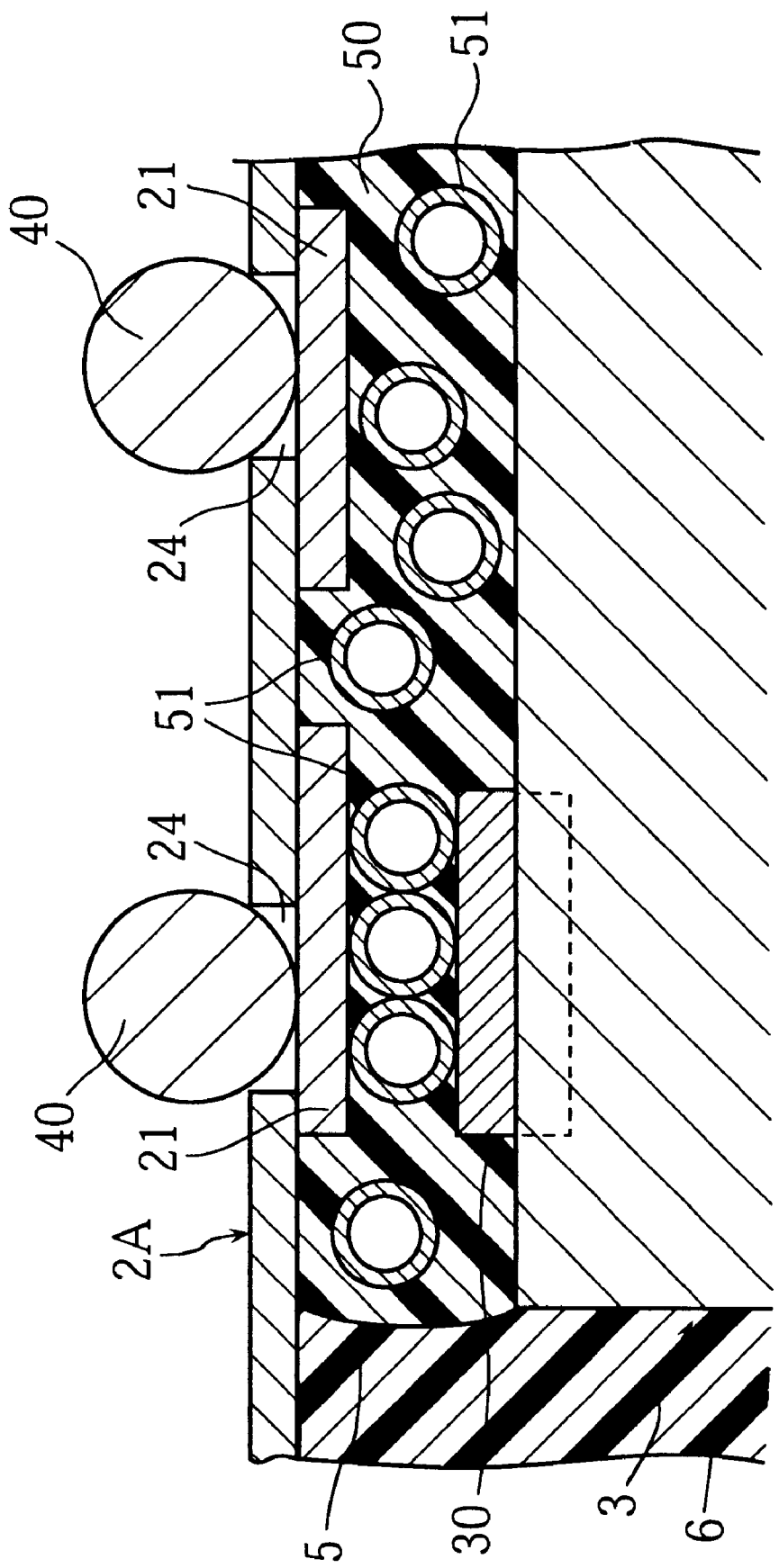
FIG. 14 is an enlarged sectional view of a primary portion illustrating a step of manufacturing the above semiconductor device.
Figure 15:
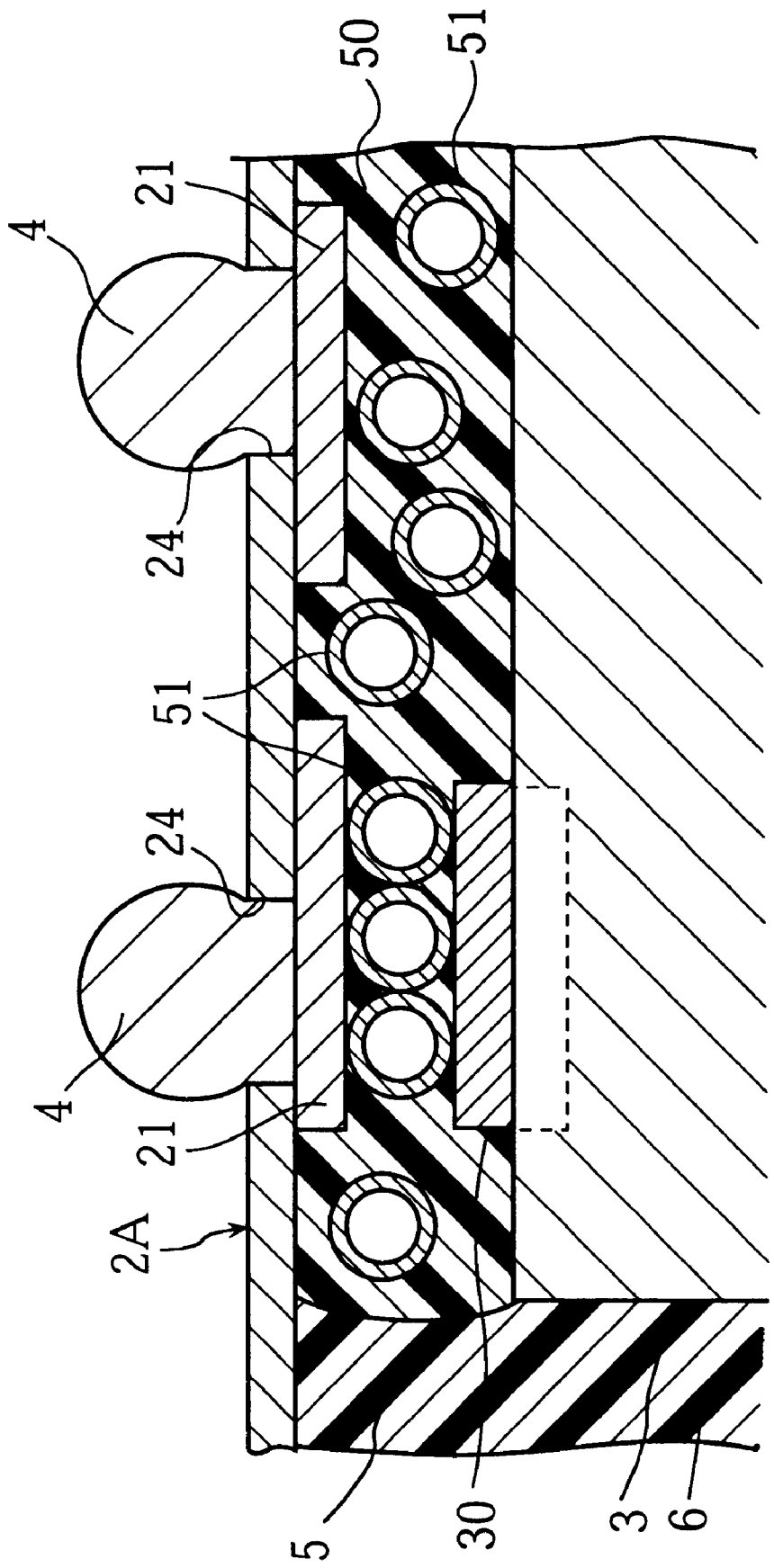
FIG. 15 is an enlarged sectional view of a primary portion illustrating a step of manufacturing the above semiconductor device.

Next, as shown in FIG. 14, the master film-substrate 2A is inverted for forming the matrix of external terminal portions 4 in the lower surface of the master film substrate 2A corresponding to the holes 24 formed in the rectangular region 26 of the master film-substrate 2A. Specifically, as mentioned earlier for the first embodiment, a solder ball 40 is placed with flux (not illustrated) in each of the holes 24. Then, the solder ball 40 is heated to melt and then cooled to harden to become a ball-like external terminal portion 40 as shown in FIG. 15.

After finishing each of the operations described above, cutting operation is made near each of the edges of the protective resin 6, separating a region to be the film substrate 2 from the master film-substrate 2A to obtain the semiconductor device 1 as shown in FIGS. 7 through 9.

Generally in use, the above semiconductor device 1 is mounted to a mother substrate (not illustrated) formed with a wiring pattern, together with other electronic components. The mounting to the mother substrate is achieved by first lowering the semiconductor device 1 onto predetermined terminal portions formed on the mother substrate, and then heating the external terminal portions 4 in a furnace for example, to re-melt the external terminal portions 4 (solder balls). During this heating operation, each of the external terminal portions 4 is heated to 200 degrees Celsius through 300 degrees Celsius, and accordingly the anisotropic conductive adhesive 5 is also heated to a similar temperature. This poses a potential problem that thermally expanded moisture or air bubbles included in the anisotropic conductive adhesive 5 may generate stress inside the anisotropic conductive adhesive 5.

However, in the semiconductor device 1 according to the present embodiment, the resin component 50 of the anisotropic conductive adhesive 5 contains a porous resin, and in addition, the protective resin 6 surrounding the anisotropic conductive adhesive 5 also contains a porous resin. In other words, the anisotropic conductive adhesive 5 and the protective resin 6 are rich in gas permeability. Therefore, even if the moisture or air bubbles begin expanding in the anisotropic conductive adhesive 5 during the heating, the expansion is released out of the anisotropic conductive adhesive 5, and then out of the protective resin 6. As a result, in the semiconductor device 1 according to the present embodiment, no stress is developed in the anisotropic conductive adhesive 5 when the semiconductor device 1 (anisotropic conductive adhesive 5) is heated during the mounting operation of the semiconductor device 1 to the mother substrate. Thus, there is no stress damage to the semiconductor chip 3, or no external force which would destroy connection between the semiconductor chip 3 and the film substrate 2.

Note should be made here for the adhesive. According to the present embodiment, the adhesive which contains the resin component 50 dispersed with the electrically conductive component 51 is used. However, the adhesive may only contain a resin component. In such a case, the semiconductor chip 3 should be pressed against the film substrate 2 by a relatively high pressure while applying a supersonic wave, in order to make sure that the terminal pad 30 of the semiconductor chip 3 come into direct contact with the wiring pattern 21 of the film substrate, establishing the electrical connection.

Figure 16:
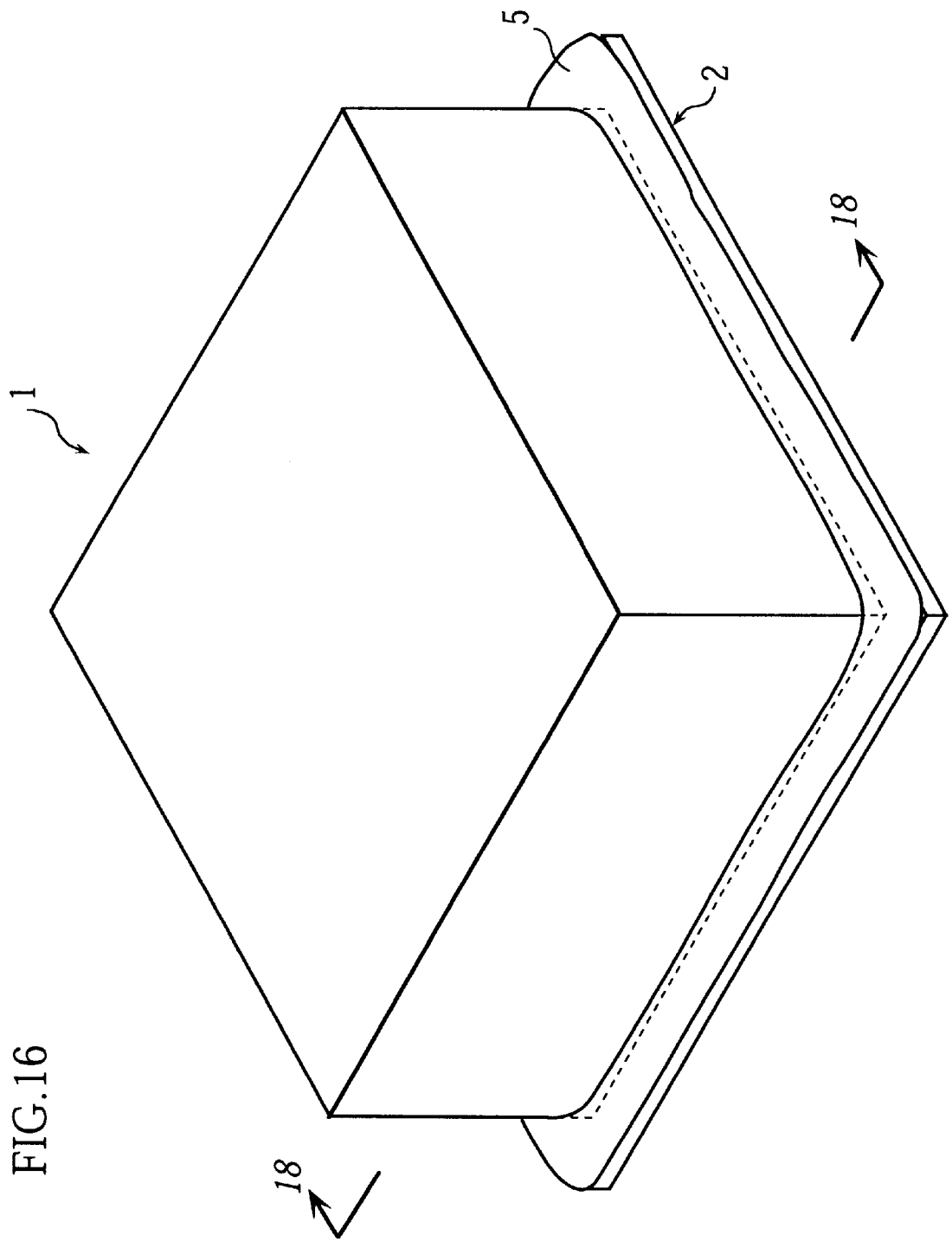
FIG. 16 is an overall perspective view showing a semiconductor device as a third embodiment of the present invention.
Figure 17:
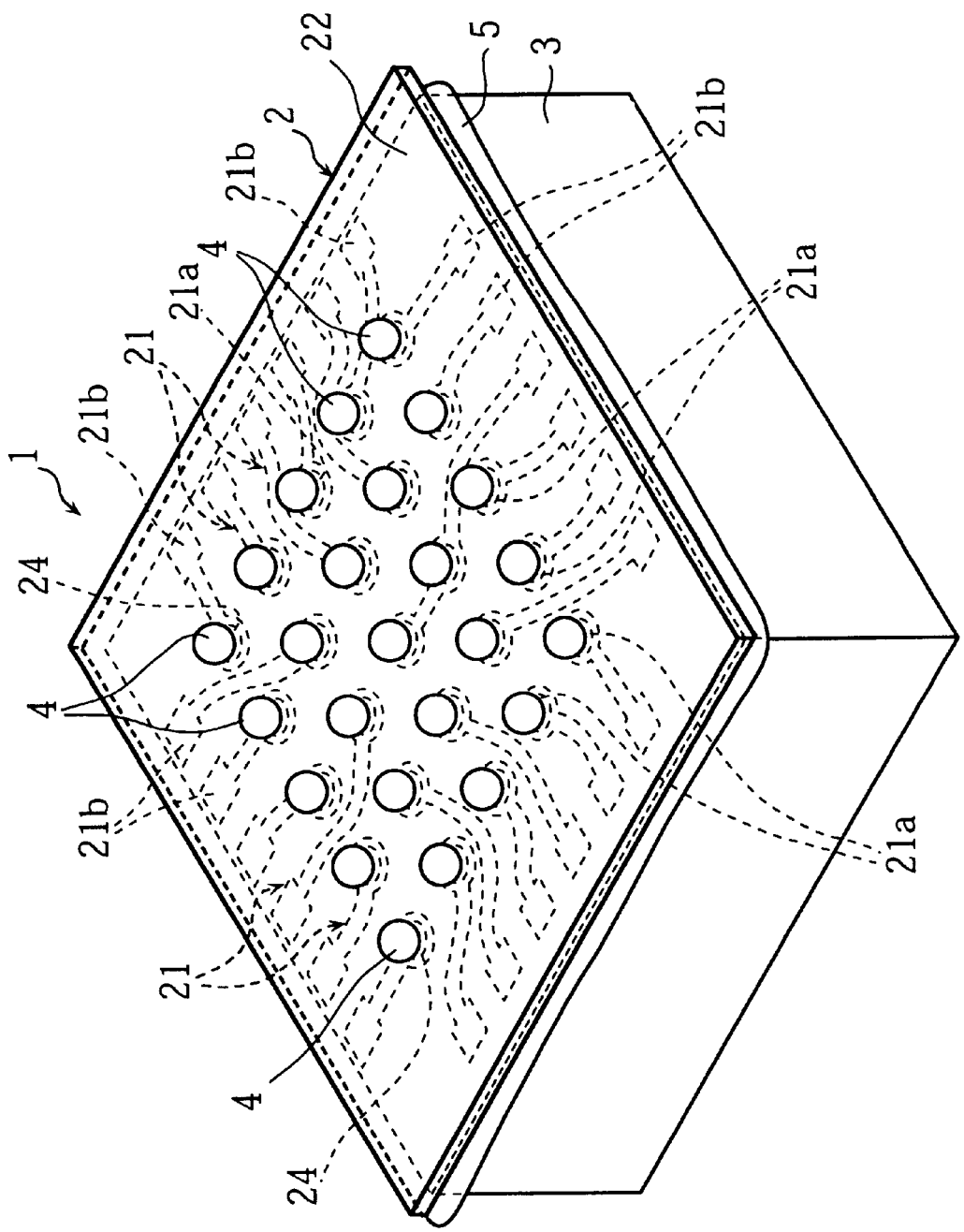
FIG. 17 is an overall perspective view of the above semiconductor device viewed from a lower surface side.
Figure 18:
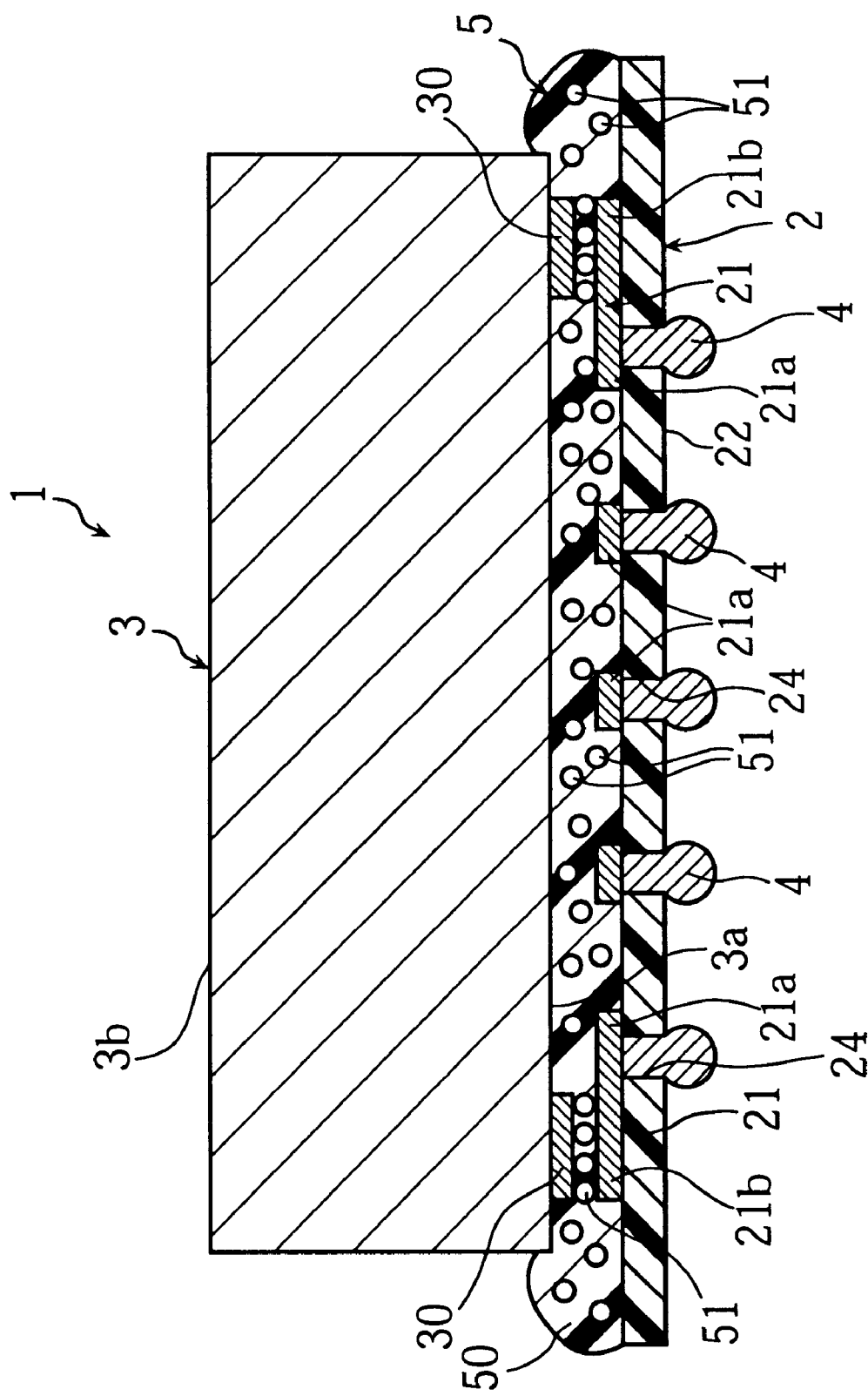
FIG. 18 is a sectional view taken in lines 18—18 in FIG. 16.
Figure 19:
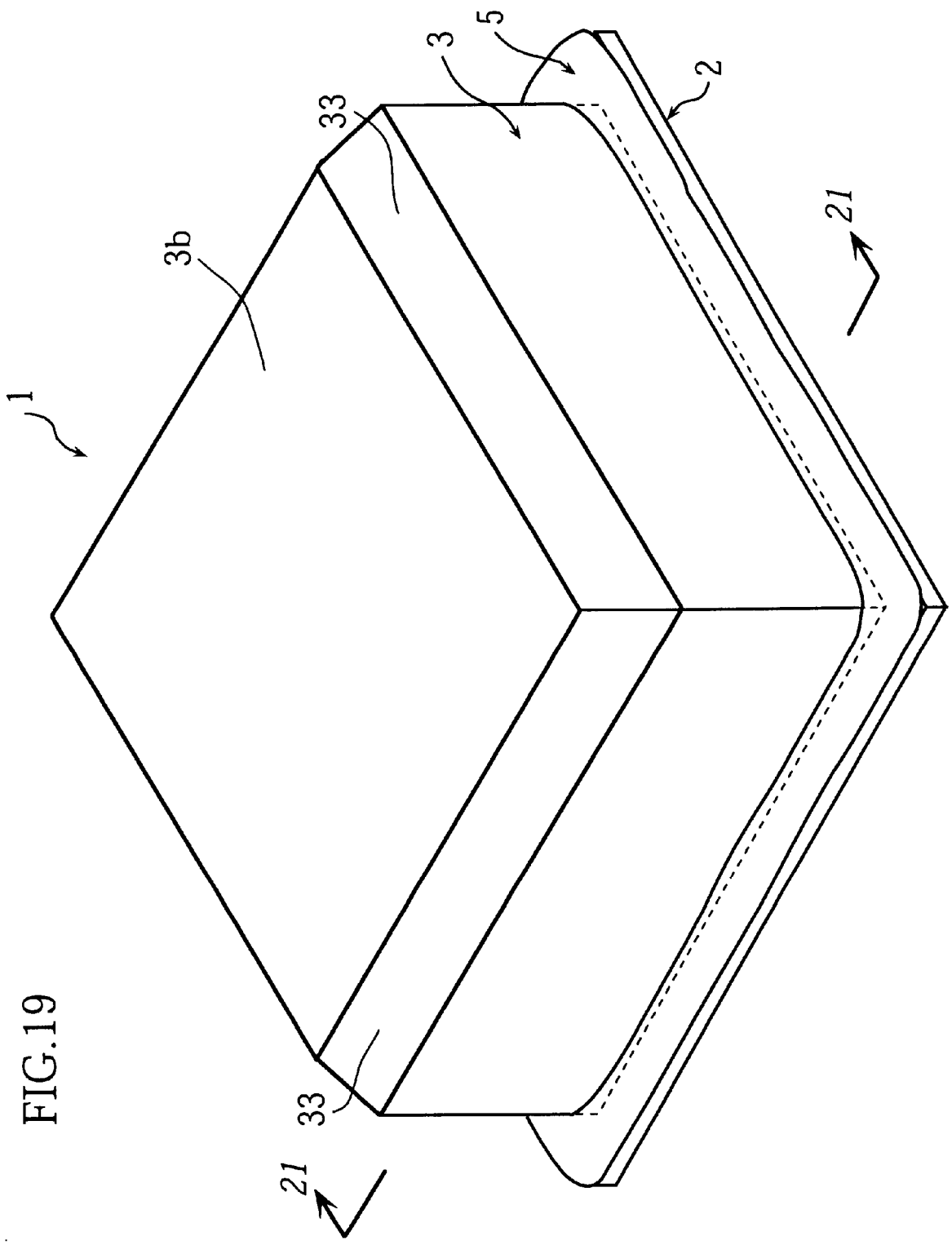
FIG. 19 is an overall perspective view showing a semiconductor device as a forth embodiment of the present invention.
Figure 20:
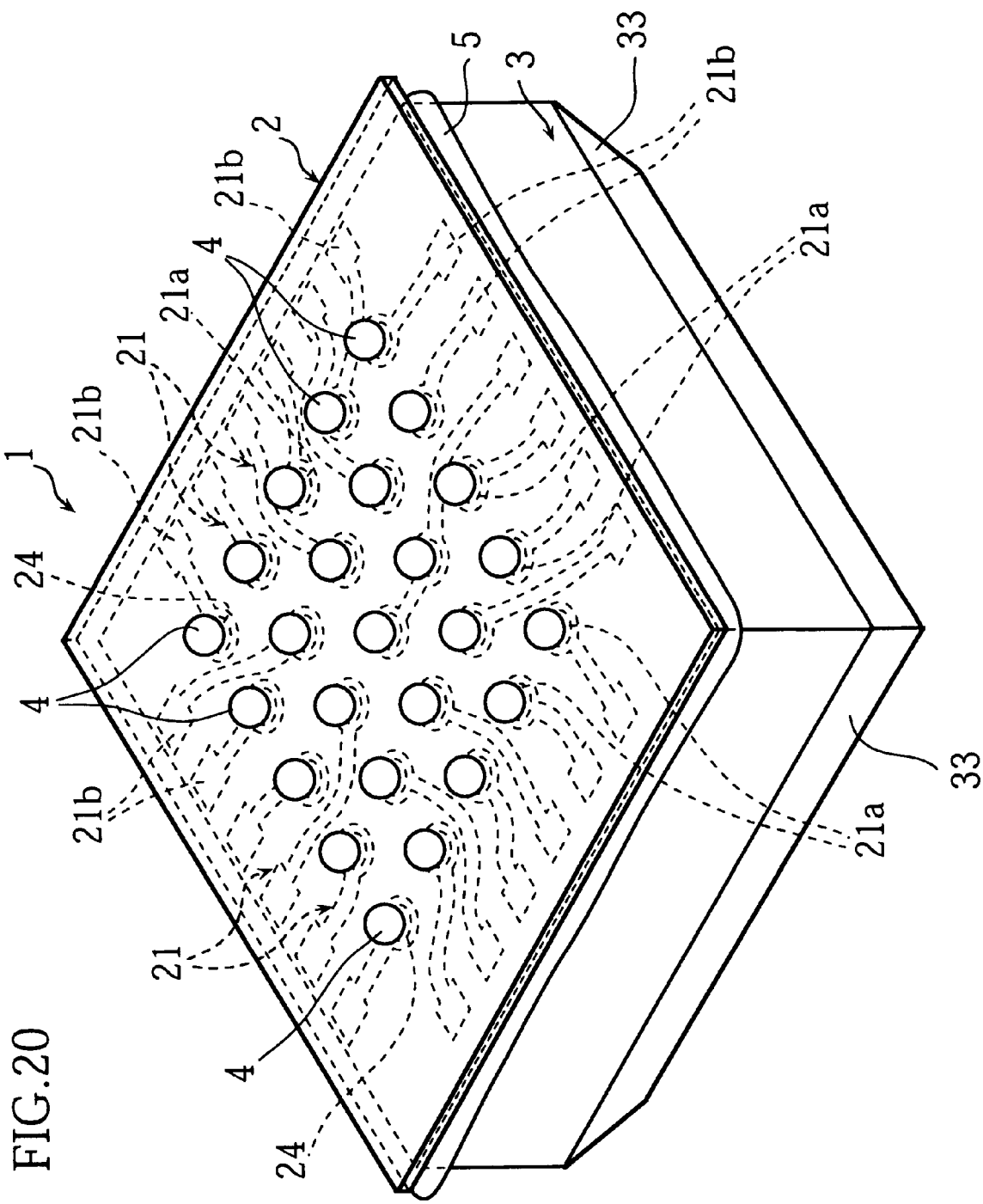
FIG. 20 is an overall perspective view of the above semiconductor device viewed from a lower surface side.
Figure 21:
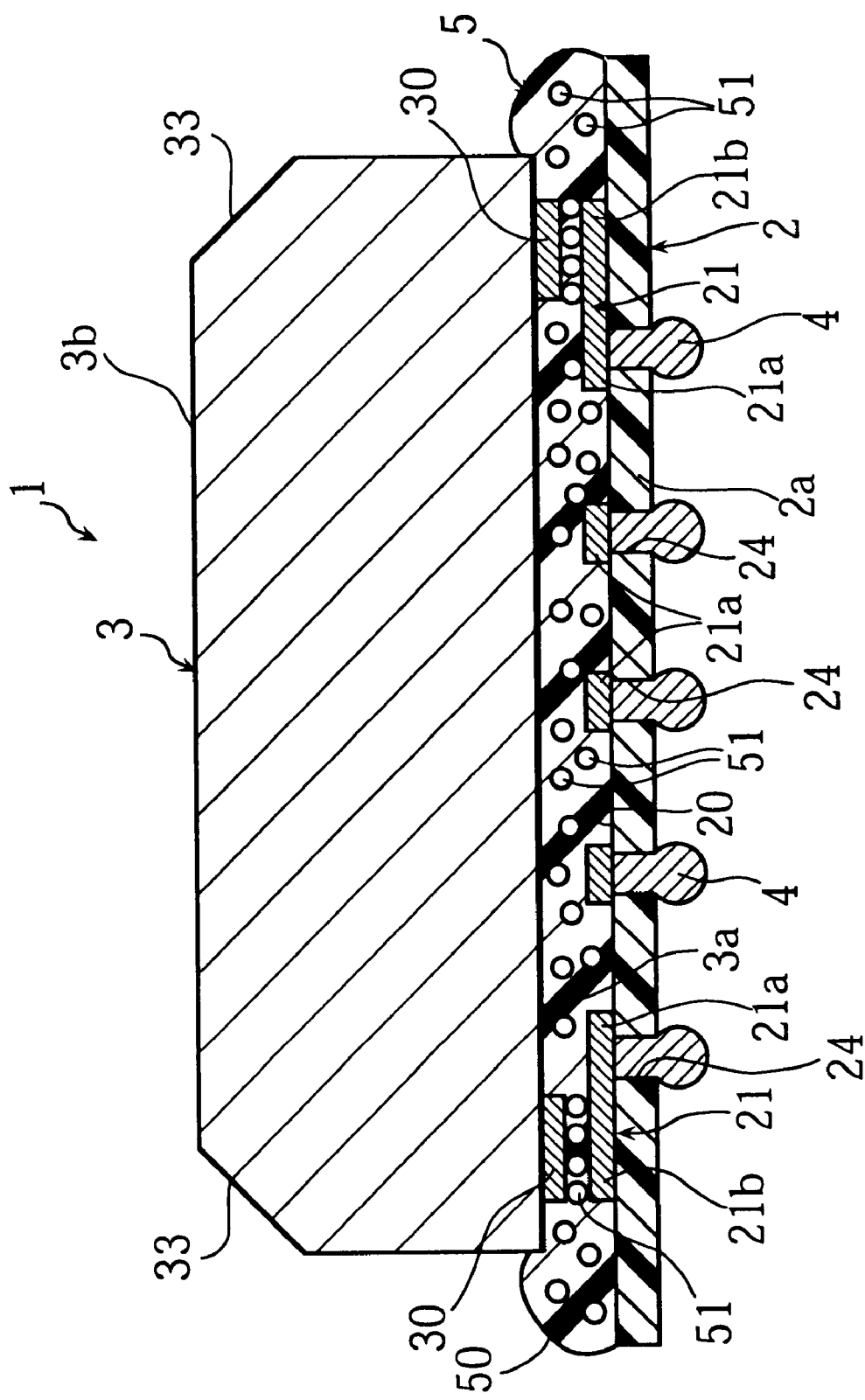
FIG. 21 is a sectional view taken in lines 21—21 in FIG. 19.
Figure 22:
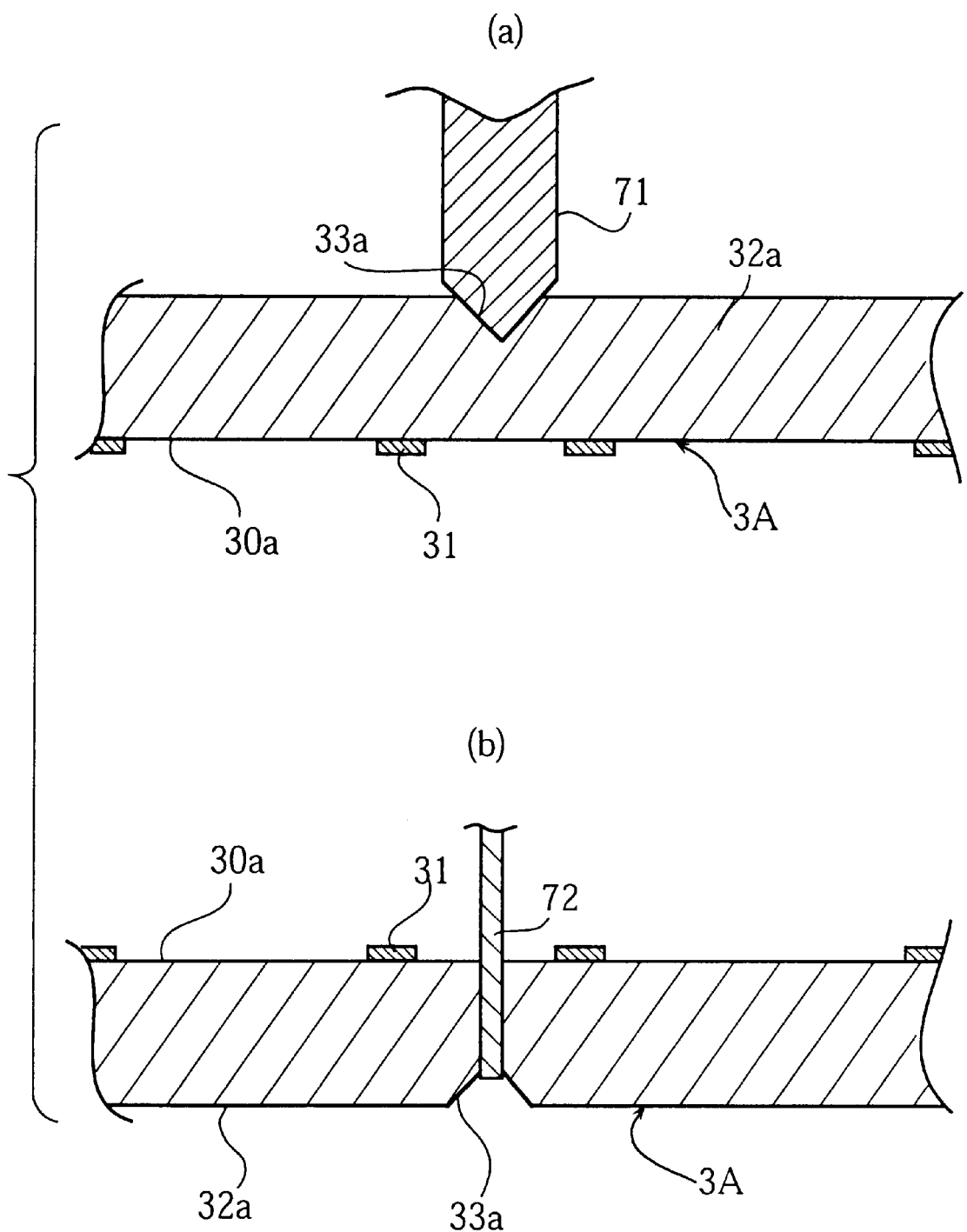
FIG. 22 is a sectional view illustrating a step of manufacture.

Next, reference is made to FIGS. 16 through 18 to see a third embodiment of the present invention.

A semiconductor device 1 according to this embodiment is similar to the semiconductor device 1 according to the second embodiment shown in FIGS. 7 through 9. However, the protective resin which surrounds the semiconductor chip 3 is not used in the semiconductor device 1 in this third embodiment. Further, according to the present embodiment, each of wiring patterns 21 formed in an upper surface of a film substrate 2 has an end portion 21a extended inwardly of a corresponding terminal pad 30 of a semiconductor chip 3 as viewed from above, into a region inward of the terminal pads 30. Except these differences, all the other arrangements are practically the same as the second embodiment, and therefore corresponding members and portions are identified by the same alpha-numeral code, and no further description will be made. Further, the semiconductor device 1 according to this third embodiment can be manufactured by practically the same method as described for the second embodiment.

With the above arrangement, when the semiconductor chip 3 is bonded to the film substrate 2, and more particularly when the semiconductor chip 3 is pressed to the film substrate 2 with the anisotropic conductive adhesive 5 in between, the pressure from the bump terminal pads 30 of the semiconductor chip 3 can act more effectively on the wiring pattern 21 of the substrate 2, allowing the anisotropic conductive adhesive 5 to be pressed more selectively for establishing electrical connection more securely. The advantage of this arrangement should become clearer if consideration is made to a following fact. Specifically, the wiring pattern 21 is formed to cover the hole 24 of the film substrate 2, and the terminal pad 30 of the semiconductor chip 3 is pressed onto a portion of the wiring pattern 21 which is right above the hole 24. With such an arrangement, there can be such a situation that the wiring pattern 21 may not receive sufficient pressure from the terminal pad 30.

Next, reference will be made to FIGS. 19 through 22 to see a semiconductor device 1 as a forth embodiment of the present invention.

The semiconductor device 1 according to this embodiment differs from the semiconductor device 1 according to the third embodiment shown in FIGS. 16 through 18 in that a semiconductor chip 3 has an upper surface 3b (the surface away from the main surface 3a) formed with chamfers 33. Otherwise, all the other arrangements are practically the same as the third embodiment, and therefore corresponding members and portions are identified by the same alpha-numeral codes, and no further description will be made. Further, the semiconductor device 1 according to this forth embodiment can be manufactured by practically the same method as described for the second embodiment.

The chamfers 33 of the semiconductor chip 3 are formed before the semiconductor chips 3 is separated as an individual chip. More specifically, the chamfers 33 are formed to a material wafer as shown in FIG. 22(a) by using a blade 71 having a tapered edge. The wafer 3A is died by the blade 71 on its lower surface 32a. This forms a groove 33a having a triangular section in the wafer 3A. Then, as shown in FIG. 22(b), another blade 72 having a straight edge is applied opposingly to the groove 33a from the other surface of the wafer 3A, separating the individual semiconductor chip 3.

The semiconductor chip 3 mounted in a "face down" manner is disadvantageous in that sharp edge portions on the upper surface 3b of the semiconductor chip 3 is susceptible to chipping. However, if these portions are chamfered in advance, the semiconductor chip 3 is much less susceptible to damage even if some external force may act on the semiconductor chip 3.

Figure 23:
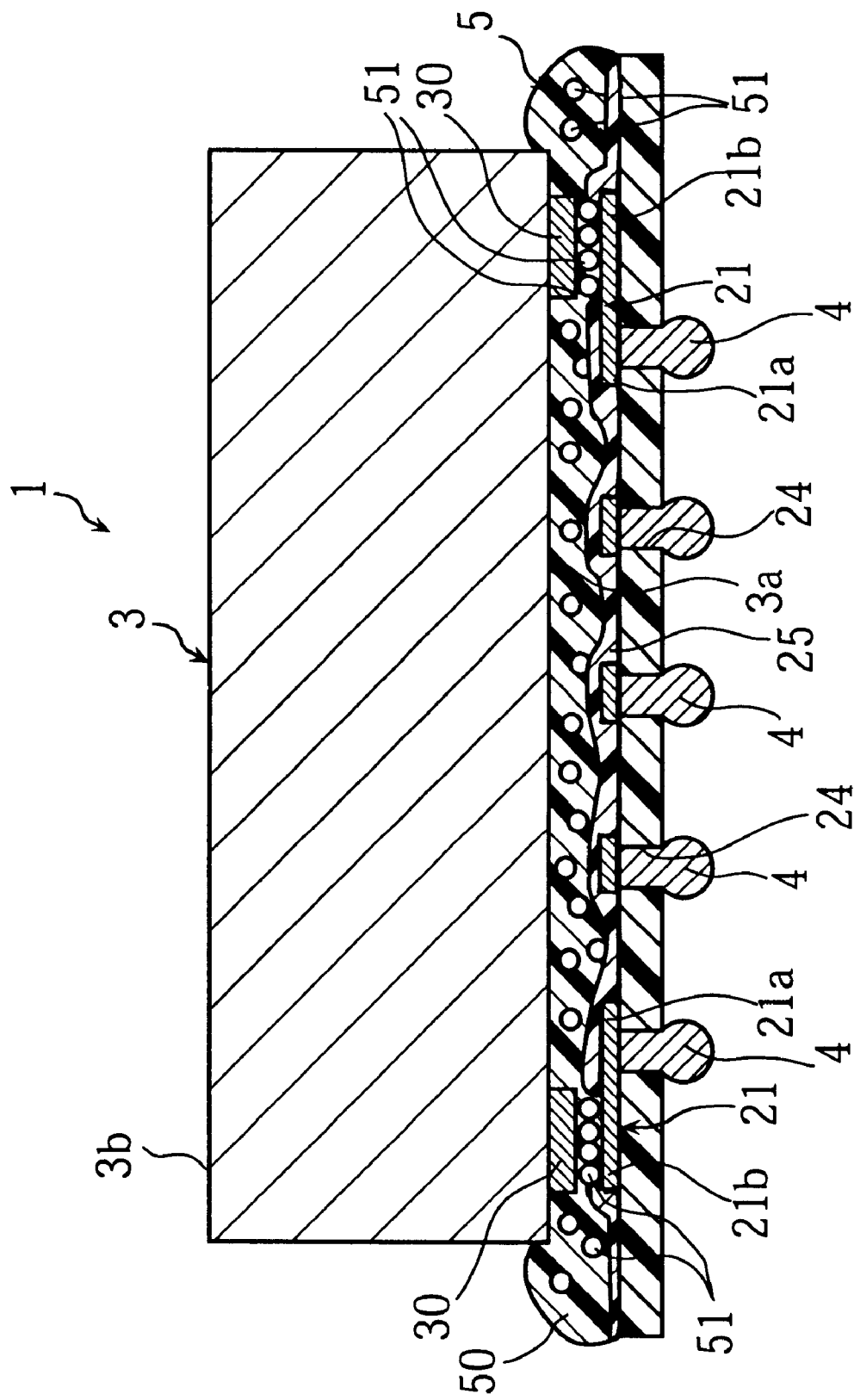
FIG. 23 is a longitudinal sectional view showing a semiconductor device as a fifth embodiment of the present invention.

Next, reference will be made to FIG. 23 to see a semiconductor device 1 as a fifth embodiment of the present invention.

The semiconductor device 1 according to this embodiment has a region including its wiring patterns 21 formed on the film substrate 2 covered by an alpha ray shielding insulation coating 25. However, the coating 25 is not made on each of the regions 21b where the terminal pads 30 of the semiconductor chip 3 establishes electrical connection with the wiring patterns 21. More specifically, the alpha ray shielding insulation coating 25 is formed at least to cover a region right above each of the external terminal portions 4. Further, the alpha ray shielding insulation coating 25 is made of a polyimide resin for example. This coating effectively protects circuit elements formed in the main surface 3a of the semiconductor chip 3 from exposure to alpha rays emitted from the external terminal portions 4 which are made of solder. This arrangement is especially effective if the semiconductor chip 3 is a memory chip. Apart from this difference, all the other arrangements are practically the same as the third embodiment, and therefore corresponding members and portions are identified by the same alpha-numeral codes, and no further description will be made. Further, the semiconductor device 1 according to this fifth embodiment can be manufactured by practically the same method as described for the second embodiment.

Conventionally, in the semiconductor device mounted with a memory chip, an electric charge develops when a p-n junction plane of the memory chip is irradiated by alpha rays. This electric charge may destroy information stored in memory cells causing a "soft error". However, in the semiconductor device according to the present invention, the alpha ray shielding insulation coating 25 effectively protects the semiconductor chip 3 from the exposure to alpha rays emitted from the external terminal portions 4 which are made of solder balls, preventing the damage to the information (soft error).

Next, reference will be made to FIGS. 24 through 27 to see a semiconductor device 1 as a sixth embodiment of the present invention.

Figure 24:
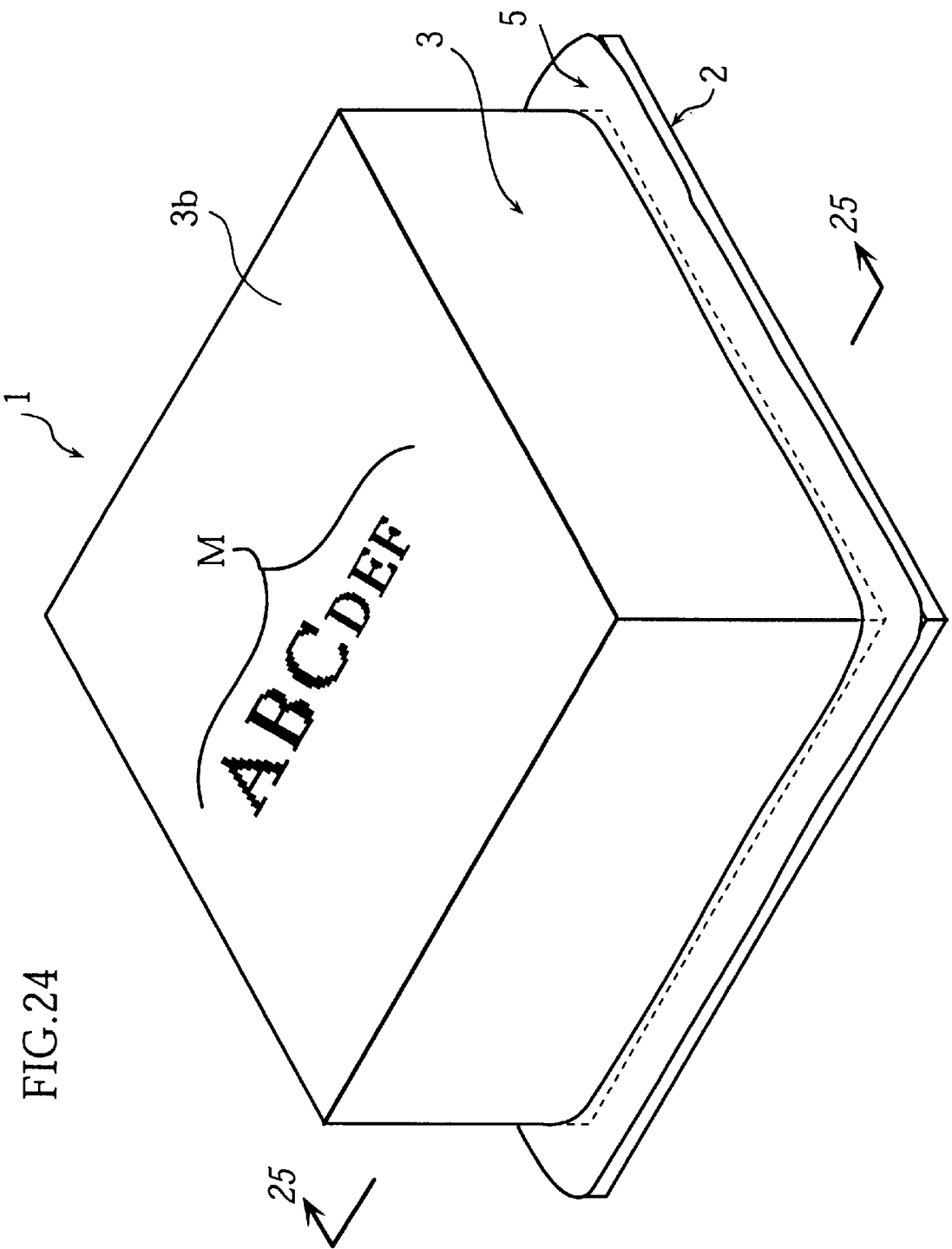
FIG. 24 is an overall perspective view showing a semiconductor device as a sixth embodiment of the present invention.
Figure 25:
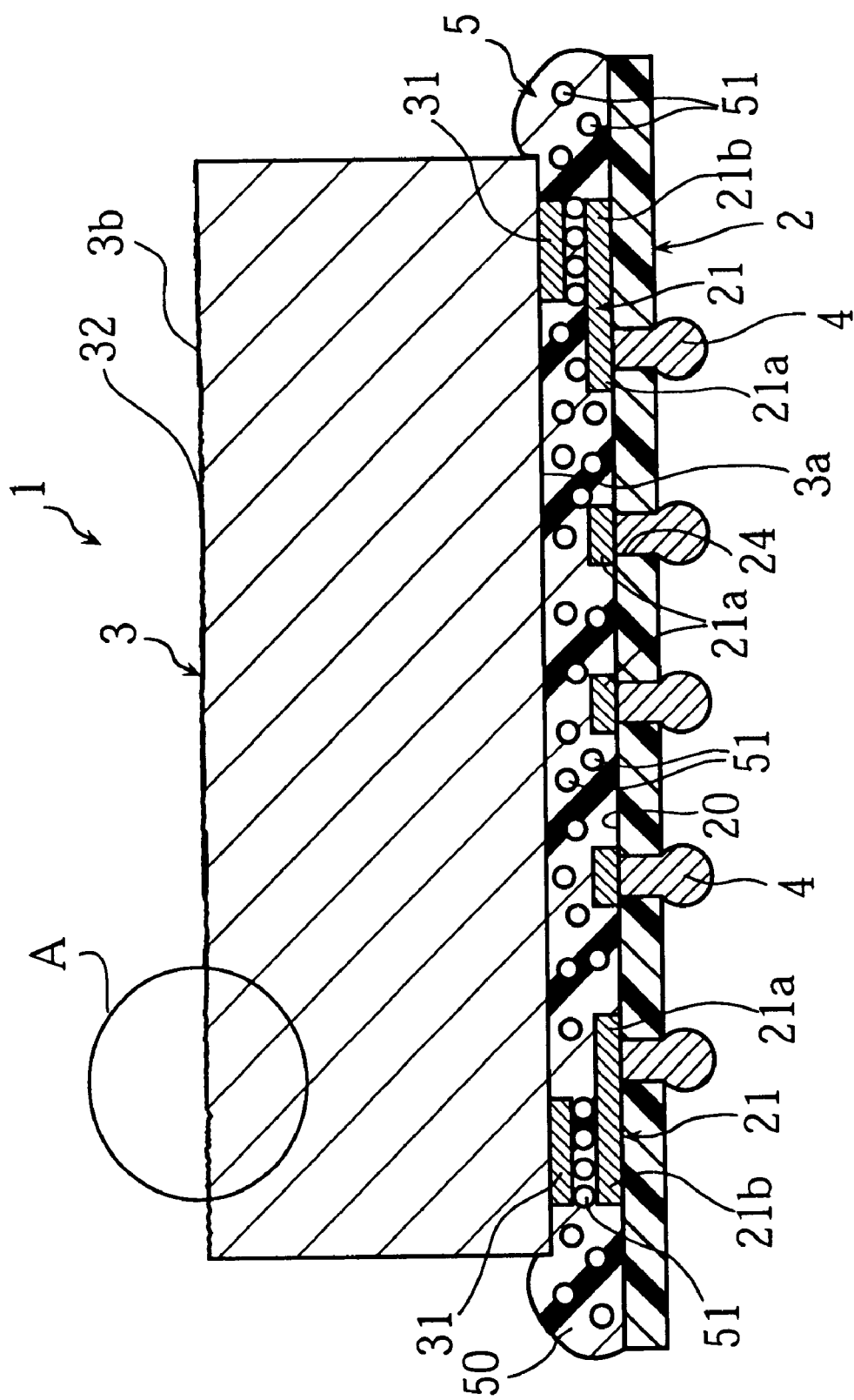
FIG. 25 is a sectional view taken in lines 25—25 in FIG. 24.
Figure 26:
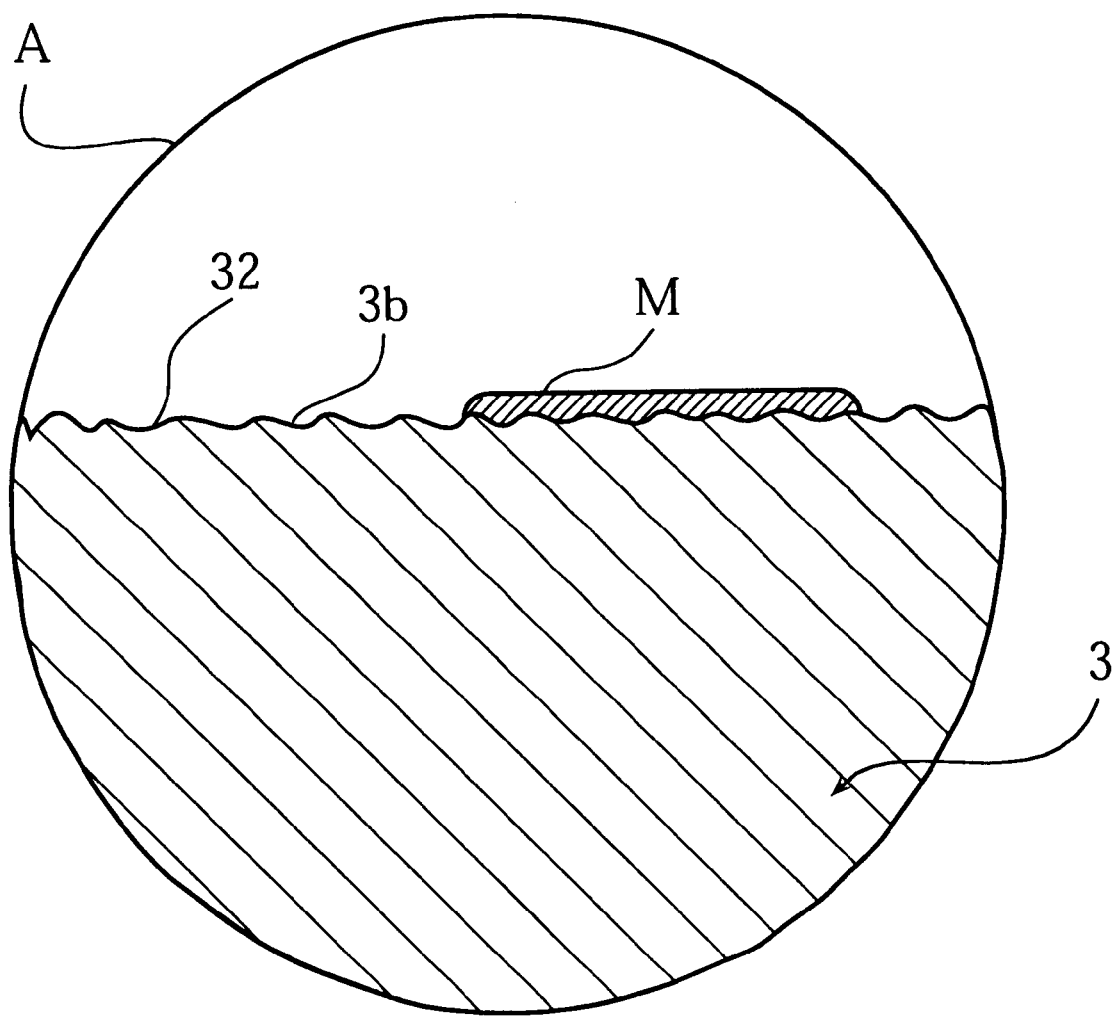
FIG. 26 is an enlarged view of the portion A in FIG. 25.

Referring first to FIGS. 24 through 26, according to this semiconductor device 1, a semiconductor chip 3 has an upper surface 3b (the side away from the main surface 3a) which is essentially exposed, and is formed with fine serration 32. Further, this upper surface 3b bears a marking M made by printing. The fine serration 32 has an average surface coarseness of 2 to 5 micron meters for example. Apart from this difference, all the other arrangements are practically the same as the second embodiment, and therefore corresponding members and portions are identified by the same alpha-numeral codes, and no further description will be made.

The fine serration 32 can be formed for example by blasting the wafer with blasting particles of a suitable size, by grinding the wafer with a grinding stone of a predetermined coarseness, or by brushing the wafer with a wire brush. Any of these operations enhances adhesion of a printing ink to the upper surface (the surface away from the main surface), making possible to perform a clear and long-lasting marking by printing.

Figure 27:
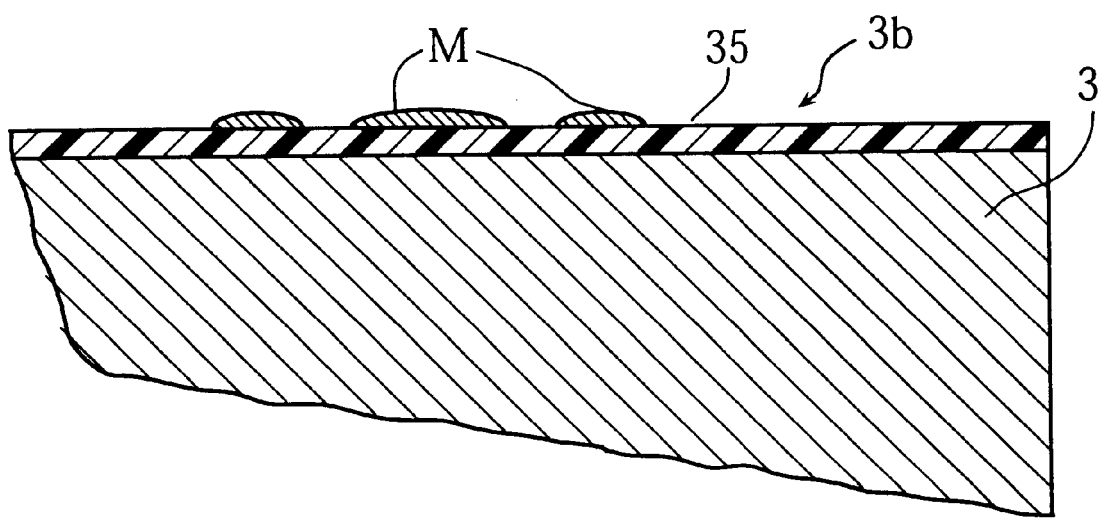
FIG. 27 is an enlarged view of a primary portion showing a variation from this embodiment.

According to a semiconductor device 1 shown in FIG. 27, an upper surface 3b (the surface away from the main surface 3a) of a semiconductor chip 3 is covered by a resin coating 35, and this resin coating 35 bears a marking M made by printing. The resin coating 35 has a thickness of only a few tens of micron meters.

Marking stably on a surface of a silicon by printing with a resin ink is usually difficult, and the marking made in such a way often can be accidentally erased very easily. However, printing with the resin ink can be made very stably on a surface of the resin coating 35. Sometime in actual manufacture, marking is made by using a laser. An advantage in such a case is that the resin coating 35 absorbs heat from the laser to some extent, and therefore the semiconductor chip 3 is not heated directly. Thus, the formation of the resin coating 35 can decrease damage to the semiconductor chip 3.

A type of the resin used for the coating 35 may be conveniently selected for example, from thermosetting resins such as epoxy resin, depending upon a type of ink to be used. If a thermosetting resin is used, a viscous thermosetting resin may be spin-coated to all surfaces of the wafer and then hardened. Then, by dieing the wafer, the semiconductor chip having the resin coating on the surface away from the main surface can be obtained. If an epoxy resin is used, operation conditions can be very similar to a marking operation to a resin package in manufacturing a conventional semiconductor device. Therefore, an existing manufacturing equipment can be used for this marking operation.

Next, reference will be made to FIGS. 28 through 35 to see a seventh embodiment of the present invention and a method of manufacturing the same.

Figure 28:
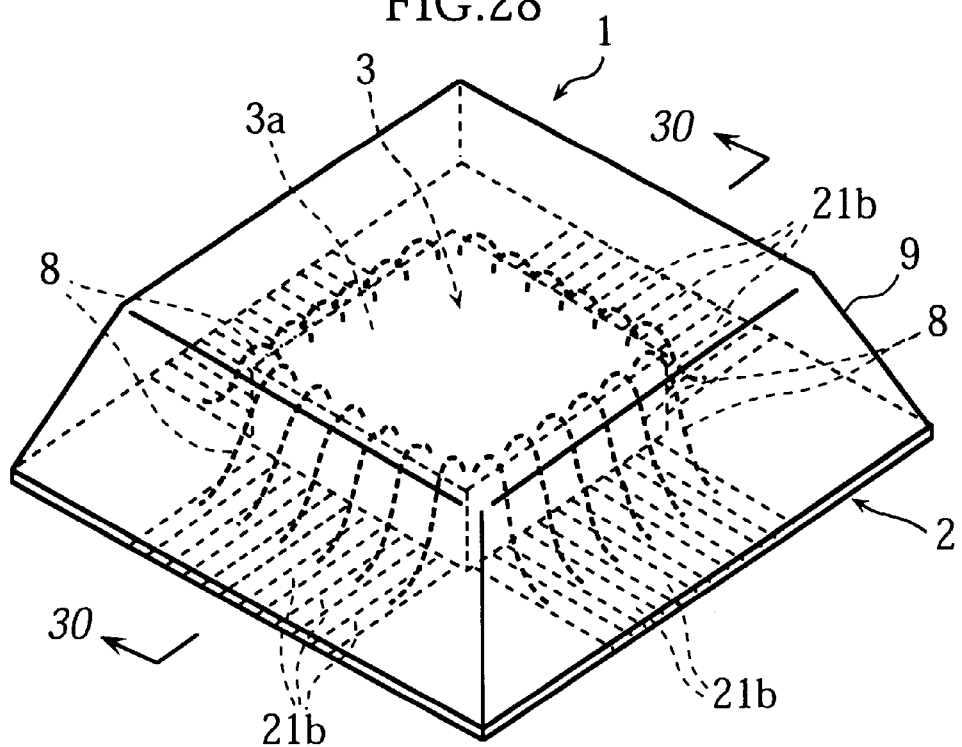
FIG. 28 is an overall perspective view of a semiconductor device as a seventh embodiment of the present invention.
Figure 29:
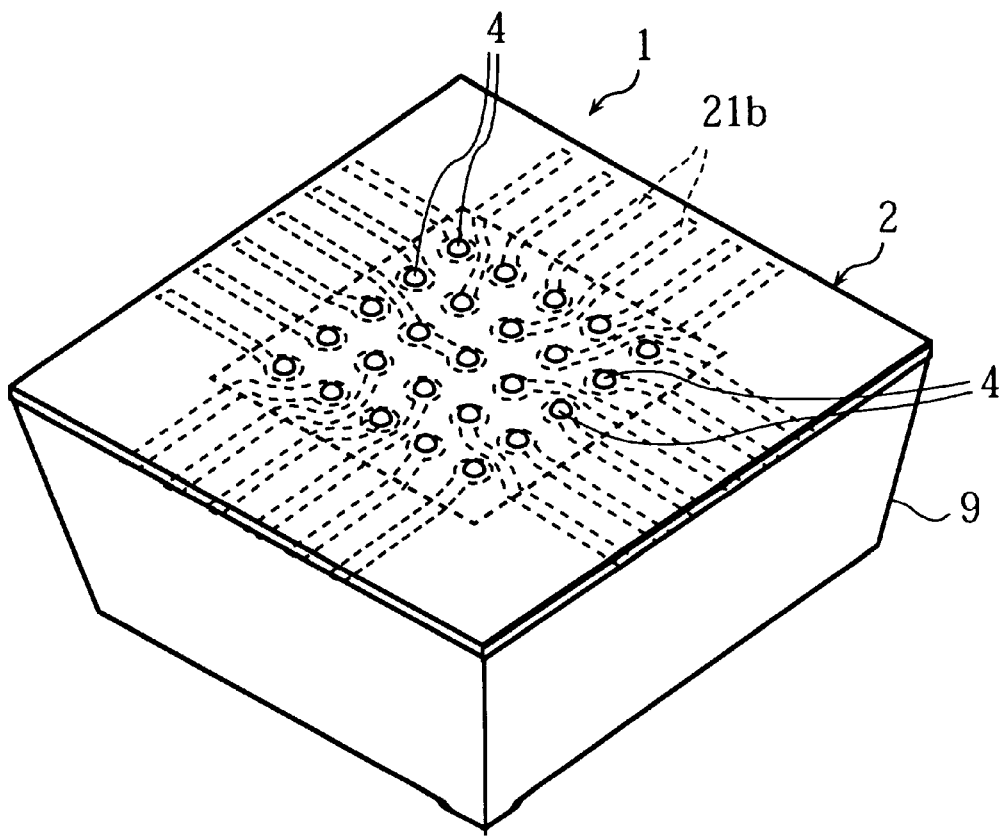
FIG. 29 is a perspective view of the above semiconductor device viewed from a lower surface side.
Figure 30:
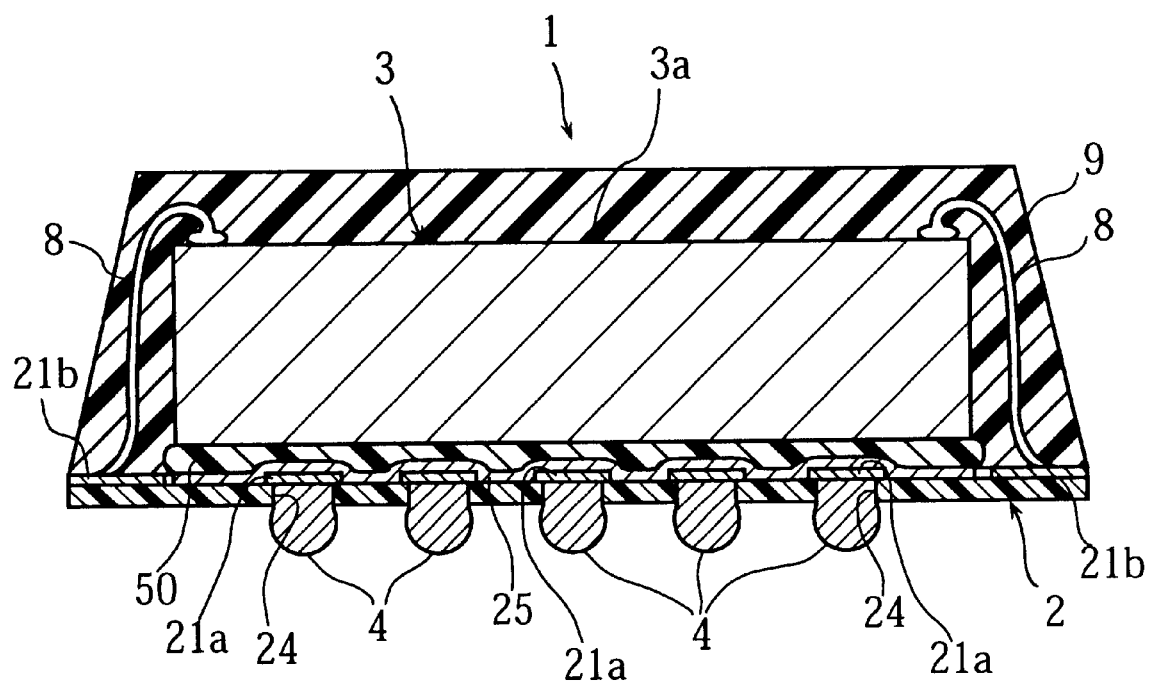
FIG. 30 is a sectional view taken in lines 30—30 in FIG. 28.

As shown in FIGS. 28 through 30, this semiconductor device 1 comprises a film substrate 2 having an upper surface formed with predetermined wiring patterns 21, and a semiconductor chip 3 wirebonded with these wiring patterns 21. The semiconductor device 1 has a lower surface formed with a plurality of external terminal portions 4 in a matrix pattern.

As clearly shown in FIGS. 28 and 29, the film substrate 2 is a rectangular piece made of an insulating resin film such as a polyimide resin film, and has a surface formed with the wiring patterns 21 each having a terminal portion 21b. The film substrate 2 is obtained by first performing a set of operations such as mounting of the semiconductor chip 3 to a long tape or strip of a master film-substrate 2A, and then by separating from the master film-substrate 2A.

As clearly shown in FIGS. 29 and 30, the film substrate 2 has a central portion formed with a plurality of holes 24 in a matrix pattern. The terminal portions 21b are disposed circumferentially of edge portions of the film substrate 2. Each of the wiring patterns 21 begins with its terminal portion 21b, and continues to one of the holes 24. Each of the holes 24 has an upper opening covered by a tip portion 21a of the wiring pattern 21. Before the external terminal portions 4 are formed, these tip portions 21a of the wiring patterns 21 are accessible from the lower surface side of the film substrate 2 through the corresponding hole 24.

As clearly shown in FIGS. 29 and 30, the central portion where the matrix of holes 24 is formed is covered by an insulating protective coating 25 except the terminal portions 21b of the wiring patterns 21. The protective coating 25 is formed by an epoxy resin for example, which increases flexural rigidity (plane rigidity).

As shown in FIG. 30, the semiconductor chip 3 has an upper surface as a main surface 3a formed with a plurality of terminal pads (not shown). The semiconductor chip 3 is mechanically connected to the film substrate 2 by bonding onto the protective coating 25 via an insulating adhesive 50 made of an epoxy resin for example, with the main surface of the semiconductor chip facing upward. The semiconductor chip 3 may be a bear chip such as an IC chip or an LSI chip. The adhesive 50 may be cold setting or thermosetting.

As clearly shown in FIGS. 28 through 30, the connection between each pair of the terminal pad 30 and the terminal portion 21b is made by a wire 8 such as a gold wire. Thus, the semiconductor chip 3 and each of the terminal portions 21b are electrically connected via these wires 8.

As shown in FIGS. 29 and 30, the film substrate 2 has a lower surface formed with a plurality of external terminal portions 4 in a matrix pattern correspondingly to the holes 24. Similarly to the previous embodiments, each of these external terminal portions 4 is made of solder into a shape of a ball. Each of the external terminal portions 4 is electrically connected with a corresponding terminal pad of the semiconductor chip 3.

The upper surface of the film substrate 2, semiconductor chip 3, and wires 8 are sealed into a resin package 9 made of an epoxy resin formed by injection molding for example.

In practical use, the semiconductor device 1 having the above arrangement is mounted to a circuit substrate for example. Since the external terminal portions 4 are made of solder balls, the semiconductor device 1 is suitable for mounting by means of re-flow soldering.

Next, a manufacturing method for the semiconductor chip 1 will be described referring to FIGS. 31 through 35.

Figure 31:
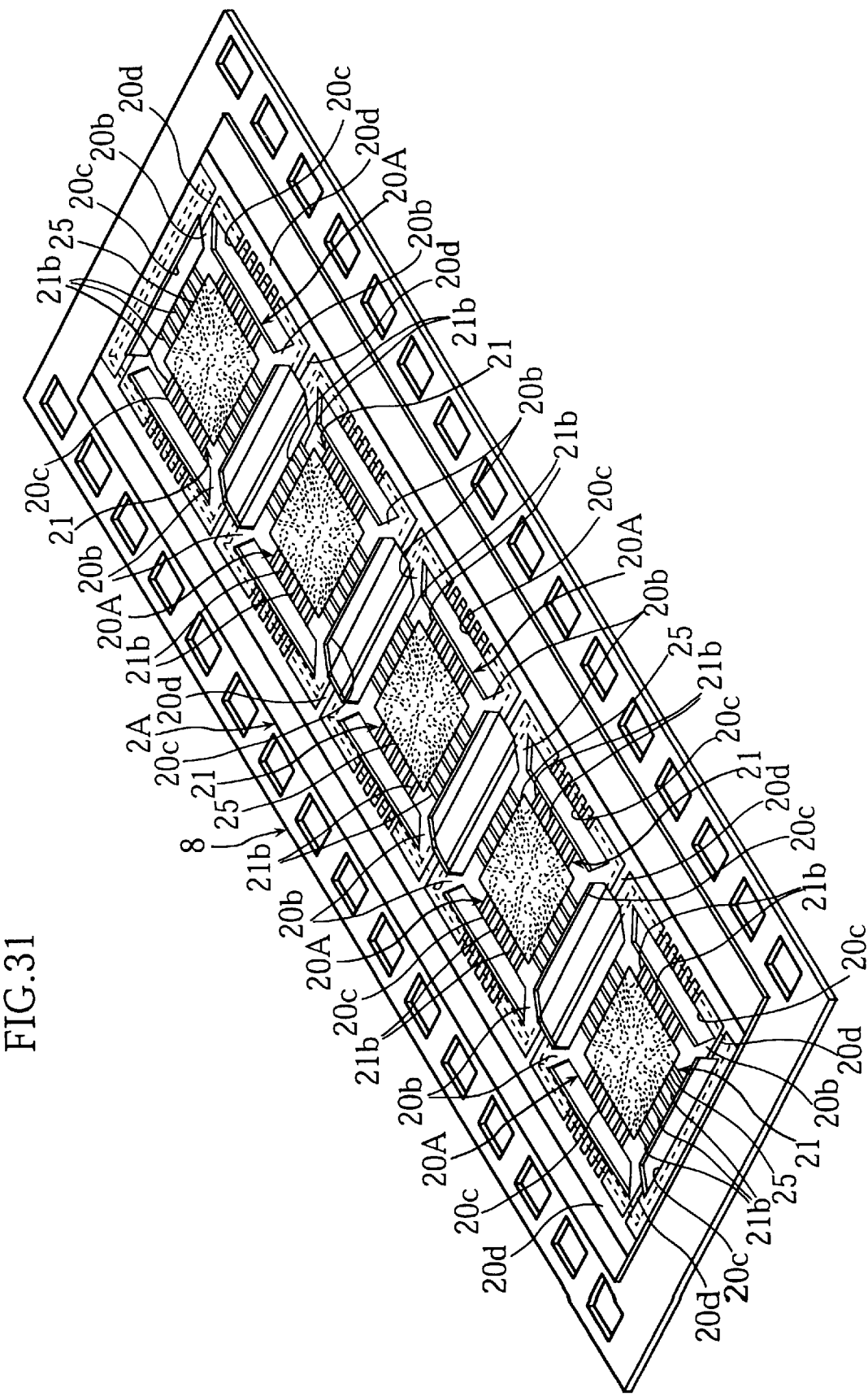
FIG. 31 is an overall perspective view of a master substrate used for manufacturing the above semiconductor device.
Figure 32:
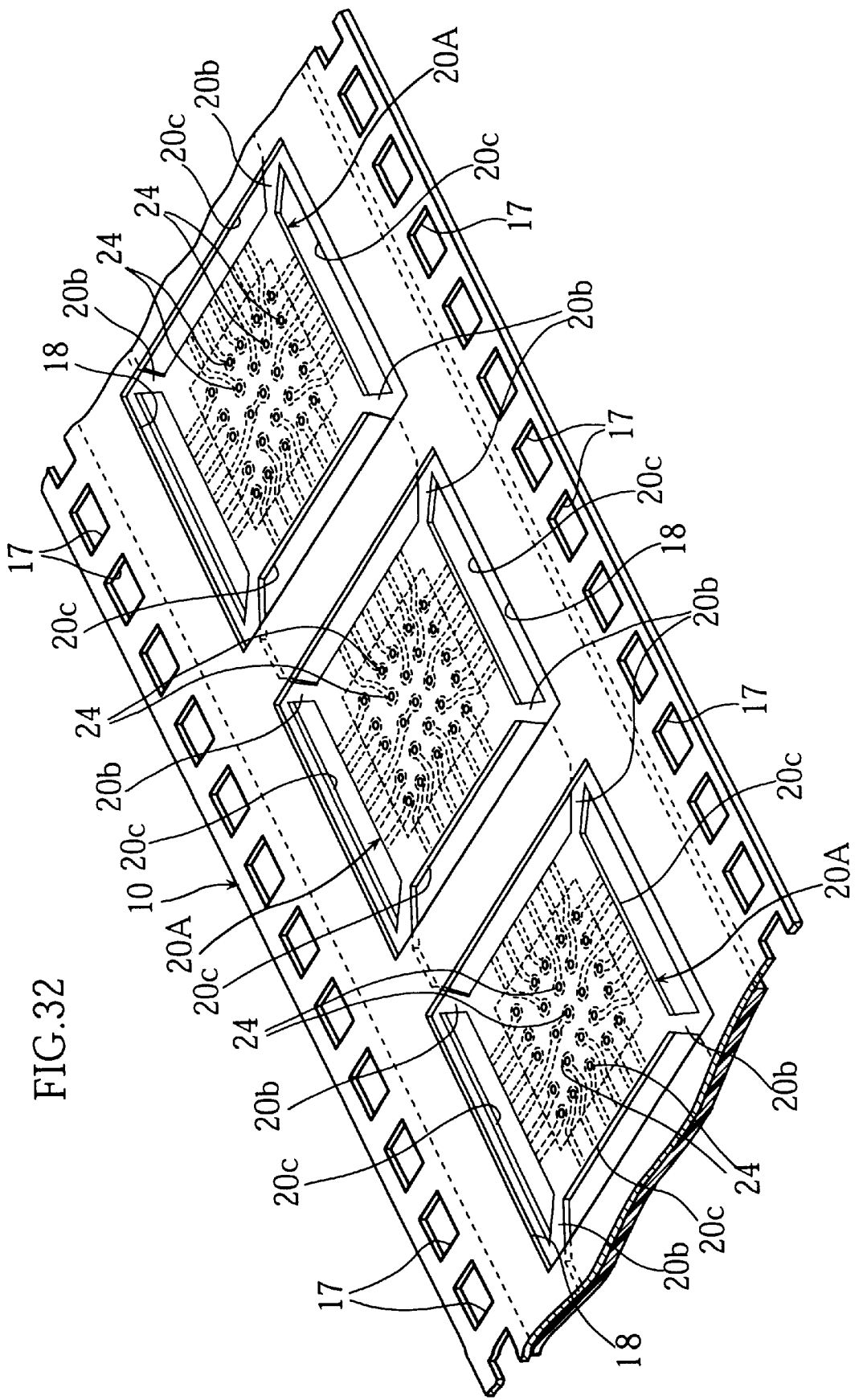
FIG. 32 is an enlarged sectional view of the above master substrate viewed from a lower surface side.

As shown in FIGS. 31 and 32, the semiconductor device 1 is made by using a master film-substrate 2A attached with a rigid plate member 10. This master film-substrate 2A is a strip of polyimide film for example, formed with a plurality of regions 20A longitudinally of the strip. The regions 20A is formed with a plurality of wiring patterns 21 each having a terminal portion 21b. The wiring patterns 21 can be formed for example by first forming a foil of copper on the surface of the master substrate 2A, and then performing photo-etching to the copper foil.

Each of the regions 20A formed with the wiring patterns is surrounded by openings 20c. Thus, the wiring pattern formation region 20A is isolated as a generally rectangular pattern supported by bridge portions 20b formed at four corner portions; i.e. the region 20A is isolated like an island. In actual manufacture however, before the openings 20c are formed, the master substrate 2A is formed with the wiring patterns 21 and power paths 20d for supplying electricity to each of the wiring patterns 21. Specifically, the master substrate 2A I submerged in electrolyte, and passed by electricity for forming the wiring pattern by gold for example. Then, openings 20c can be formed by punching with a predetermined die. In the punching operation, each of the power paths 20d which is continuous with the wiring pattern 21 is also punched out by the die, so that after the formation of the openings 20c, each of the wiring pattern formation regions 20A is electrically disconnected from the power path 20d.

Thus, the wiring pattern formation region 20A supported like an island is formed with the matrix of the plurality of holes 24, and each of the wiring patterns 21 has the tip portion 21a which reaches one of the holes 24, covering the upper opening of the hole 24. Each of these tip portions 21a of the wiring patterns 21 is accessible from the lower surface side of the film substrate 2 through the corresponding hole 24. Further, the central portion 20A, where the matrix of holes 24 is formed, is covered by the insulating protective coating 25 covering part of the wiring patterns 21. The protective coating 25 is of course an insulating coating.

On the other hand, as clearly shown in FIG. 31, the rigid plate member 10 is made of copper for example, has a thickness of about 0.25 mm, and is slightly larger than the master substrate 2A as viewed from above. Further, as clearly shown in FIG. 32, the rigid plate member 10 is formed with a plurality of windows 18 corresponding to the wiring pattern formation regions 20A. As shown in FIG. 32, the master substrate 2A is bonded by an epoxy resin adhesive for example to the lower surface of the rigid plate member 10. After the master substrate 2A is bonded, the lower surface of the wiring pattern formation region 20A, which is the region where the matrix of holes 24 formed, is still accessible from the windows 18. Further, the rigid plate member 10 has longitudinal edge portions each formed with engaging holes 17. These engaging holes 17 are engaged by rotating teeth for example, so that the rigid plate member 10 is transferred continuously or intermittently together with the master substrate 2A.

Since the master substrate 2A is bonded to the rigid plate member 10, the master substrate 2A has a considerably improved rigidity than when used as a single piece. Further, the wiring pattern formation region 20A is still exposed. The wiring pattern formation region 20A is a region where the semiconductor chip 3 is mounted, wires 8 are bonded, and the resin package 9 is formed. Since the rigid plate member 10 can make the master substrate 2A as rigid as a lead frame, the master substrate 2A can be used for manufacturing a semiconductor device 1 by using an existing production line originally designed for manufacture of a lead-frame type semiconductor device.

Figure 33:
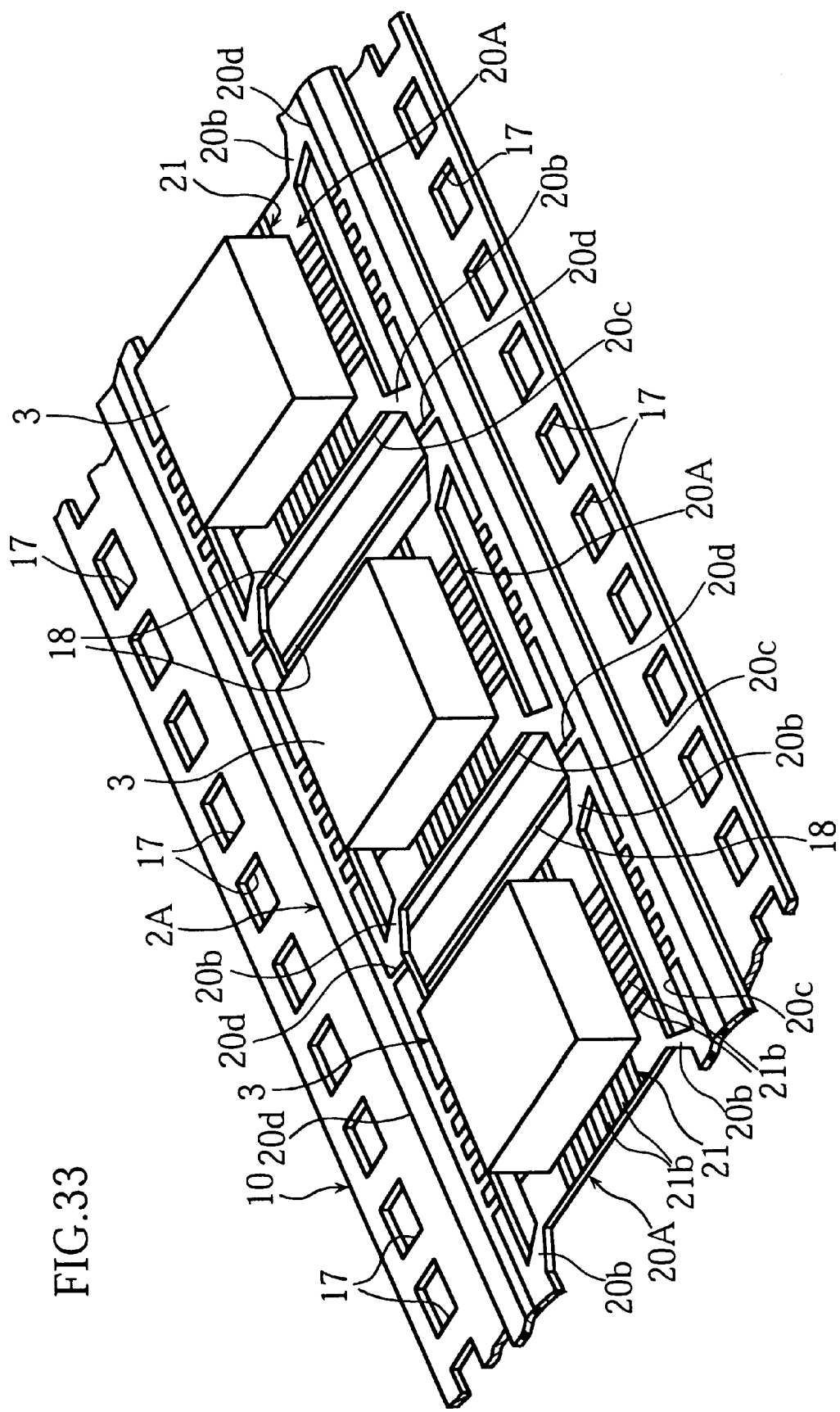
FIG. 33 is an enlarged perspective view of a primary portion showing a state in which the master substrate is mounted with semiconductor chips.

Next, a step of mounting the semiconductor chip 3 begins first with applying a thermosetting adhesive such as an epoxy resin in a liquid or paste form, and then lowering the semiconductor chip 3 using a conventional chip mounting machine on the layer of the adhesive. Then, the adhesive is hardened by a heater for example, so that the semiconductor chip 3 is fixed to the master substrate 2A as shown in FIG. 33.

Here is a potential problem, however. Specifically, during the heating, the master substrate 2A tends to expand, whereas the wiring patterns 21 formed in the master substrate 2A also tend to expand. The master substrate 2A is made of an insulating resin having a certain coefficient of thermal expansion, whereas the wiring patterns 21 are made of a conductive metal having a different coefficient of thermal expansion. Thus, there can be a problem that the master substrate 2A may be bent during the heating. The problem becomes serious if the bent developed in the wiring pattern formation region 20A adversely affects bonding accuracy in the wirebonding step or forming accuracy in the formation step of the external terminal portions.

However, the master substrate 2A is preferably made of a polyimide resin film, whereas the wiring patterns 21 are preferably made of copper. Although the thermal expansion coefficient of the polyimide resin differs form that of copper, the difference is minor. Thus, there is not a big difference between the amount of expansion in the master substrate 2A and the amount of expansion in the wiring pattern 21. As a result, the problem of bent master substrate 2A can be avoided to some extent. Further, since the master substrate 2A is bonded to the rigid plate member 10, the master substrate 2A is mechanically confined to the rigid plate member 10, being prevented from bending by heating. In summary, the rigid plate member 10 is preferably made of copper, and therefore the rigid plate member 10 expand more or less equally with the master substrate 2A when heated, preventing the master substrate from bending. Further, the wiring pattern formation region 20A is formed as an island supported by four corners, and the master substrate 2A is bonded to the rigid plate member 10. As a result, movement of the wiring pattern formation region 20A in each direction, i.e. bending of the wiring pattern formation region 20A, is limited. Therefore, the wiring pattern formation region 20A will not bend when the master substrate 2A is heated, unless the bridge portion 20b is cut.

Figure 34:
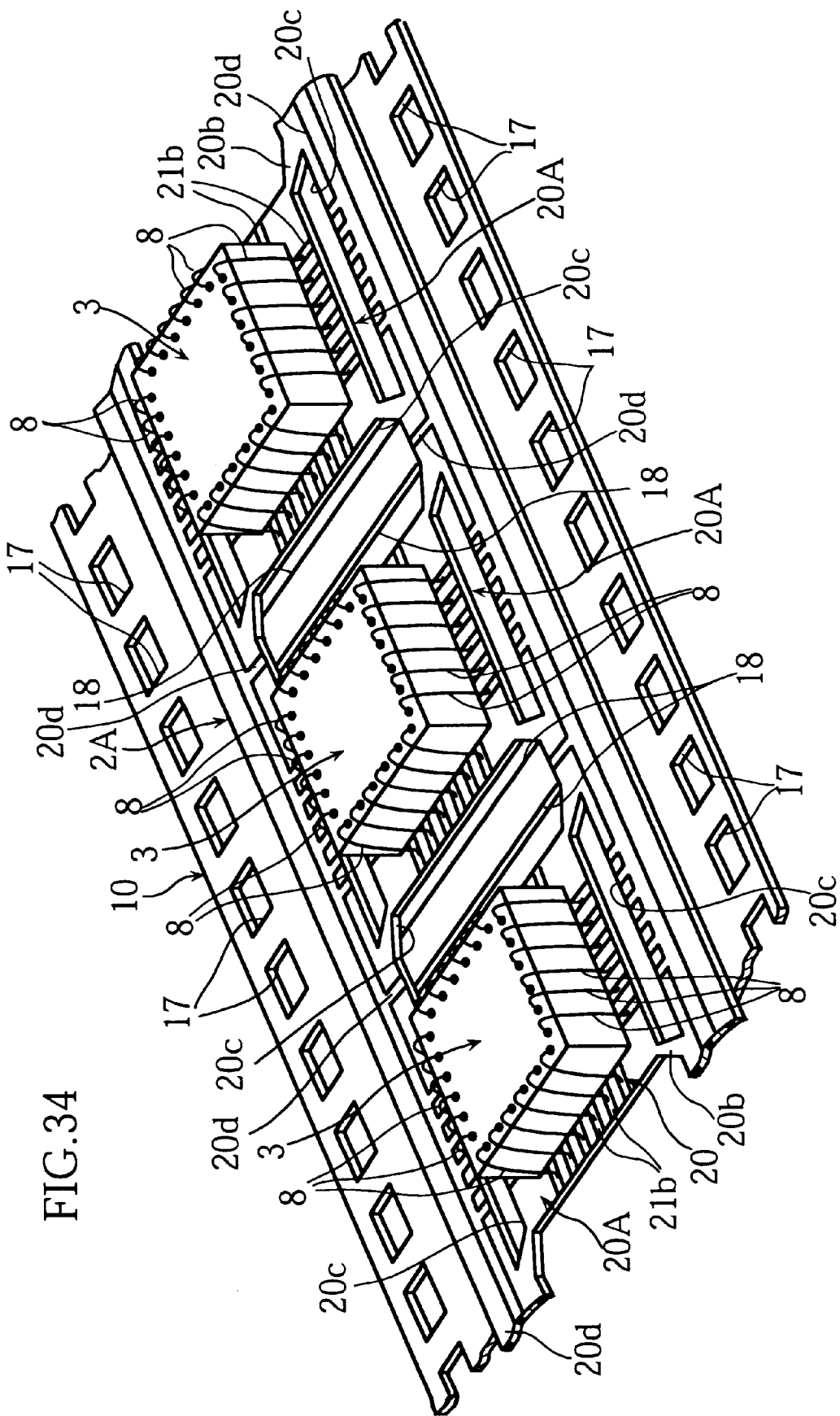
FIG. 34 is a perspective view of a primary portion showing a state in which the semiconductor chips are wired to respective wiring patterns on the master substrate.

After the step of mounting the semiconductor chip 3 described above is complete, each of the terminal portions 21b is connected with a corresponding terminal pad (not illustrated) formed in the semiconductor chip 3 via a wire 8 as shown in FIG. 34. This step can be performed automatically by using a conventional wire bonding machine. In this step again, the semiconductor chip 3 and the master substrate 2A are heated if thermocompression bonding is used for the wirebonding. However, the wiring pattern formation region 20A will not bend for the same reason discussed for the step of mounting the semiconductor chip 3. Thus, the wirebonding can be performed very accurately, without such a problem that a bent develops in the wiring pattern formation region 20A moving a wirebonding portion (terminal portion 21b) of the wiring pattern formation region 20A out of a predetermined location.

Figure 35:
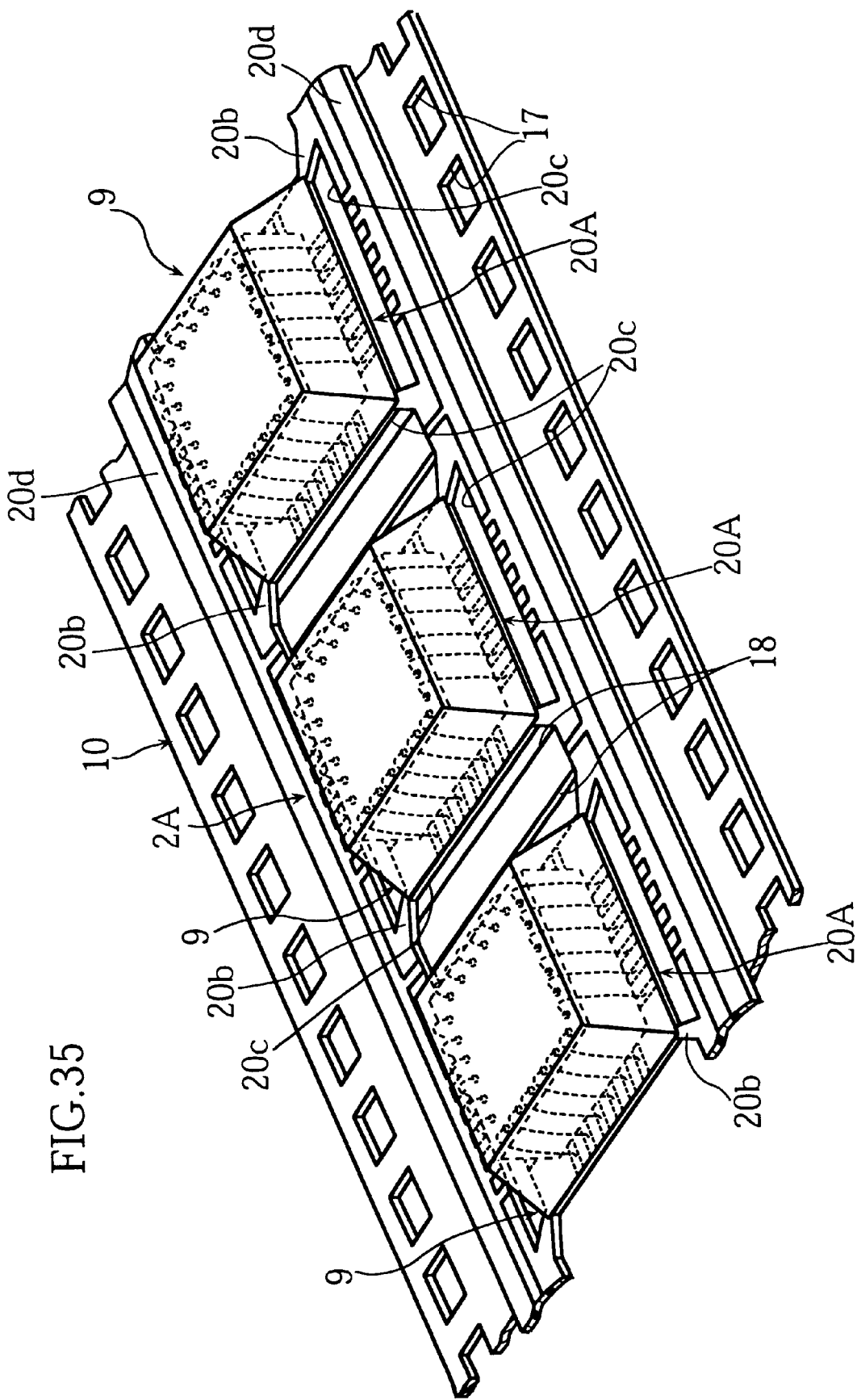
FIG. 35 is a perspective view of a primary portion showing a state in which the master substrate is formed with resin packages.

Next, a resin package 9 is formed to seal the semiconductor chip 3 together with the bonding wires 8 as shown in FIG. 35. This step can be conveniently performed by a transfer molding method for example. Specifically, a pair of upper and lower dice which provides a cavity space when assembled is used. The master substrate 2A is sandwiched between the two dice so that the semiconductor chip 3 and bonding wires 8 are included in the cavity space. The dice are closed tightly, then a molten epoxy resin for example is injected into the cavity space, and the resin is allowed to cool. In this way, the resin package 9 can be formed to cover only the upper surface side of the wiring pattern formation region 20A. Again, in this resin packaging step, the master substrate 2A is heated when the molten resin is injected, but the master substrate 2A will not be bent, either.

Next, the master substrate 2A is inverted for forming the matrix of external terminal portions 4 in the lower surface of the wiring pattern formation region 20A at each of the holes 24. The formation of the external terminal portions 4 can be achieved practically by the same method as described for the previous embodiment. Although the lower surface of the master substrate 2A is attached by the rigid plate member 10, each of the holes 24 is accessible from the windows 18 as mentioned before, and thus the external terminal portions 4 can be formed while the rigid plate member 10 stays there. As has been mentioned from time to time, the master substrate 2A is heated at each step of mounting the semiconductor chip 3, wirebonding, and resin packaging. However, since the master substrate 2A (the wiring pattern formation region 20A) will not be bent by heat, there is no bent in the wiring pattern formation region 20A at the time of forming the external terminal portions 4. This means that none of the holes 24 are adversely affected by bending either, being located accurately at a predetermined position. Thus, each of the external terminal portions 4 can be formed highly accurately as desired.

After completing each of the steps described above, finally a portion to be the semiconductor device 1 (wiring pattern formation region 20A) is separated as the individual semiconductor device 1 as shown in FIGS. 28 through 30. Since the above master substrate 2A is formed with the windows 2c around each of the wiring pattern formation region 20A, only a few cuts are necessary in this step. Specifically, according to the master substrate 2A, since the wiring pattern formation region 2A is supported like an island by the bridge portions 20b, only these bridge portions 20b should be cut off. Further, when the openings 20c were formed, the power path 20d which directly connects with the wiring pattern formation region 20A was punched out. Therefore, there is no portion plated with metal such as copper or gold in and around the bridge portions 20b. Thus, when the semiconductor device 1 is separated by cutting the bridge portions 20b, there is no need for using a metal die for example, but a simpler and more convenient cutting method such as a laser system may be used.

It should be noted that the above described manufacturing method may be applied to the manufacture of not only the semiconductor device shown in FIGS. 28 through 30, but also other semiconductor devices, such as those described earlier with reference to FIGS. 1 through 27, or still other semiconductor devices in general in which the semiconductor chip 3 is mounted to the upper surface of the film substrate 2.

Further, in the embodiment shown in the figures, the rigid plate member 10 is bonded to the lower surface of the master film-substrate 2A. However, the rigid plate member 10 may alternatively be bonded to the upper surface of the master film-substrate 2A.

Next, reference will be made to FIGS. 36 through 46 to see an eighth embodiment of the present invention and a method of making the same.

A semiconductor device 1 according to this embodiment is similar to the semiconductor device 1 according to the seventh embodiment shown in FIGS. 28 through 30, differing only in that a resin package 9 includes integrally therewith a frame-like reinforcing member 95. This reinforcing member 95 should preferably be made of a resin material essentially the same as the resin material which forms the resin package 9. Otherwise, all the other arrangements are practically the same as the seventh embodiment, and therefore corresponding members and portions are identified by the same alpha-numeral codes, and no further description will be made. With the above arrangement, the semiconductor chip 3 is more securely protected in the resin package 9.

Next, the method for manufacturing the above semiconductor device 1 will be described with reference to FIGS. 39 through 46. The semiconductor device 1 is made by using a master film-substrate 2A reinforced by the rigid plat member 10. The master film-substrate 2A is essentially the same as already described for the seventh embodiment.

Figure 40:
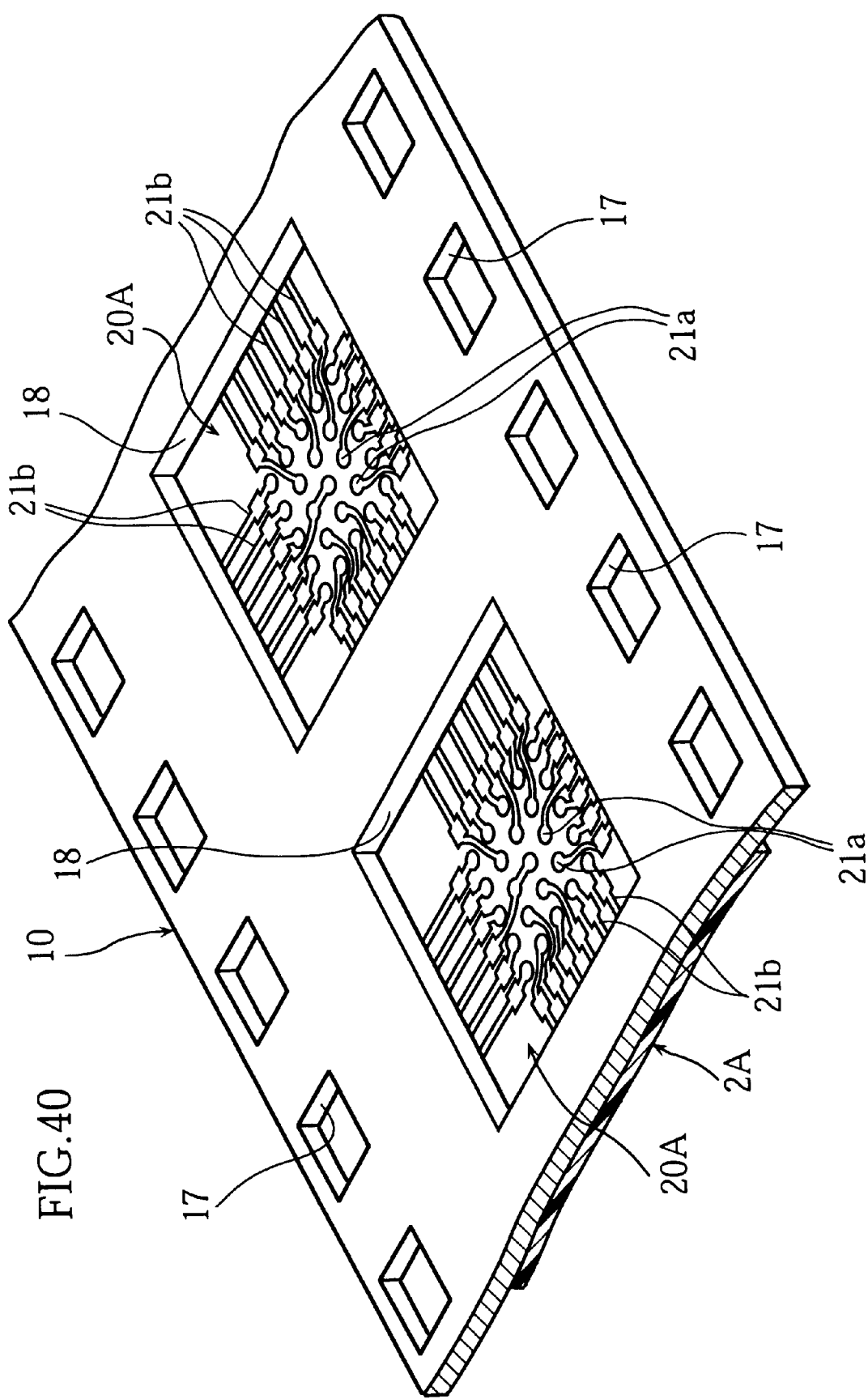
FIG. 40 is an enlarged view of a primary portion showing a state in which the rigid plate member and the master film-substrate are bonded to each other.

In the present embodiment, the rigid plate member 10 formed with the windows 18 is bonded to the upper surface of the master film-substrate 2A, making accessible to the upper surface of the wiring pattern formation region 20A. As shown in FIG. 40, after bonding the rigid plate member 10 to the master film-substrate 2A, the wiring pattern formation region 20A on the master film-substrate 2A is accessible from each of the windows 18. The rigid plate member 10 has two longitudinal edges each formed with a plurality of engaging holes 17 at an interval.

After the master film-substrate 2A has been bonded to the supporting member 10, the wiring pattern formation region 20A is still exposed, and therefore the wiring pattern formation region 20A can be mounted with the semiconductor chip 3, bonded by wires 8, and sealed into the resin package 9. Further, since the master film-substrate 2A is bonded to the supporting member 10, the master substrate 2A has a considerably improved rigidity than as a single piece. Since the supporting member 10 can make the master substrate 2A as rigid as a lead frame, the master substrate 2A can be used for manufacturing a semiconductor device 1 by using an existing production line originally designed for manufacture of a lead-frame type semiconductor device.

Figure 41:
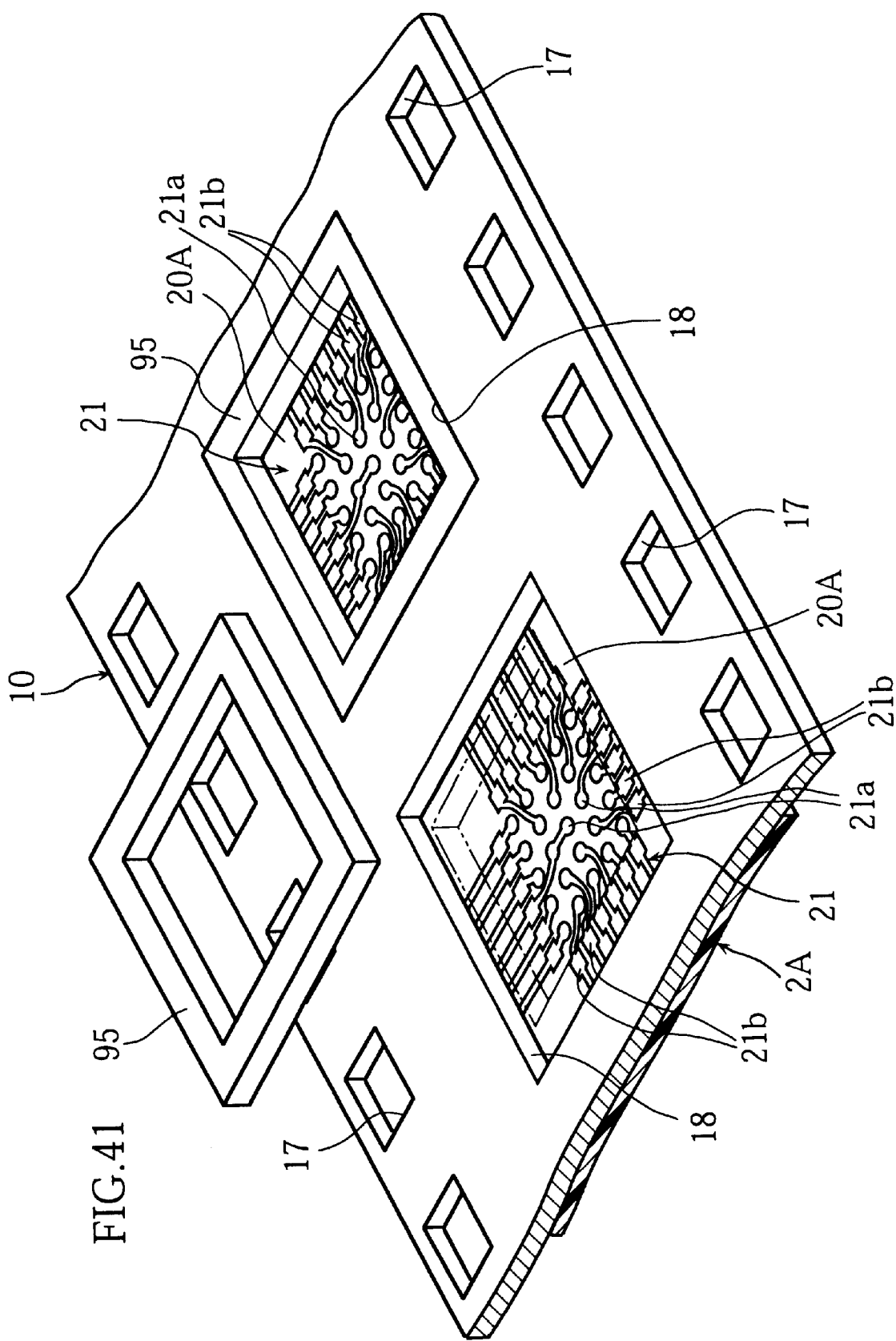
FIG. 41 is a view illustrating a step of attaching a frame-like reinforcing member.

According to the present embodiment, the master film-substrate 2A is first mounted with the frame-like reinforcing member 95 on the wiring pattern formation region 20A. As shown in FIG. 41, this frame-like reinforcing member 95 is fitted into the window 18 formed in the rigid plate member 10, and is bonded to the master film-substrate 2A by adhesive for example. It should be noted here that the frame-like reinforcing member 95 is made of an insulating material for covering part of the wiring pattern formation region 20A. Further, the frame-like reinforcing member 95 should preferably be made of essentially the same resin material as the resin material for forming the resin package 9 in order to achieve a better bonding to the resin package 9 to be described later.

Figure 42:
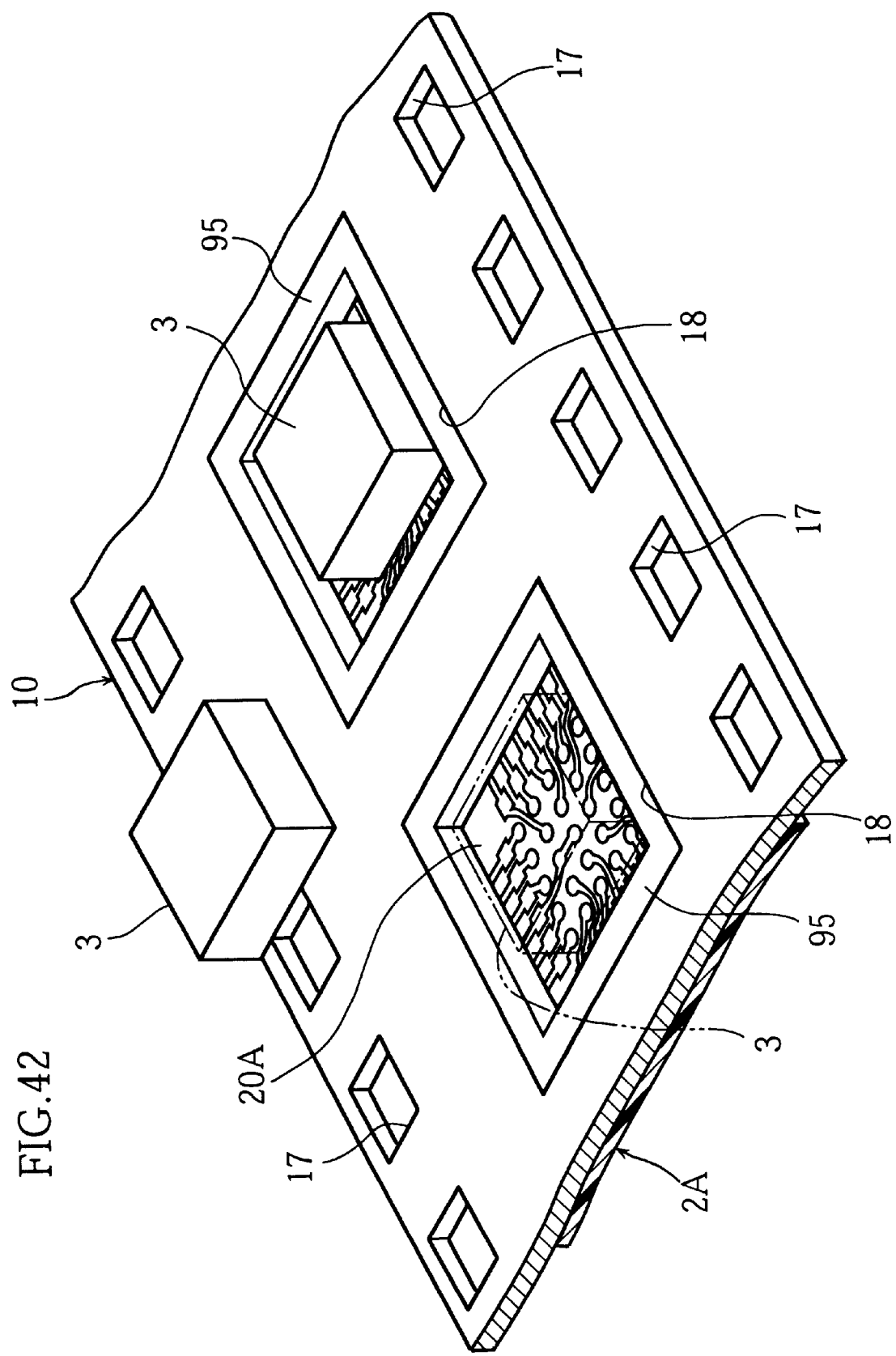
FIG. 42 is a view illustrating a step of bonding a semiconductor chip.

Next, the semiconductor device 3 is mounted to the wiring pattern formation region 20A. First, a thermosetting adhesive such as an epoxy resin in a liquid or paste form is applied, and then the semiconductor chip 3 is lowered using a conventional chip mounting machine on the layer of the adhesive. Then, the adhesive is hardened by a heater for example, so that the semiconductor chip 3 is fixed to the master substrate 2A as shown in FIG. 42.

A potential problem here, however, is that during the heating, the master film-substrate 2A tends to expand, whereas the wiring patterns 21 formed in the master substrate 2A also tend to expand. The master substrate 2A is made of an insulating resin having a certain coefficient of thermal expansion, whereas the wiring patterns 21 are made of a conductive metal having a different coefficient of thermal expansion. Thus, there can be a problem that the master substrate 2A may be bent during the heating. The problem becomes serious if the bent developed in the wiring pattern formation region 20A adversely affects bonding accuracy in the wirebonding step or forming accuracy in the formation step of the external terminal portions.

However, the master film-substrate 2A is formed with the frame-like reinforcing member 95 around the wiring pattern formation region 20A, This provides the master film-substrate 2A with even more improved plane rigidity than achieved in the seventh embodiment. Thus, the wiring pattern formation region 20A of the present master film-substrate 2A is even more resistant to the potential bending by an external force.

Figure 43:
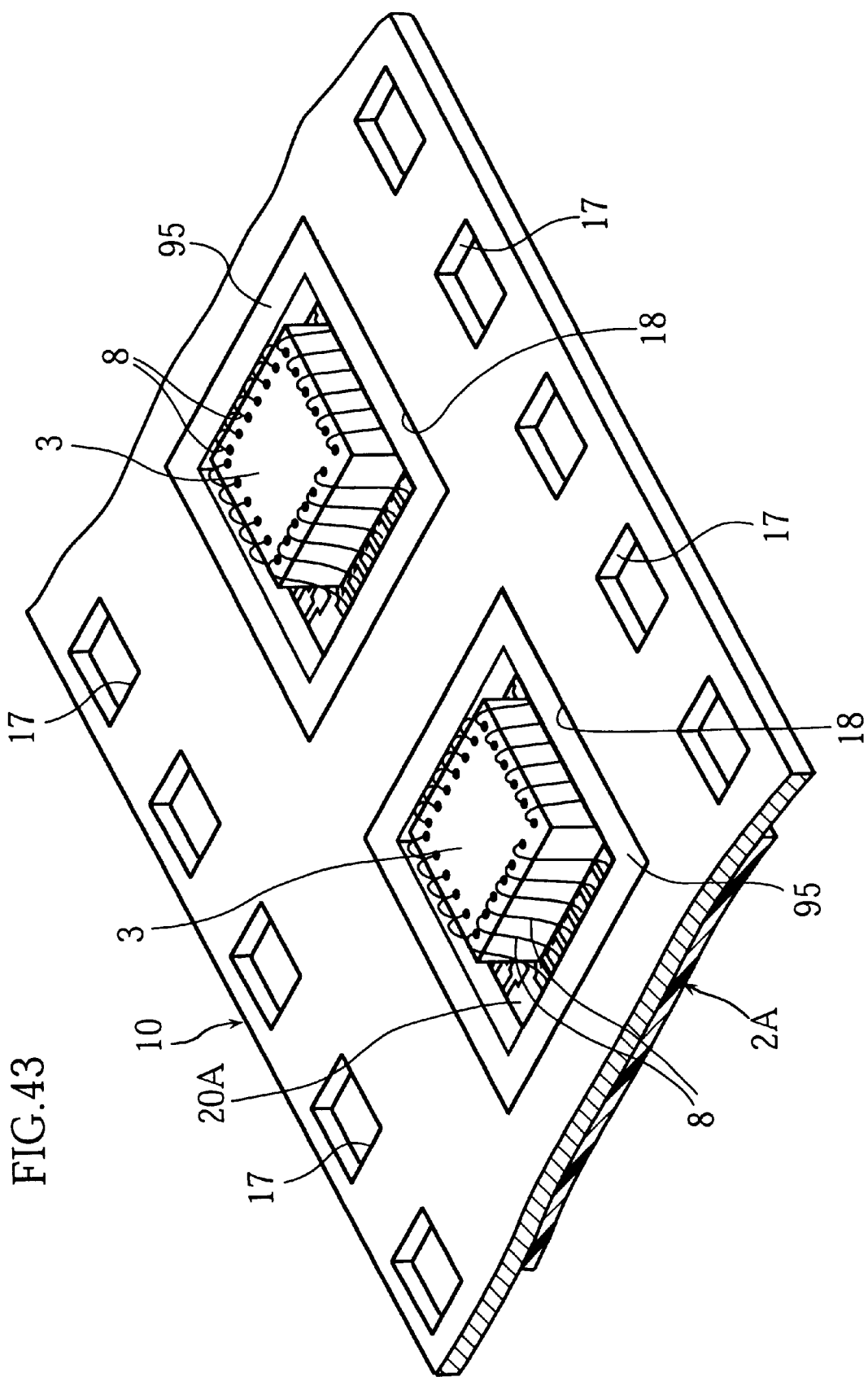
FIG. 43 is a view illustrating a step of wirebonding.

After the step of mounting the semiconductor chip 3 is complete as described above, each of the terminal portions 21b is connected with a corresponding electrode pad (no illustrated) formed in the semiconductor chip 3 via a wire 8 as shown in FIG. 43.

Figure 44:
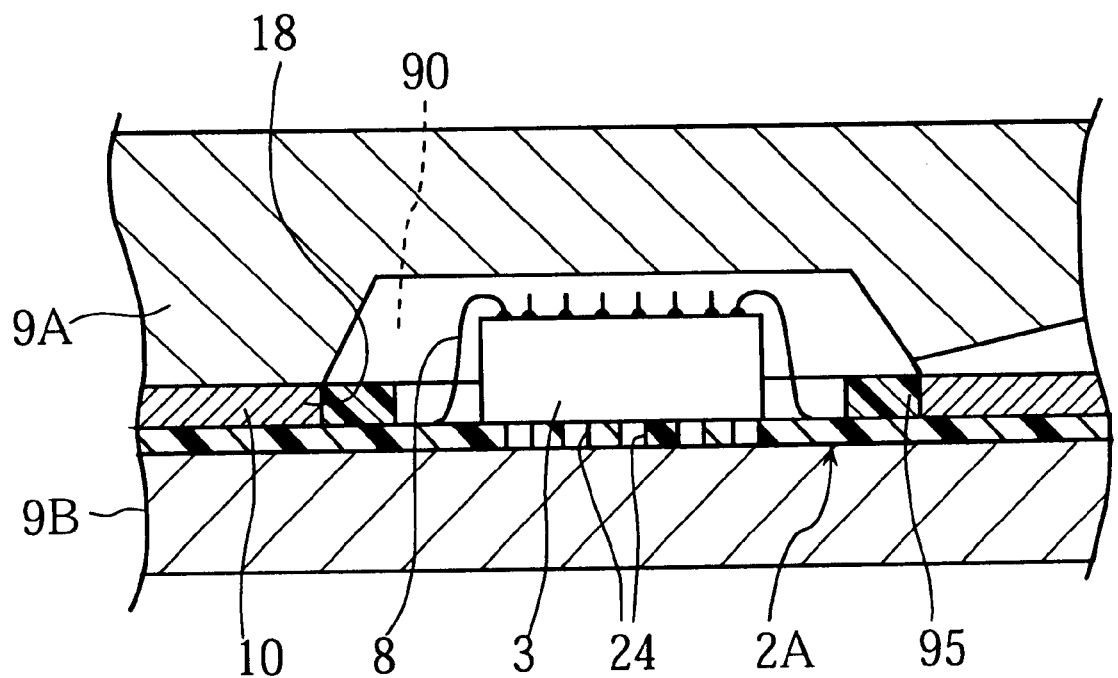
FIG. 44 is a view illustrating a step of resin packaging.
Figure 45:
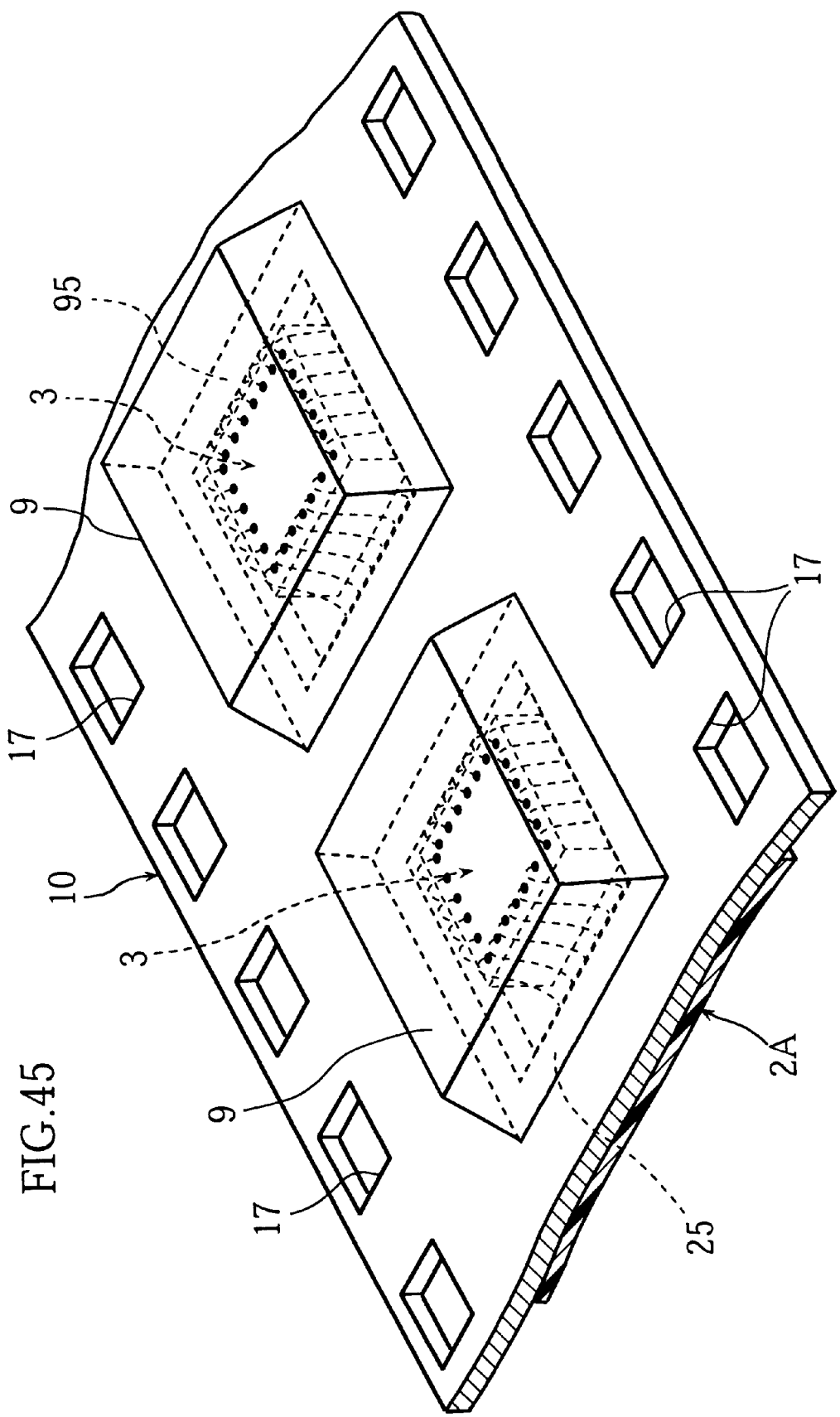
FIG. 45 is a view illustrating the step of resin packaging.
Figure 46:
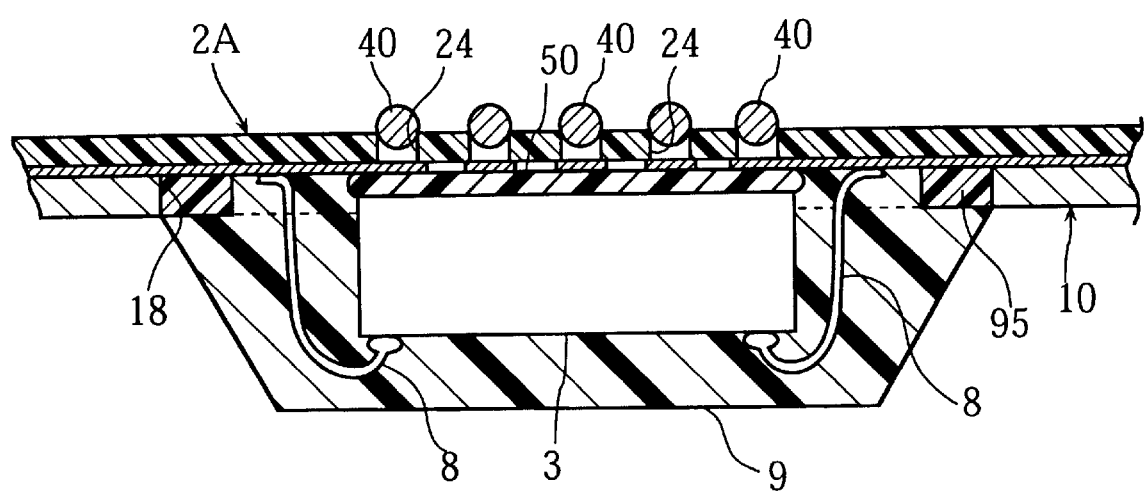
FIG. 46 is a view illustrating a step of forming external terminal portions.

Next, the resin package 9 is formed to seal the semiconductor chip 3 together with the reinforcing member 95 and the bonding wires 8. Specifically, as shown in FIG. 44, the master substrate 2A is sandwiched between a pair of upper and lower dice 9A, 9B so that the semiconductor chip 3 and bonding wires 8 are included in a cavity space 90. The dice are closed tightly, then a molten epoxy resin for example is injected into the cavity space 90, and the resin is allowed to cool to provide the resin package 9 which covers only the upper surface side of the wiring pattern formation region 20A as shown in FIG. 45.

Next, the master substrate 2A is inverted for forming the matrix of external terminal portions 4 in the lower surface of the wiring pattern formation region 20A at each of the holes 24. The formation of the external terminal portions 4 can be achieved practically by the same method as described for the previous embodiments.

As has been mentioned earlier, the master film-substrate 2A is heated at each step of mounting the semiconductor chip, wirebonding, and resin packaging. However, since the operations are performed with the frame-like reinforcing member 95 attached, the master film-substrate 2A will not be bent by heat, and therefore the wiring pattern formation region 20A is not adversely affected before the step of forming the external terminal portions 4.

Figure 36:
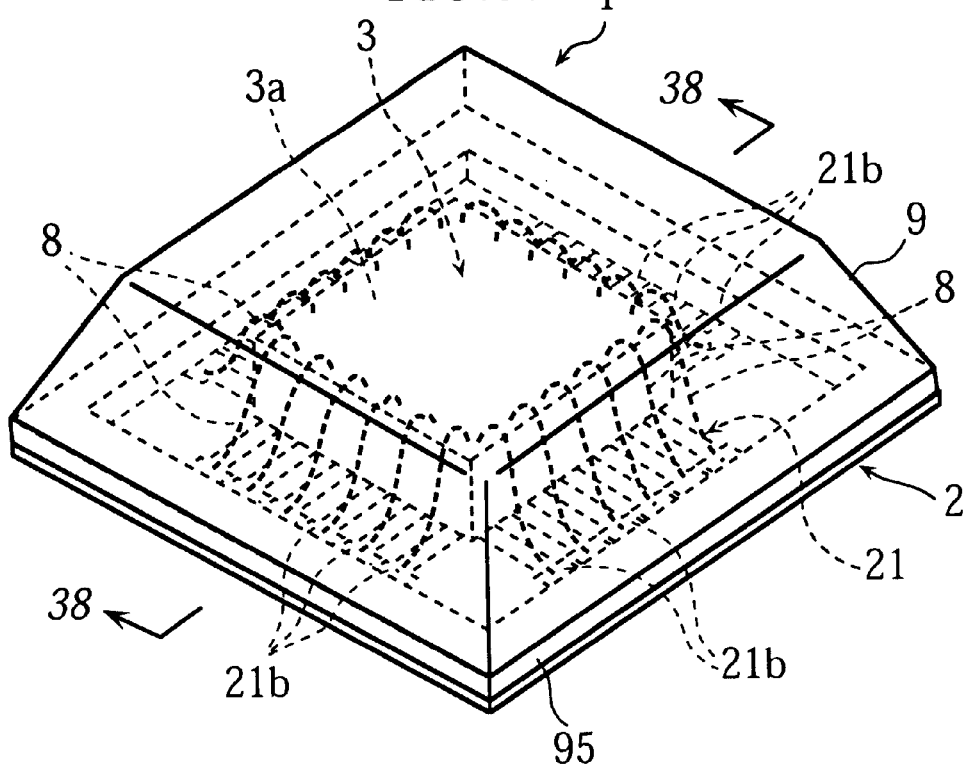
FIG. 36 is an overall perspective view of a semiconductor device as an eighth embodiment of the present invention.
Figure 37:
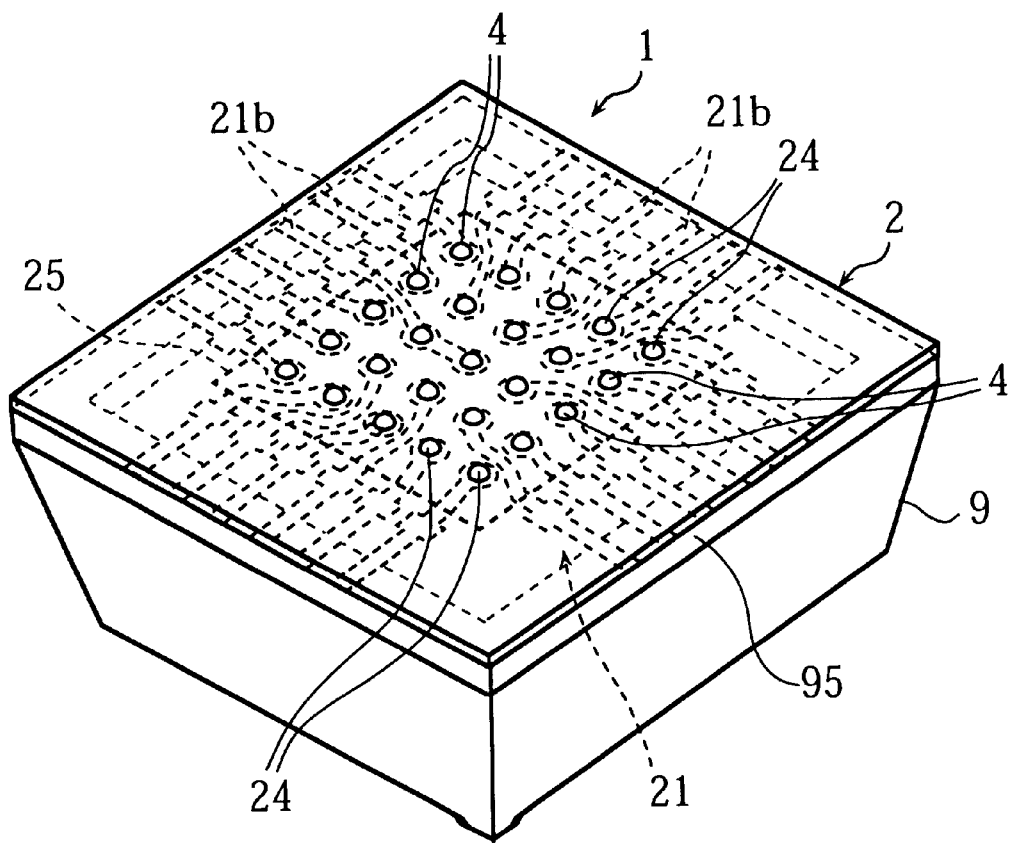
FIG. 37 is an overall perspective view of the above semiconductor device viewed from a lower surface side.
Figure 38:
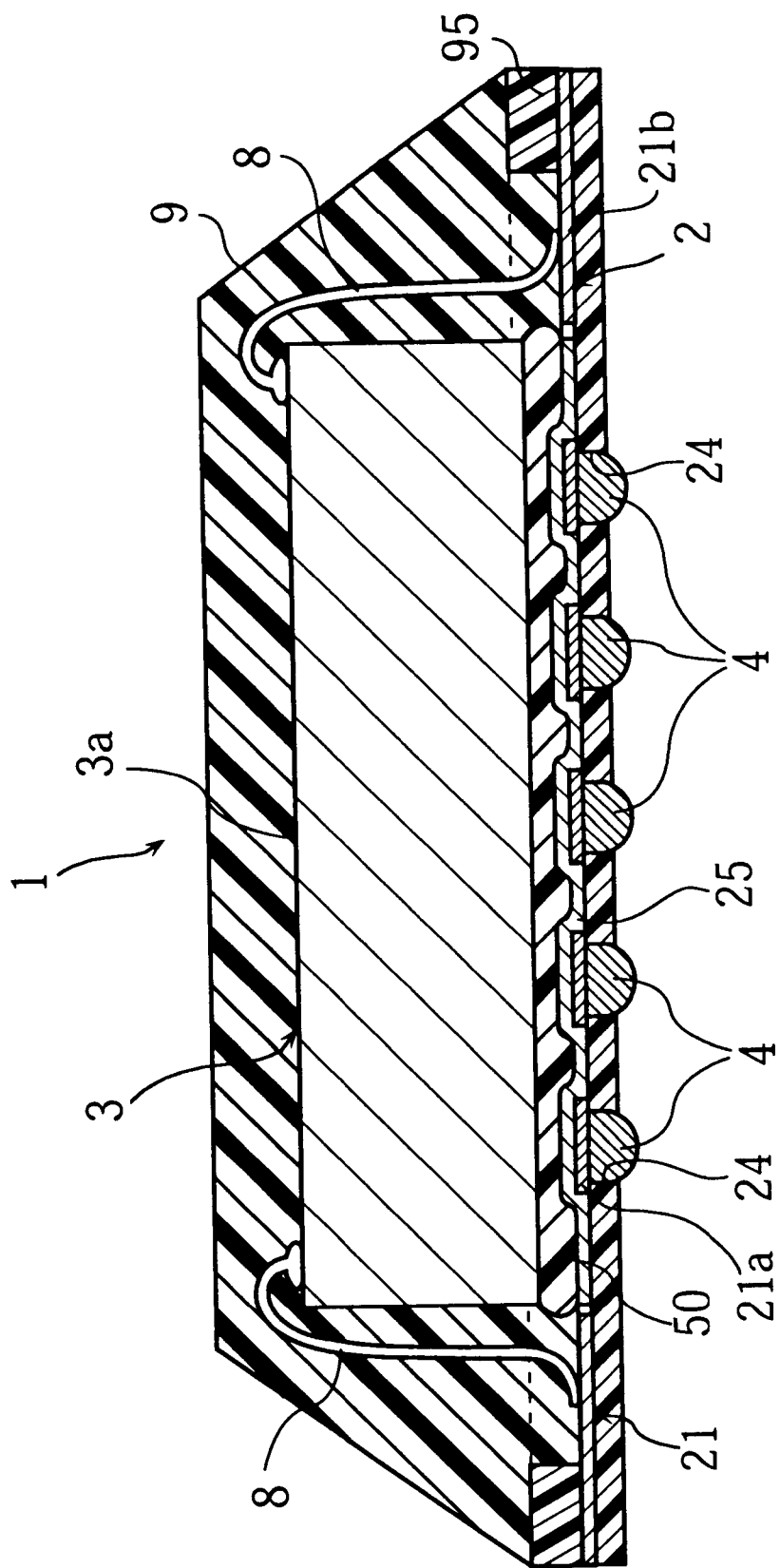
FIG. 38 is a sectional view taken in lines 38—38 in FIG. 36.
Figure 39:
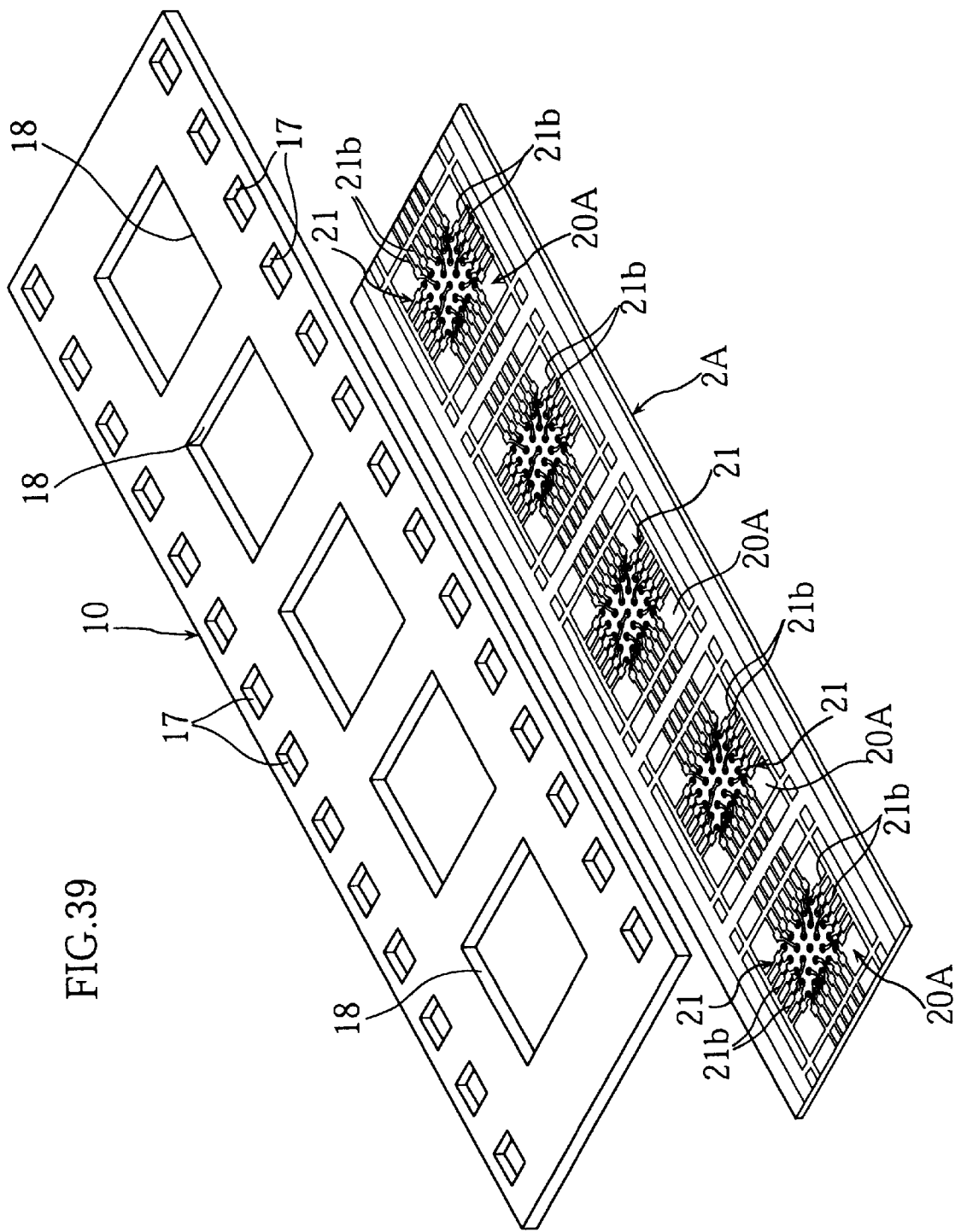
FIG. 39 is a perspective view illustrating a step of manufacturing the above semiconductor device, showing a rigid plate member and a master film-substrate.

After completing each of the steps described above, finally a portion to be the semiconductor device 1 (wiring pattern formation region 20A) is separated as the individual semiconductor device 1 as shown in FIGS. 36 through 38.

What is claimed is:

1. A semiconductor device comprising:

A film substrate having an upper surface and a lower surface, the upper surface being provided with a plurality of wiring patterns, the lower surface being provided with a plurality of external terminal portions which are arranged in a matrix pattern and connected with the wiring patterns;

a semiconductor chip having a main surface provided with a plurality of bump terminal pads, and an upper surface opposite to the main surface, the semiconductor chip being mounted on the film substrate with the bump terminal pads held in facing relation to the wiring patterns;

a connection layer made of an anisotropic conductive adhesive arranged between the semiconductor chip and the film substrate for mechanically connecting the chip to the substrate and for electrically connecting the bump terminal pads to the wiring pattern; and an insulating film formed on the upper surface of the film substrate for covering at least part of the wiring patterns in a manner avoiding the bump terminal pads.

2. The semiconductor device according to claim 1, wherein each of the external terminal portions includes a solder ball placed in a hole formed in the film substrate, part of the solder ball projecting out of the hole beyond the lower surface of the film substrate, the hold being closed at an end thereof by a part of a corresponding one of the wiring patterns, the solder ball being bonded to said part of the corresponding one of the wiring patterns.

3. The semiconductor device according to claim 1, wherein the anisotropic conductive adhesive includes a porous resin.

4. The semiconductor device according to claim 3, wherein the porous resin is a thermosetting phenol resin.

5. The semiconductor device according to claim 1, wherein a circumferential portion of the anisotropic conductive adhesive and side surfaces of the semiconductor chip are surrounded by a protective resin.

6. The semiconductor device according to claim 5, wherein the protective resin includes a porous resin.

7. The semiconductor device according to claim 5, wherein the protective resin rides on upper surface of the semiconductor chip.

8. The semiconductor device according to claim 1, wherein each of the wiring patterns is provided with a first end portion and a second end portion, the first end portion being electrically connected to a corresponding one of the external terminal portions, the second end portion being electrically connected to a corresponding one of the bump terminal pads which is displaced from said corresponding one of the external terminal portions in a plan view.

9. The semiconductor device according to claim 8, wherein each of the terminal pads of the semiconductor chip is disposed in a circumferential edge portion of the main surface of the semiconductor chip, the external terminal portions being located inwardly of each of the terminal pads in a plan view.

10. The semiconductor device according to claim 1, wherein the insulating film is an alpha ray shielding insulation coating.

11. The semiconductor device according to claim 10, wherein the alpha ray shielding insulation coating is formed at least in a region right above each of the external terminal portions.

12. The semiconductor device according to claim 10, wherein the alpha ray shielding insulation coating is made of a polyimide resin.

13. The semiconductor device according to claim 10, wherein the semiconductor chip is a memory chip including a memory cell domain.

14. The semiconductor device according to claim 1, wherein the upper surface of the semiconductor chip is essentially exposed, at least part of a circumferential region of the upper surface being chamfered.

15. The semiconductor device according to claim 1, wherein the upper surface of the semiconductor ship is essentially exposed, the upper surface being formed with fine serration and marked by printing.

16. The semiconductor device according to claim 1, wherein the upper surface of the semiconductor chip is covered by a resin coating marked by printing.

* * * * *